US012777663B2

(12) United States Patent
Tanaka et al.

(10) Patent No.: US 12,777,663 B2
(45) Date of Patent: Oct. 27, 2026

(54) SEMICONDUCTOR DEVICE AND SEMICONDUCTOR MODULE

(71) Applicant: ROHM CO., LTD., Kyoto (JP)

(72) Inventors: Bungo Tanaka, Kyoto (JP); Kazumasa Nishio, Kyoto (JP); Kosei Osada, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 390 days.

(21) Appl. No.: 18/522,590

(22) Filed: Nov. 29, 2023

(65) Prior Publication Data

US 2024/0186366 A1 Jun. 6, 2024

(30) Foreign Application Priority Data

Dec. 1, 2022 (JP) ................................ 2022-192908

(51) Int. Cl.

*H10D 1/47* (2025.01)
*H10D 1/20* (2025.01)
*H10W 20/40* (2026.01)
*H10W 20/47* (2026.01)
*H10W 70/40* (2026.01)
*H10W 74/10* (2026.01)
*H10W 90/00* (2026.01)

(52) U.S. Cl.

CPC ................ *H10D 1/47* (2025.01); *H10D 1/20* (2025.01); *H10W 70/465* (2026.01); *H10W 74/111* (2026.01); *H10W 90/811* (2026.01)

(58) Field of Classification Search

CPC ......... H10D 1/47; H10D 1/20; H10W 20/498; H10W 20/497; H10W 20/47; H10W 74/121; H10B 43/27; H10B 41/27

See application file for complete search history.

(56) References Cited

U.S. PATENT DOCUMENTS

2020/0083239 A1* 3/2020 Komiya ................. H10B 41/27
2023/0197686 A1* 6/2023 Kobayashi ............ H10W 90/00 257/777

FOREIGN PATENT DOCUMENTS

JP 2017-212299 A 11/2017

* cited by examiner

*Primary Examiner* — Antonio B Crite
(74) *Attorney, Agent, or Firm* — Rabin & Berdo, P.C.

(57) ABSTRACT

The present disclosure provides a semiconductor device. The semiconductor device includes a semiconductor substrate and a substrate-side insulating layer disposed on the semiconductor substrate. The substrate-side insulating layer includes: a first oxide film; a second oxide film, disposed on the first oxide film and separated from the first oxide film; and a first nitride insulating layer and a second nitride insulating layer disposed between the first oxide film and the second oxide film. The second nitride insulating layer has a film density higher than a film density of the first nitride insulating layer.

12 Claims, 30 Drawing Sheets

SEMICONDUCTOR DEVICE AND SEMICONDUCTOR MODULE

TECHNICAL FIELD

The present disclosure relates to a semiconductor device and a semiconductor module.

BACKGROUND

As an example of a semiconductor device, a configuration including a semiconductor substrate, an insulating layer formed on the semiconductor substrate, and a semiconductor resistive layer formed on the insulating layer is available in the prior art (for example, referring to patent publication 1).

PRIOR ART DOCUMENT

Patent Publication

[Patent document 1] Japan Patent Publication No. 2017-212299

DETAILED DESCRIPTION OF THE EMBODIMENTS

Details of several embodiments with respect to a semiconductor device and a semiconductor module are given with the accompanying drawings below. To keep the description clear and simple, the constituting elements shown in the accompanying drawings are not necessarily drawn to certain scales. Moreover, for better understanding, shading lines may be omitted from the section views. It should be noted that the drawings are for illustrating the embodiments of the present disclosure, and are not to be construed as limitations to the present disclosure.

The description below includes details for specifically implementing a device, a system and a method of the exemplary embodiments of the present disclosure. The detailed description is intended for illustration purposes and is not to be construed as limitations to the embodiments of the present disclosure or applications or uses of these embodiments.

First Embodiment

Referring to FIG. 1 to FIG. 18, a semiconductor module 10 according to the first embodiment is described below.

Figure 1:
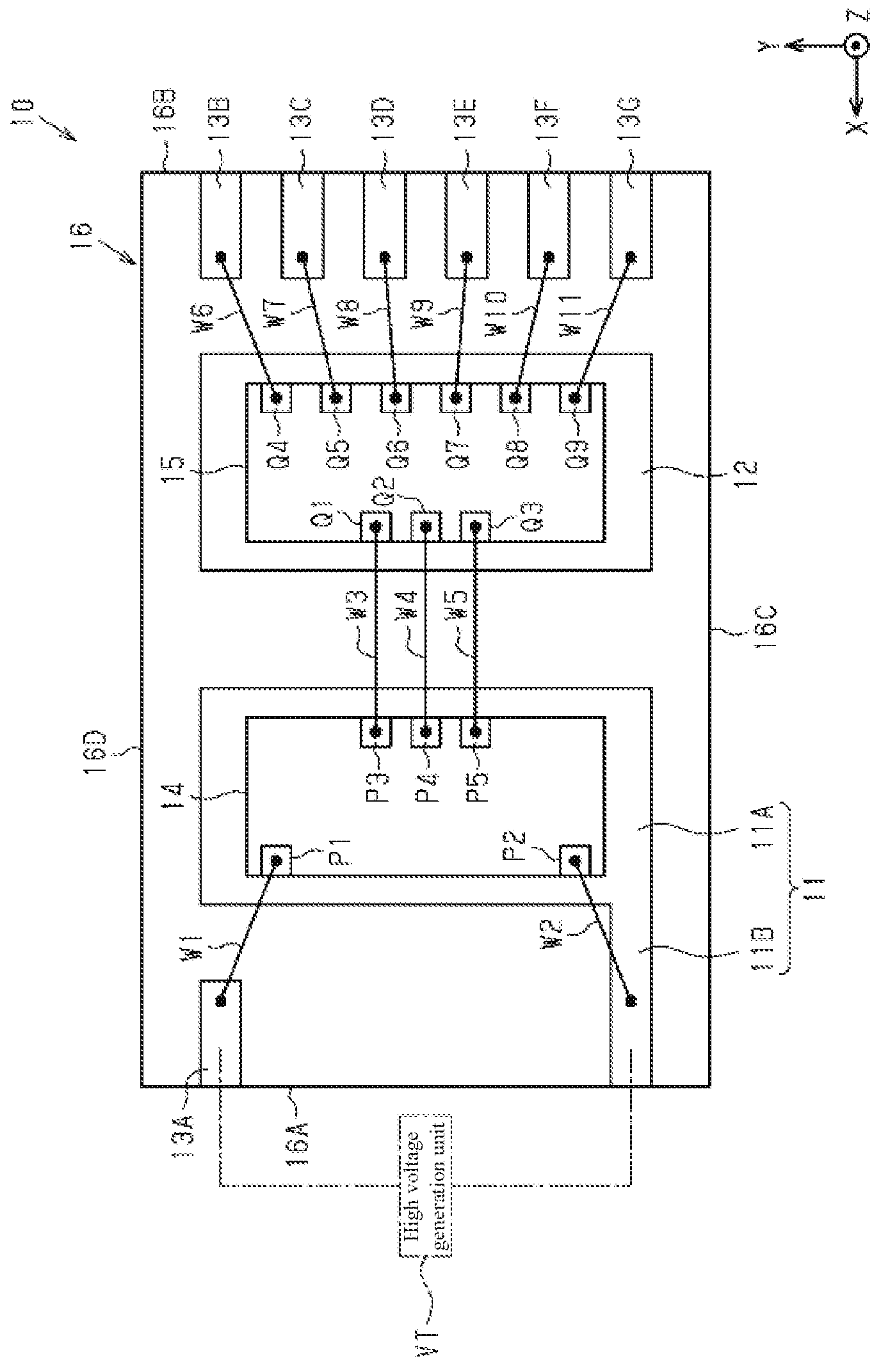
FIG. 1 is a brief plan view of a semiconductor module according to a first embodiment.
Figure 2:
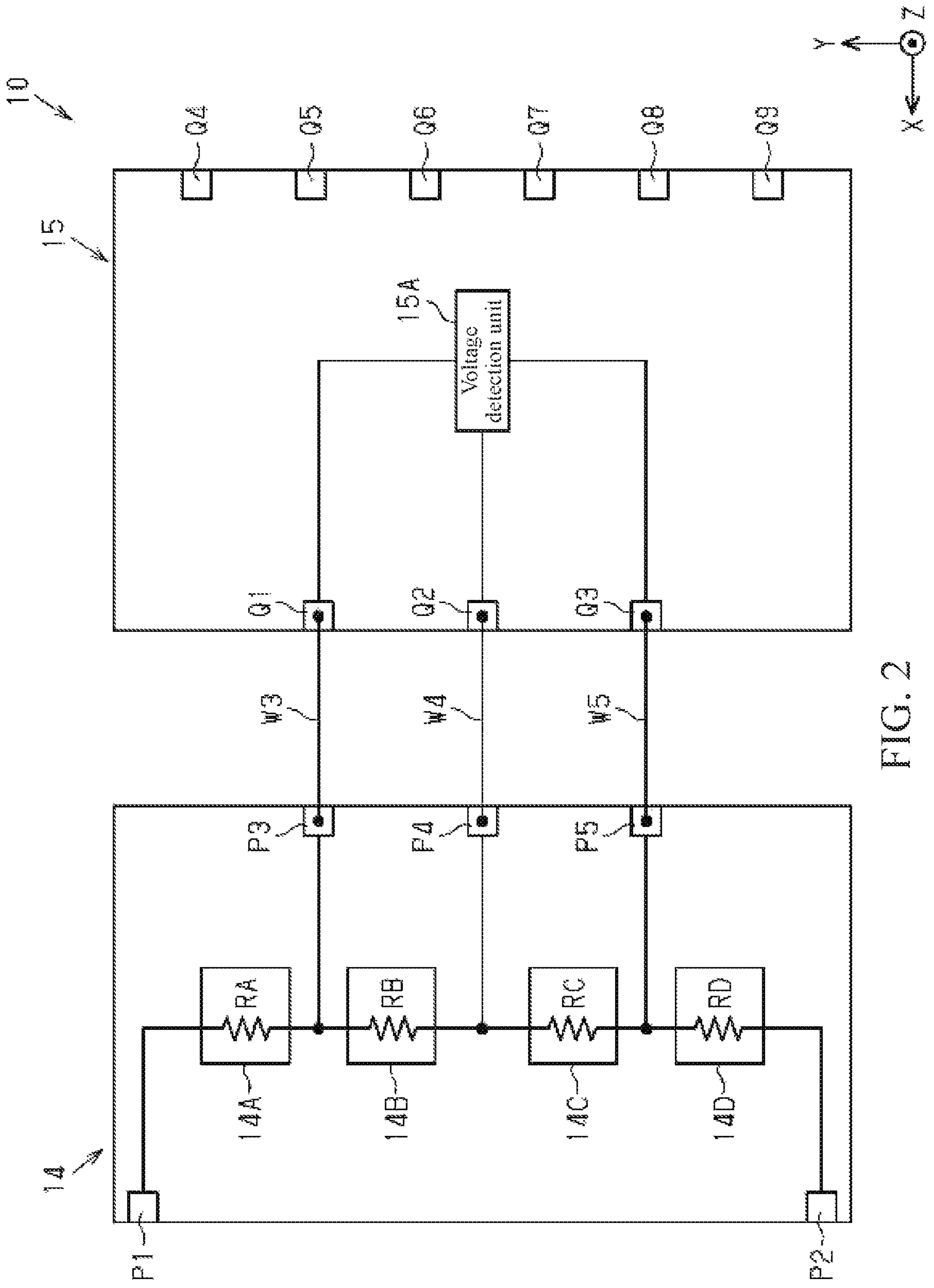
FIG. 2 is a brief plan view of a first chip and a second chip of the semiconductor module in FIG. 1.
Figure 3:
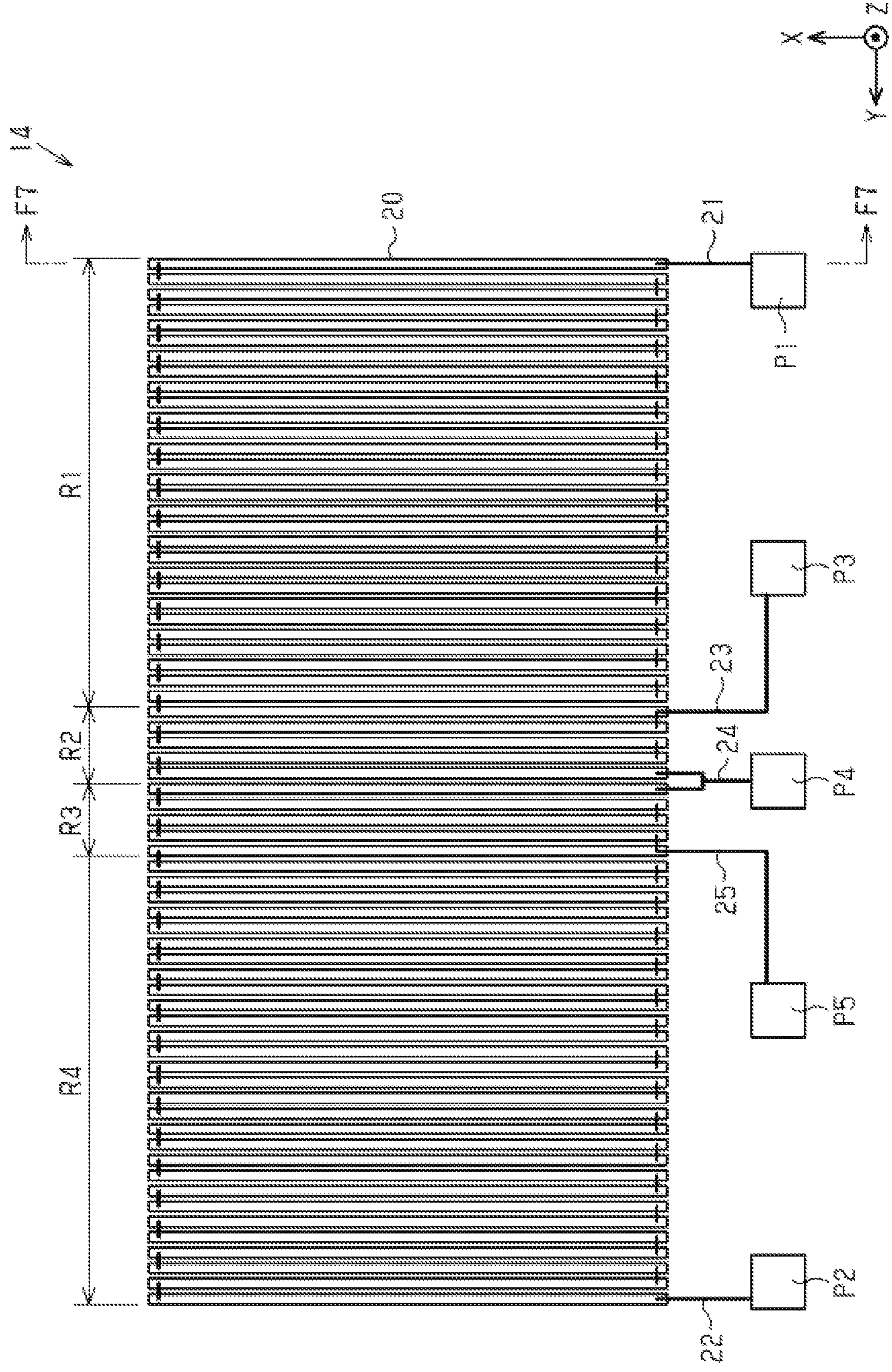
FIG. 3 is a brief plan view of semiconductor resistive layers of the first chip.

FIG. 1 and FIG. 2 schematically show an overall configuration of the semiconductor module 10. FIG. 3 shows a part of a planar structure of a first chip 14 to be described later. FIG. 4 to FIG. 7 show a part of a cross-section structure of the first chip 14. FIG. 8 to FIG. 17 show section diagrams of examples of manufacturing steps for the semiconductor module 10 according to the first embodiment. FIG. 18 shows a table indicating effects of the semiconductor module 10 according to the first embodiment.

Figure 4:
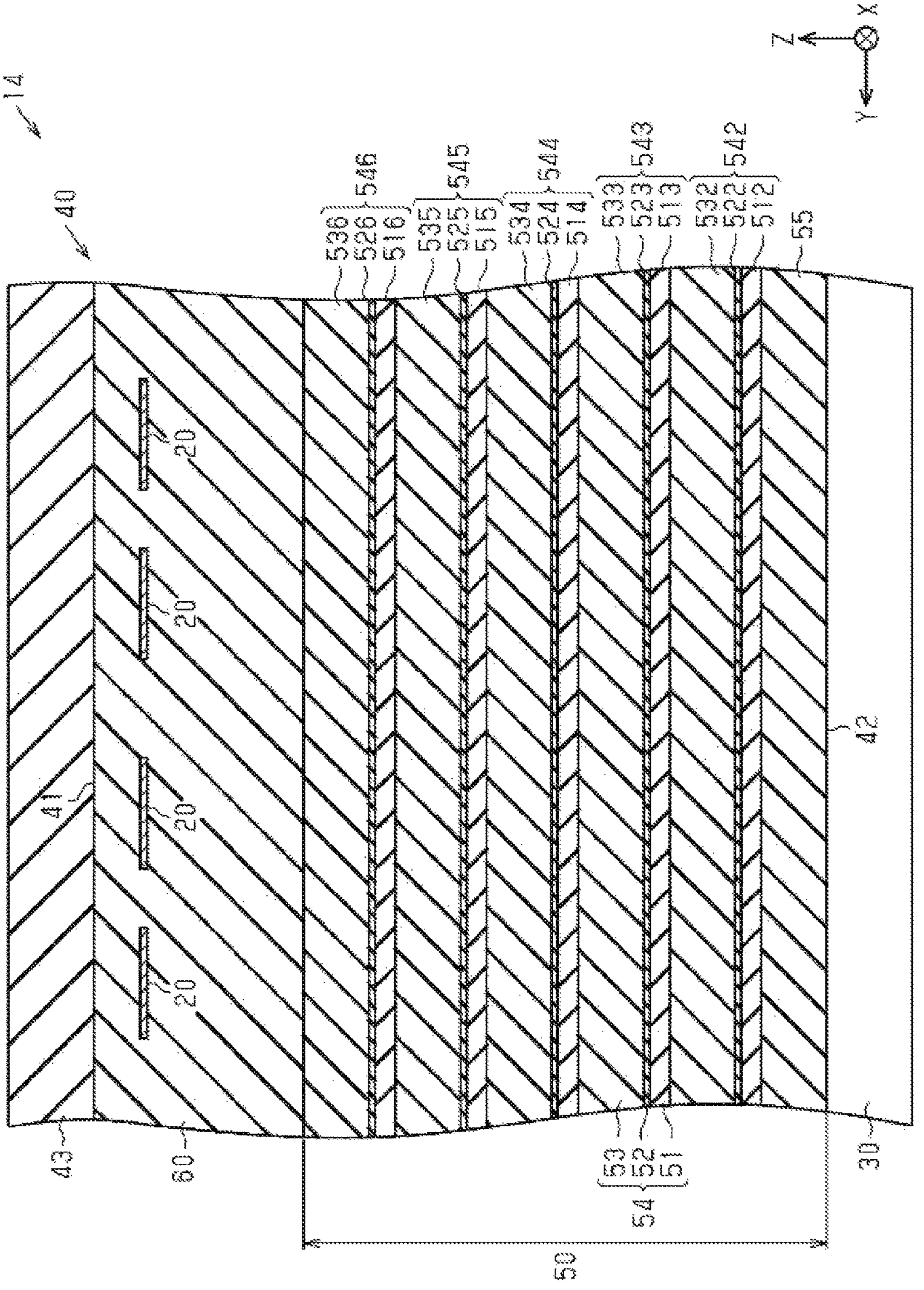
FIG. 4 is a brief section diagram of the semiconductor resistive layers and peripherals of the first chip.

Moreover, the expression "in a plan view" used in the present disclosure refers to observing the semiconductor device 10 in a Z-direction with X-axis, Y-axis and Z-axis being orthogonal to one another, as shown in FIG. 4. Unless otherwise specified, "in a plan view" refers to observing the semiconductor module 10 from top of the Z-axis.

Overall Configuration of Semiconductor Device

FIG. 1 schematically shows a brief overall configuration of the semiconductor module 10. FIG. 2 shows respective electrical configurations and electrical connections of the first chip 14 and a second chip 15 (to be described later) of the semiconductor module 10. Moreover, in FIG. 1, to better understand the drawing, constituting elements inside a sealing resin 16 (to be described later) are represented by solid lines. In FIG. 2, to better understand the drawing, constituting elements inside the first chip 14 and the second chip 15 are represented by solid lines.

As shown in FIG. 1, the semiconductor module 10 includes a frame 11, a die pad 12, multiple (seven in the first embodiment) lead wires 13A to 13G, the first chip 14 mounted on the frame 11, the second chip 15 mounted on the die pad 12, conductive wires W1 to W11, and the sealing resin 16 that seals the elements above. Moreover, in the first embodiment, the first chip 14 corresponds to "a semiconductor device", and the frame 11 corresponds to "a support member".

The sealing resin 16 is formed, for example, in a rectangular tablet shape with the Z direction as a thickness direction. The sealing resin 16 has first to fourth sealing side surfaces 16A to 16D. In the example in FIG. 1, in a plan view, the sealing resin 16 is formed in a rectangular shape with the X direction as a long side direction and the Y direction as a short side direction. The first sealing side surface 16A and the second sealing side surface 16B form two end surfaces of the sealing resin 16 in the X direction, and the third sealing side surface 16C and the fourth sealing side surface 16D form two end surfaces of the sealing resin 16 in the Y direction. Moreover, the shape of the sealing resin 16 in the plan view can be modified as desired.

The frame 11, the die chip 12 and the lead wires 13A to 13G are arranged separated from one another in the X direction. That is to say, the X direction is an arrangement direction of the frame 11, the die chip 12 and the lead wires 13A to 13G. In the example in FIG. 1, the arrangement direction of the frame 11, the die pad 12 and the lead wires 13A to 13G is consistent with the long side direction of the sealing resin 16. Thus, it can be said that the frame 11, the die chip 12 and the lead wires 13A to 13G are arranged separated from one another in the long side direction of the sealing resin 16. The frame 11 is disposed near the first sealing side surface 16A relative to the die pad 12. The lead wires 13A to 13G are disposed near the second sealing side surface 16B relative to the die pad 12. Each of the frame 11, the die pad 12 and the lead wires 13A to 13G is formed of a metal material such as copper (Cu) or aluminum (Al).

Moreover, in the first embodiment, each of the frame 11, the die pad 12 and the lead wires 13A to 13G is formed by a thin metal plate. As to be described later, the frame 11 is for mounting the first chip 14 and is at the same time electrically connected to the first chip 14, the die pad 12 is for mounting the second chip 15, and the lead wires 13A to 13G are electrically connected to the second chip 15. Thus, the frame 11 and the lead wires 13A to 13G are not limited to being made of thin metal plates but can be any conductive layers. Moreover, the die pad 12 is not limited to being made of a conductive material such as a thin metal plate, and can also be made of a plate formed of an insulating material. That is to say, the die pad 12 only needs to be a support member for supporting the second chip 15.

The frame 11 includes a die pad portion 11A and a lead wire portion 11B. In the first embodiment, the die pad portion 11A and the lead wire portion 11B are formed monolithically.

The die pad portion 11A is a part for mounting the first chip 14, and supports the first chip 14. The die pad portion 11A is disposed separated from and closer to the second sealing side surface 16B relative to the first sealing side surface 16A. The die pad portion 11A is formed in a rectangular tablet shape with the Z direction set as a thickness direction. In the plan view, the shape of the die pad portion 11A is a rectangular shape having the Y direction as a long side direction and the X direction as a short side direction. That is to say, the die pad portion 11A is formed to have the arrangement direction of the frame 11, the die pad 12 and the lead wires 13A to 13G as the short side direction. It can also be said that the die pad portion 11A is formed to have the long side direction of the sealing resin 16 as a short side direction.

The first chip 14 is mounted on the die pad portion 11A. More specifically, the first chip 14 is bonded with the die pad portion 11A by a conductive material such as solder paste or silver (Ag) paste. It can also be said that the first chip 14 is bonded with the die pad portion 11A. Thus, it can also be said that the first chip 14 is mounted on the frame 11. The lead wire 11B is connected to a corner, which includes, among four corners of the lead wire portion 11B, an end portion between two end portions of the die pad portion 11A in the Y direction that is closer to the third sealing side surface 16C, and an end portion between two end portions of the die pad portion 11A in the X direction that is closer to the first sealing side surface 16A. The lead wire portion 11B extends in the X direction from the die pad portion 11A to the first sealing side surface 16A.

Moreover, the configuration of the frame 11 can be modified as desired, for example, the die pad portion 11A and the lead wire portion 11B can also be disposed separately. That is to say, the die pad portion 11A and the lead wire portion 11B can also be arranged separated from each other. In this case, the die pad portion 11A is not limited to being a thin metal plate (a conductive layer), but can be formed of an insulating material. That is to say, the die pad 12 only needs to be a support member for supporting the first chip 14.

The die pad 12 is a part for mounting the second chip 15, and supports the second chip 15. In the plan view, the shape of the die pad portion 12 is a rectangular shape having the Y direction as a long side direction and the X direction as a short side direction. Thus, the long side direction of the die pad 12 is consistent with the long side direction of the die pad portion 11A of the frame 11, and the short side direction of the die pad 12 is consistent with the short side direction of the die pad portion 11A. That is to say, the die pad 12 is formed to have the arrangement direction of the frame 11, the die pad 12 and the lead wires 13A to 13G as the short side direction.

The second chip 15 is mounted on the die pad 12. More specifically, the second chip 15 is bonded with the die pad 12 by a conductive bonding material such as solder paste or silver (Ag) paste. It can also be said that the second chip 15 is bonded with the die pad 12.

The lead wires 13A and the lead wires 13B to 13G are arranged in a distributed manner on two end portions of the sealing resin 16 in the X direction. More specifically, the lead wire 13A is disposed, between two end portions of the sealing resin 16 in the X direction, on the end portion close to the first side surface 16A. Each of the lead wires 13B to 13G is disposed, between two end portions of the sealing resin 16 in the X direction, on the end portion close to the second sealing side surface 16B. In this first embodiment, when observing in the X direction, the lead wire 13A is disposed on a position overlapping, between two end portions of the die pad portion 11A in the Y direction, the end portion close to the fourth sealing side surface 16D. The lead wire 13A is disposed separated from the die pad portion 11A near the first sealing side surface 16A relative to the die pad portion 11A.

The lead wires 13B to 13G are arranged separated from one another in the Y direction in an aligned state with one another in the X direction. The lead wires 13B to 13G are arranged in an order of the lead wire 13B, the lead wire 13C, the lead wire 13D, the lead wire 13E, the lead wire 13F and the lead wire 13G from the fourth sealing side surface 16D to the third sealing side surface 16C. It is known from FIG. 1 that, a distance between the lead wire 13A and the lead wire portion 11B in the Y direction is greater than a distance between adjacent lead wires of the lead wires 13B to 13G in the Y direction.

The first chip 14 mounted on the die pad portion 11A is formed in a rectangular tablet shape. In the plan view, the shape of the first chip 14 is a rectangular shape having the Y direction as a long side direction and the X direction as a short side direction. That is to say, the long side direction of the first chip 14 is consistent with the long side direction of the die pad portion 11A, and the short side direction of the first chip 14 is consistent with the short side direction of the die pad portion 11A. Thus, the first chip 14 is formed to have the arrangement direction of the frame 11, the die pad 12 and the lead wires 13A to 13G as the short side direction.

The first chip 14 includes multiple terminals P1 to P5. The terminals P1 to P5 are formed to be exposed from a chip surface of the first chip 14. The terminals P1 and P2 are disposed, between two end portions of the chip surface in the X direction, on the end portion close to the first sealing side surface 16A. The terminal P1 is disposed near the lead wire 13A in the chip surface. The terminal P2 is disposed near the lead wire portion 11B in the chip surface. The terminals P3~P5 are disposed, between two end portions of the chip surface in the X direction, on the end portion close to the second chip 15. The terminals P3 to P5 are arranged separated from one another in the Y direction.

The second chip 15 mounted on the die pad 12 is formed in a rectangular tablet shape. In the plan view, the shape of the second chip 15 is a rectangular shape having the Y direction as a long side direction and the X direction as a short side direction. That is to say, the long side direction of the second chip 15 is consistent with the long side direction of the die pad 12, and the short side direction of the second chip 15 is consistent with the short side direction of the die pad 12. Thus, the second chip 15 is formed to have the arrangement direction of the frame 11, the die pad 12 and the lead wires 13A to 13G as the short side direction.

The second chip 15 includes multiple terminals Q1 to Q9. The multiple terminals Q1 to Q9 are formed to be exposed from a chip surface of the second chip 15. The terminals Q1 and Q3 are disposed, between two end portions of the chip surface in the X direction, on the end portion close to the first chip 14. The terminals Q1 to Q3 are arranged separated from one another in the Y direction. The terminals Q4 and Q9 are disposed, between two end portions of the chip surface in the X direction, on the end portion close to the second sealing side surface 16B. The terminals Q4 to Q9 are arranged separated from one another in the Y direction.

The terminal P1 of the first chip 14 is electrically connected to the lead wire 13A via the conductive wire W1. The terminal P2 is electrically connected to the lead wire portion 11B via the conductive wire W2. Thus, it can be said that the terminal P2 is electrically connected to the frame 11. The lead wire 13A and the lead wire portion 11B are electrically connected to a high voltage generation unit VT. The high voltage generation unit VT is, for example, a direct current (DC) power supply. The lead wire 13A is electrically connected to a positive electrode of the high voltage generation unit VT, and the lead wire portion 11B is electrically connected to a negative electrode of the high voltage generation unit VT.

The terminal P3 to P5 of the first chip 14 are respectively electrically connected to the terminals Q1 to Q3 of the second chip 15 via the conductive wires W3 to W5. The terminals Q4 to Q9 are electrically connected to the lead wires 13B to 13G via the conductive wires W6 to W11, respectively.

Herein, in the first embodiment, the terminals P1 and P2 among the terminals P1 to P5 form high-voltage-side terminals, and the terminals P3 to P5 form low-voltage-side terminals. That is to say, among the terminals P1 to P5 of the first chip 14, the terminals electrically connected to the lead wire 13A and the lead wire portion 11B form high-voltage-side terminals, and the terminals electrically connected to the second chip 15 form low-voltage-side terminals.

Accordingly, the die pad portion 11A of the frame 11 electrically connected to the high voltage generation unit VT forms a high-voltage-side die pad, and the die pad 12 forms a low-voltage-side die pad. Thus, an insulation withstand voltage of the terminals P3 to P5 and the semiconductor substrate 30 (to be described later) of the first chip 14 is higher than an insulation withstand voltage of the terminals P1 and P2 and the semiconductor substrate 30. In one example, the insulation withstand voltage of the terminals P3 to P5 and the semiconductor substrate 30 is approximately 3850 V under a DC voltage, and the insulation withstand voltage of the terminals P1 and P2 and the semiconductor substrate 30 is approximately 1400 V under a DC voltage.

Next, circuit configurations in the first chip 14 and the second chip 15 are described below.

As shown in FIG. 2, the first chip 14 includes first to fourth resistive circuits 14A to 14D for stepping down the high voltage of the high voltage generation unit VT (referring to FIG. 1). The first resistive circuit 14A includes a resistance value RA, the second resistive circuit 14B includes a resistance value RB, the third resistive circuit 14C includes a resistance value RC, and the fourth resistive circuit 14D includes a resistance value RD.

The resistance value RB is less than the resistance value RA. A ratio (RB/RA) of the resistance value RB to the resistance RA is predetermined. The resistance value RC is less than the resistance value RD. A ratio (RC/RD) of the resistance value RC to the resistance RD is predetermined. The ratio (RB/RA) and the ratio (RC/RD) are set to a same predetermined value (for example, 1/999).

The first to fourth resistive circuits 14A to 14D are connected in series. Each of the first to fourth resistive circuits 14A to 14D has a first end and a second end. The first end of the first resistive circuit 14A is electrically connected to the terminal P1, and the second end of the first resistive circuit 14A is electrically connected to the first end of the second resistive circuit 14B. A connection point of the first resistive circuit 14A and the second resistive circuit 14B is electrically connected to the terminal P3. The second end of the second resistive circuit 14B is electrically connected to the first end of the third resistive circuit 14C. A connection point of the second resistive circuit 14B and the third resistive circuit 14C is electrically connected to the terminal P4. The second end of the third resistive circuit 14C is electrically connected to the first end of the fourth resistive circuit 14D. A connection point of the third resistive circuit 14C and the fourth resistive circuit 14D is electrically connected to the terminal P5. The second end of the fourth resistive circuit 14D is electrically connected to the terminal P2.

The second chip 15 includes a voltage detection circuit 15A. The voltage detection circuit 15A includes an operational amplifier. The voltage detection circuit 15A is electrically connected to the terminals Q1 to Q3. The terminal Q1 is electrically connected to the terminal P3 of the first chip 14 via the conductive wire W3, the terminal Q2 is electrically connected to the terminal P4 of the first chip 14 via the conductive wire W4, and the terminal Q3 is electrically connected to the terminal P5 of the first chip via the conductive wire W5. Thus, the voltage detection circuit 15A detects voltages among the connection point of the first resistive circuit 14A and the second resistive circuit 14B, the connection point of the second resistive circuit 14B and the third resistive circuit 14C, and the connection point of the third resistive circuit 14C and the fourth resistive circuit 14D. The terminals Q4 to Q9 (the lead wires 13B to 13G (referring to FIG. 1) are used to supply a power supply voltage to the operational amplifier in the second chip 15, or output an output signal of the voltage detection circuit 15A.

Brief Planar Structure of First Chip

FIG. 3 shows a brief planar structure of the first chip 14 including the first to fourth resistive circuits 14A to 14D (referring to FIG. 2) of the first chip 14.

As shown in FIG. 3, the first chip 14 includes multiple semiconductor resistive layers (to be referred to as "semiconductor resistive layer 20" below). Each semiconductor resistive layer 20 extends in the X direction. In other words, each semiconductor resistive layer 20 extends in the short side direction of the first chip 14. The multiple semiconductor resistive layers 20 are arranged separated from one another in the Y direction in an aligned state with one another in the X direction. In other words, the multiple semiconductor resistive layers 20 are arranged separated from one another in the long side direction of the first chip 14.

Among the multiple semiconductor resistive layers 20, the semiconductor resistive layer 20 disposed on the first end in the Y direction is electrically connected to the terminal P1. Among the multiple semiconductor resistive layers 20, the semiconductor resistive layer 20 disposed on the second end opposite to the first end in the Y direction is electrically connected to the terminal P2. The terminal P1 and the semiconductor resistive layer 20 are electrically connected via a wiring 21. The terminal P2 and the semiconductor resistive layer 20 are electrically connected via a wiring 22.

Herein, each semiconductor resistive layer 20 includes a first resistive end portion and a second resistive end portion. The first resistance end is, between two end portions of each semiconductor resistive layer 20 in the X direction, the end portion on the side of the terminals P1 and P2. The second resistance end is, between two end portions of each semiconductor resistive layer 20 in the X direction, the end portion on the side opposite to the side of the terminals P1 and P2.

The multiple semiconductor resistive layers 20 are used as constituting elements of the first to fourth resistive circuits 14A to 14D (referring to FIG. 2). The multiple semiconductor resistive layers 20 can be divided into first to fourth resistive regions R1 to R4 in the Y direction to serve as multiple resistive regions. The first resistive region R1 is a region including first ends of the multiple semiconductor resistive layers 20 in the Y direction, and the fourth resistive region R4 is a region including second ends of the multiple semiconductor resistive layers 20 in the Y direction. The second ends of the multiple semiconductor resistive layers 20 are ends opposite to the first ends in the Y direction of the multiple semiconductor resistive layers 20. A portion disposed between the first resistive region R1 and the fourth resistive region R4 in the multiple semiconductor resistive layers 20 in the Y direction is divided by the second resistive region R2 and the third resistive region R3. The second resistive region R2 is a region adjacent to the first resistive region R1, and the third region R3 is a region adjacent to the fourth resistive region R4. Thus, the first to fourth regions R1 to R4 are arranged in an order of resistive regions R1, R2, R3 and R4 from the first end to the second end of the multiple semiconductor resistive layers 20. The first resistive region R1 is a region forming the first resistive circuit 14A, the second resistive region R2 is a region forming the second resistive circuit 14B, the third resistive region R3 is a region forming the third resistive circuit 14C, and the fourth resistive region R4 is a region forming the fourth resistive circuit 14D.

The number of the semiconductor resistive layers 20 in each of the first to fourth resistive regions R1 to R4 is set separately. In the first embodiment, the numbers of the semiconductor resistive layers 20 in the first resistive region R1 and the fourth resistive region R4 are the same, and the numbers of the semiconductor resistive layers 20 in the second resistive regions R2 and the third resistive regions R3 are the same. Moreover, the respective numbers of the first resistive region R1 and the fourth resistive region R4 are greater than the respective numbers of the second resistive region R2 and the third resistive region R3. Moreover, the numbers of the semiconductor resistive layers 20 in the first to fourth resistive regions R1 to R4 are not limited to those described in the first embodiment, but can be modified as desired.

In the first to fourth resistive regions R1 to R4, all of the multiple semiconductor resistive layers 20 are connected in series by alternately electrically connecting the multiple semiconductor resistive layers 20 at the first resistive end portions and the second resistive end portions.

The terminal P3 is electrically connected to the first resistive end portion of the semiconductor resistive layer 20 close to the first resistive region R1 in the second resistive region R2. The terminal P3 and the semiconductor resistive layer 20 are electrically connected via a wiring 23.

The terminal P4 is electrically connected to the first resistive end portion of the semiconductor resistive layer 20 close to the third resistive region R3 in the second resistive region R2, and the first resistance portion of the semiconductor resistive layer 20 close to the second resistive region R2 in the third resistive region R3. The terminal P4 and two semiconductor resistive layers 20 are electrically connected via a wiring 24.

The terminal P5 is electrically connected to the first resistive end portion of the semiconductor resistive layer 20 close to the fourth resistive region R4 in the third resistive region R3. The terminal P5 and the semiconductor resistive layer 20 are electrically connected via a wiring 25.

Cross-Section Structure of First Chip

Figure 5:
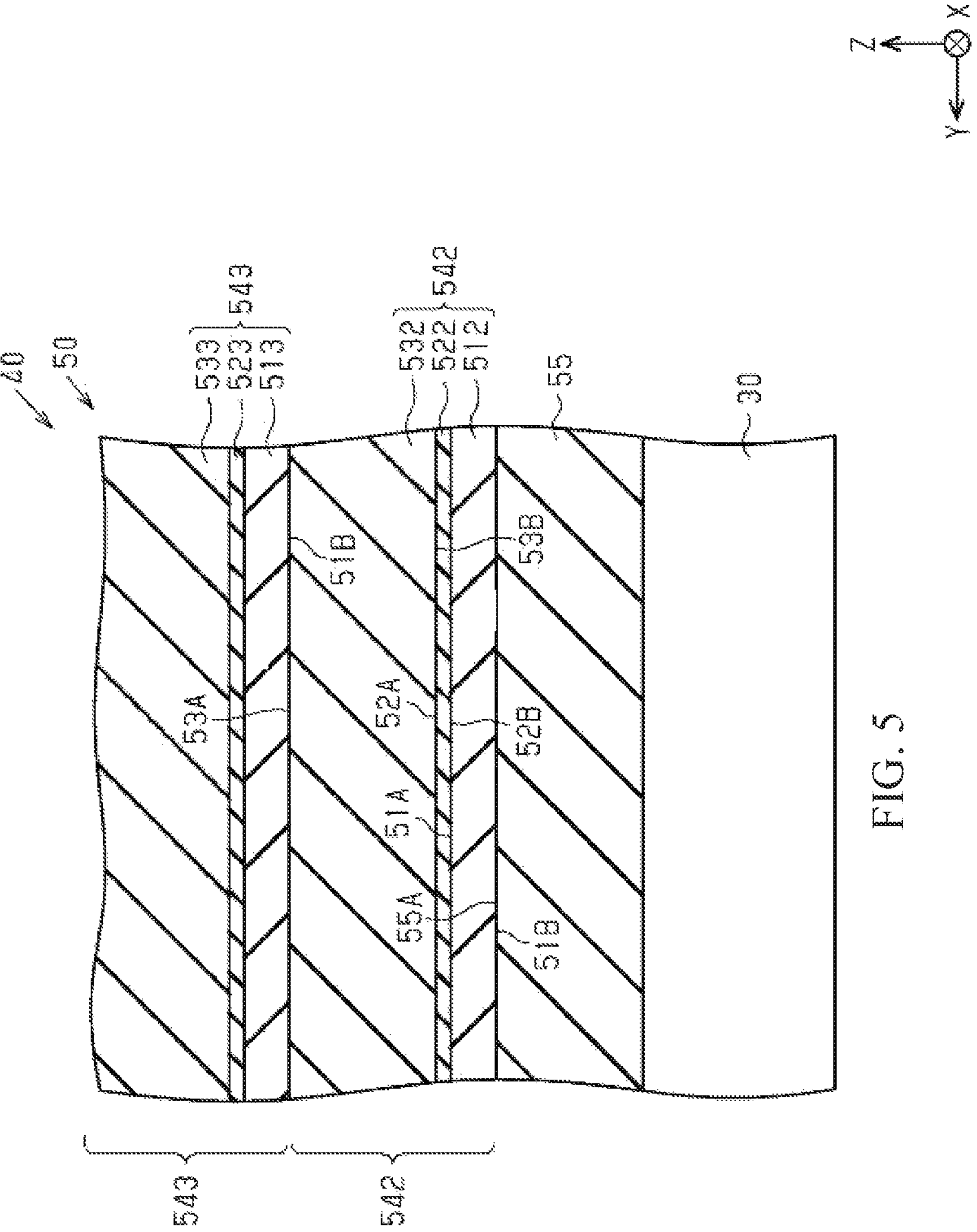
FIG. 5 is an enlarged section diagram of a part of a substrate-side insulating layer in FIG. 4.
Figure 6:
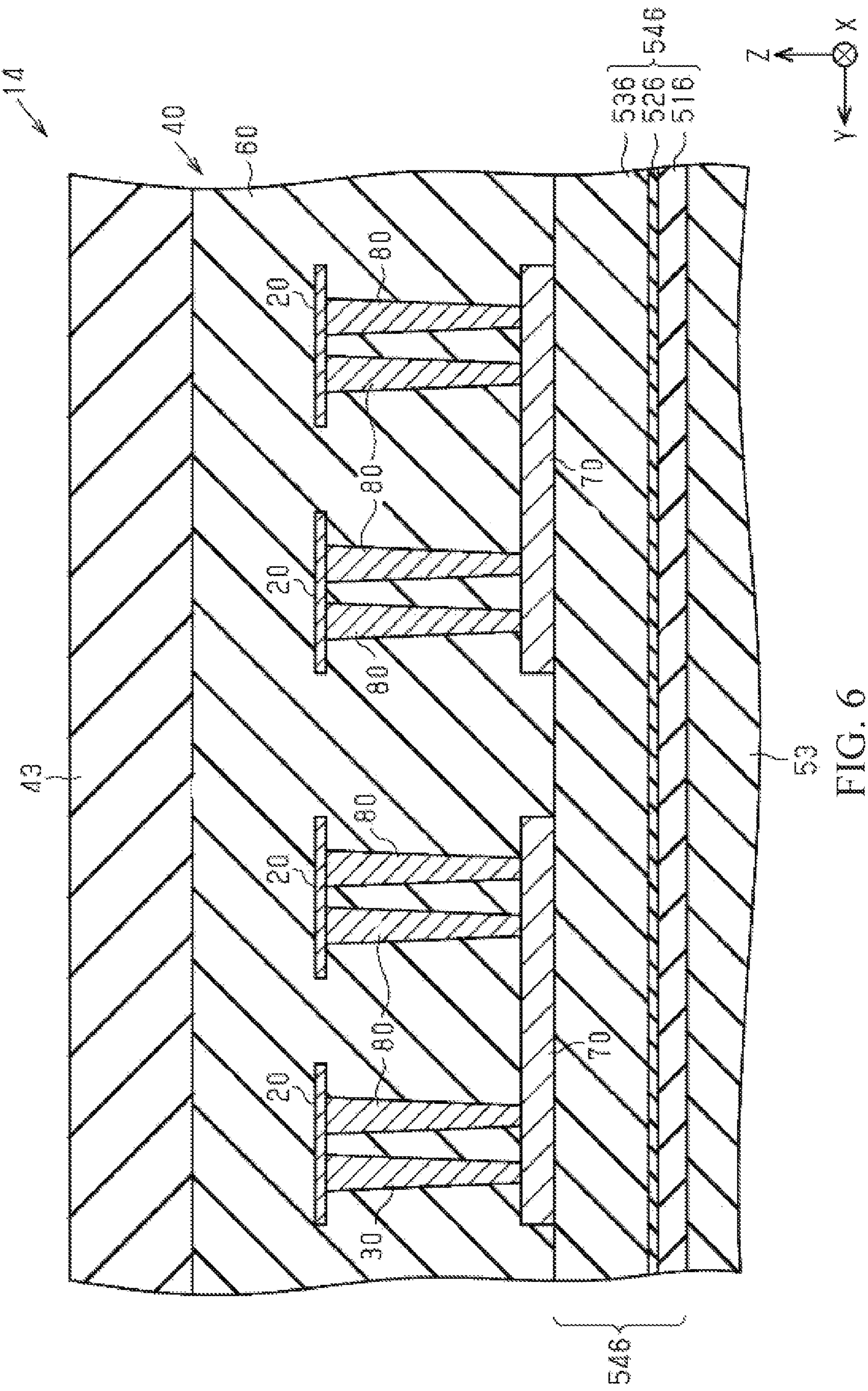
FIG. 6 is a brief section diagram of wiring layers and peripherals of the first chip.
Figure 7:
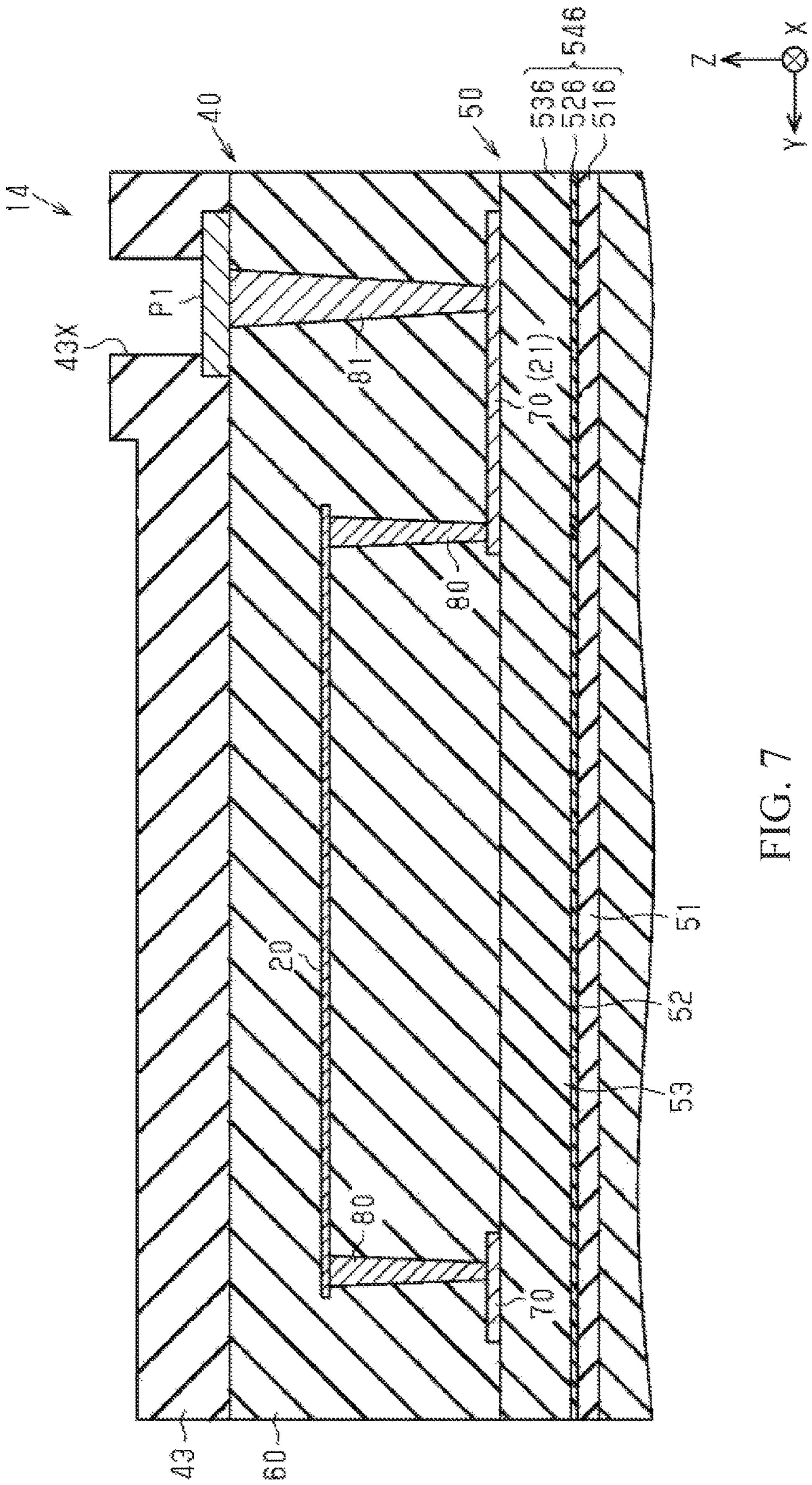
FIG. 7 is a brief section diagram of cutting the first chip along the line F7-F7 in FIG. 3.

Referring to FIG. 4 to FIG. 7, an example of an internal configuration of the first chip 14 is described below. FIG. 4 to FIG. 7 respectively schematically show cross-section structures of the first chip 14. FIG. 4 shows a cross-section structure of a region including four semiconductor resistive layers 20 adjacent in the Y direction in the first resistive region R1 by cutting along a YZ plane. FIG. 5 shows an enlarged partial structure in FIG. 4. FIG. 6 shows a cross-section structure of the first resistance end portions of the four semiconductor resistive layers 20 in FIG. 4 by cutting along the YZ plane. FIG. 7 shows a cross-section structure of the first chip 14 cut along the line F7-F7 in FIG. 3.

As shown in FIG. 4, the first chip 14 includes the semiconductor substrate 30, and an element insulating layer 40 formed on the semiconductor substrate 30.

The semiconductor substrate 30 is a semiconductor substrate formed by a Si-containing material. A thickness of the semiconductor substrate 30 is, for example, approximately 300 μm. In the first embodiment, a coefficient of thermal expansion of the semiconductor substrate 30 is, for example, $3.3*10^{-6}$ (1/° C.

Moreover, the semiconductor substrate 30 can also be implemented by a wide bandgap semiconductor or a compound semiconductor. The wide bandgap semiconductor is a semiconductor substrate having a bandgap of 2.0 eV or more. The wide bandgap semiconductor can also be silicon carbide (SiC). The compound semiconductor can also be a III-V group compound semiconductor. The compound semiconductor can also include at least one of aluminum nitride (AlN), indium nitride (InN), gallium nitride (GaN), and gallium arsenide (GaAs).

The element insulating layer 40 has an element front surface 41 and an element back surface 42 facing opposite to each other in the Z direction. Moreover, in the first embodiment, the Z direction corresponds to "a thickness direction of the element insulating layer". The element back surface 42 is in contact with the semiconductor substrate 30. The element front surface 41 is a surface opposite to the semiconductor substrate 30 in the Z direction.

The terminals P1 to P5 (referring to FIG. 3) and a passivation film 43 are formed on the element insulating layer 40.

The terminals P1 to P5 are formed on the element front surface 41 of the element insulating layer 40. The terminals P1 to P5 are appropriately made of one or more materials selected from titanium (Ti), titanium nitride (TiN), tantalum (Ta), tantalum nitride (TaN), gold (Au), silver (Ag), copper (Cu), aluminum (Al), nickel (Ni), palladium (Pd) and tungsten (W). In the first embodiment, the terminals P1 to P5 are formed of an Al-containing material. As an example, FIG. 7 depicts an example of a structure in which the terminal P1 is formed on the element front surface 41. Moreover, although not shown, similar to the terminal P1, the terminals P2 to P5 are formed on the element front surface 41.

As shown in FIG. 7, the terminal P1 is covered by the passivation film 43. On the other hand, the passivation film 43 has an opening portion 43X exposing the terminal P1. Moreover, although not shown, the passivation film 43 has an opening portion 43X exposing the terminal P2 to P5 shown in FIG. 1 to FIG. 3. Thus, the terminals P1 to P5 include exposed surfaces for connecting to the conductive wires W1 to W5 (referring to FIG. 1). As such, the terminals P1 to P5 form electrode pads.

As shown in FIG. 4, the passivation film 43 is formed on the element front surface 41 of the element insulating layer 40. The passivation film 43 is a surface protective film of the first chip 14, and is formed of, for example, a SiN-containing material. Moreover, the material forming the passivation film 43 can be modified as desired, for example, formed of a $SiO_2$-containing material. Moreover, the passivation film 43 can also be a laminated structure of multiple films, for example, a laminated structure including a film formed of a SiN-containing material and a film formed of a $SiO_2$-containing material.

The element insulating layer 40 includes a substrate-side insulating layer 50 disposed on the semiconductor substrate 30, and a front-side insulating layer 60 laminated on the substrate-side insulating layer 50.

The substrate-side insulating layer 50 is, for example, an insulating layer for increasing the insulation withstand voltage of the first chip 14. The substrate-side insulating layer 50 is an insulating layer including the element back surface 42 of the element insulating layer 40. That is to say, substrate-side insulating layer 50 is in contact with the semiconductor substrate 30.

In the first embodiment, the substrate-side insulating layer 50 includes a first nitride insulating layer 51, a second nitride insulating layer 52 disposed on the first nitride insulating layer 51, and an oxide film 53 disposed on the second nitride insulating layer 52. Herein, a unit including the first nitride insulating layer 51, the second nitride insulating layer 52 and the oxide film 53 is set as "an insulating unit 54".

In the first embodiment, the substrate-side insulating layer 50 is formed by means of laminating multiple (five in the first embodiment) insulating units 54. In the first embodiment, the substrate-side insulating layer 50 includes: a lower layer oxide film 55 as a first layer, disposed on the semiconductor substrate 30 to be in contact with the semiconductor substrate 30; and the insulating units 54, disposed on the lower layer oxide film 55, forming a second layer to a sixth layer.

The insulating unit 54 is configured to be sequentially laminated with the first nitride insulating layer 51, the second nitride insulating layer 52 and the oxide film 53. In the insulating unit 54, the second nitride insulating layer 52 is in contact with the first nitride insulating layer 51, and the oxide film 53 is in contact with the second nitride insulating layer 52. More specifically, the first nitride insulating layer 51 has an upper surface 51A and a lower surface 51B facing opposite to each other in the Z direction. The oxide film 53 has an upper surface 53A and a lower surface 53B facing opposite to each other in the Z direction. The second nitride insulating layer 52 has an upper surface 52A and a lower surface 52B facing opposite to each other in the Z direction. The upper surface 51A of the first nitride insulating layer 51 is in contact with the lower surface 52B of the second nitride insulating layer 52, and the lower surface 53B of the oxide film 53 is in contact with the upper surface 52A of the second nitride insulating layer 52.

In the description below, n layers of the insulating unit 54 are set as "insulating units 54*n*) to express one digit of the insulating unit in accordance with the order of the layers. Herein, for the constituting elements of the insulating unit 54, that is, the first nitride insulating layer 51, the second nitride insulating layer 52 and the oxide film 53, one digit of these numerals is also expressed in accordance with the order of the layers. For example, the insulating unit 54 as the second layer becomes "an insulating unit 542", and the first nitride insulating layer 51 of the insulating unit 542, the second nitride insulating layer 52 and the oxide film 53 respectively become "a first nitride insulating layer 512", "a second nitride insulating layer 522", and an "oxide film 532".

As shown in FIG. 5, the insulating layer 542 as the second layer is laminated on the lower layer oxide film 55. The insulating unit 542 is in contact with the lower layer oxide film 55. More specifically, the lower surface 51B of the first nitride insulating layer 512 of the insulating unit 542 is contact with the upper surface 55A of the lower layer oxide film 55.

The insulating unit 543 as the third layer is laminated on the insulating unit 542. The insulating unit 543 is in contact with the insulating unit 542. More specifically, the lower surface 51B of the first nitride insulating layer 513 of the insulating unit 543 is contact with the upper surface 53A of the oxide film 532 of the insulating unit 542. Moreover, as shown in FIG. 4, since the laminated structures of the insulating units 544 to 546 as the fourth layer to the sixth layer are the same as the insulating units 542 and 543, associated details are omitted herein.

As shown in FIG. 5, both of the first nitride insulating layer 512 and the second nitride insulating layer 522 of the insulating unit 542 are sandwiched by the lower layer oxide film 55 and the oxide film 532 of the insulating unit 542 in the Z direction. In other words, in the insulating unit 542, both of the first nitride insulating layer 512 and the second nitride insulating layer 522 are interposed between the lower layer oxide film 55 and the oxide film 532 of the insulating unit 542 in the Z direction. In the insulating unit 542, the lower layer oxide film 55 corresponds to “a first oxide film”, and the oxide film 532 corresponds to “a second oxide film”.

Both of the first nitride insulating layer 513 and the second nitride insulating layer 523 of the insulating unit 543 are sandwiched by the oxide film 532 of the insulating unit 542 and the oxide film 533 of the insulating unit 543 in the Z direction. In other words, in the insulating unit 543, both of the first nitride insulating layer 513 and the second nitride insulating layer 523 are interposed between the oxide film 532 of the insulating unit 542 and the oxide film 533 of the insulating unit 543 in the Z direction. Herein, in the insulating unit 543, the oxide film 532 corresponds to “a first oxide film”, and the oxide film 533 corresponds to “a second oxide film”.

Both of the first nitride insulating layers 514 to 516 and the second nitride insulating layer 524 to 526 (referring to FIG. 4) of the insulating units 544 to 546 as the fourth layer to the sixth layer, similar to the first nitride insulating layer 513 and the second nitride insulating layer 523 of the insulating unit 543, are sandwiched by the oxide films 533 to 535 of the insulating units 543 to 545 as the third layer to the fifth layer that are lower layers in the Z direction. In other words, both of the first nitride insulating layer 514 to 516 and the second nitride insulating layers 524 to 526 of the insulating units 544 to 546 as the fourth layer to the sixth layer are respectively interposed between the oxide films 53 of the insulating units 543 and 545 that are lower layers in the Z direction. Moreover, in the insulating units 544 to 546 as the fourth layer to the sixth layer, the oxide films 533 to 535 of the insulating units 543 to 545 as the third layer to the fifth layer correspond to “first oxide layers”, and the oxide films 534 to 536 of the insulating units 544 to 546 as the fourth layer to the sixth layer correspond to “second oxide films”.

Next, the constituting elements of the insulating unit 54, that is, the oxide film 53, the first nitride insulating layer 51 and the second nitride insulating layer 52, are described below. In the description below, since the insulating units 542 to 546 as the second layer to the sixth layer are common, for the first nitride insulating layer 51, the second nitride insulating layer 52 and the oxide film 53, the same numerals are directly used to express one digit of these numerals instead of in accordance with an order of these layers. Moreover, when an order of the layers needs to be distinguished, for the first nitride insulating layer 51, the second nitride insulating layer 52 and the oxide film 53, one digit of these numerals is expressed in accordance with the order of the layers.

The oxide film 53 is formed of, for example, a SiO (silicon oxide)-containing material. In the first embodiment, the oxide film 53 is formed of a $SiO_2$ material. A coefficient of thermal expansion of the oxide film 53 is, for example, $0.55*10^{-6}$ (1/° C. A thickness of the oxide film 53 is, for example, 0.5 μm or more and 5 μm or less. In the first embodiment, the thickness of the oxide film 53 is approximately 2.1 μm.

The first nitride insulating layer 51 is formed of a material containing such as SiN (silicon nitride), nitrogen-doped silicon carbide (SiCN) or nitrogen-doped silicon oxide (SiON). In the first embodiment, the first nitride insulating layer 51 is formed of a SiN-containing material. Thus, the first nitride insulating layer 51 has a coefficient of thermal expansion larger than a coefficient of thermal expansion of the oxide film 53. In one example, the first nitride insulating layer 51 has a coefficient of thermal expansion larger than a coefficient of thermal expansion of the semiconductor substrate 30.

The first nitride insulating layer 51 is a film having opposite stress to the oxide film 53. The first nitride insulating layer 51 is, for example, a nitride insulating layer with tensile stress. Thus, the first nitride insulating layer 51 is configured to generate thermal stress in a direction opposite to a direction in which thermal stress occurs in the oxide film 53.

The first nitride insulating layer 51 has a thickness less than the thickness of the oxide film 53. The thickness of the first nitride insulating layer 51 is, for example, 0.05 μm or more and less than 1 μm. In the first embodiment, the thickness of the first nitride insulating layer 51 is approximately 0.3 μm.

The first nitride insulating layer 51 is formed by means of, for example, plasma chemical vapor deposition (CVD). The first nitride insulating layer 51 is formed by means of controlling an amount of supply of an impurity-containing gas in plasma CVD so as to have tensile stress.

The second nitride insulating layer 52 is formed of a SiN-containing, SiCN-containing or SiON-containing material. In the first embodiment, the second nitride insulating layer 52 is formed of a SiN-containing material. That is to say, in the first embodiment, the first nitride insulating layer 51 and the second nitride insulating layer 52 are formed of the same material. Thus, the second nitride insulating layer 52 has a coefficient of thermal expansion larger than the coefficient of thermal expansion of the oxide film 53.

The second nitride insulating layer 52 is a film having same stress as the oxide film 53. That is to say, the second nitride insulating layer 52 is a film having opposite stress to the first nitride insulating layer 51. The second nitride insulating layer 52 is, for example, a nitride insulating layer with compressive stress. Thus, the second nitride insulating layer 52 is configured to generate thermal stress in a direction same as a direction in which thermal stress occurs in the oxide film 53. In other words, the second nitride insulating layer 52 is configured to generate thermal stress in a direction opposite to a direction in which thermal stress occurs in the first nitride insulating layer 51.

The second nitride insulating layer 52 is formed by means of, for example, plasma CVD. The second nitride insulating layer 52 is formed by means of controlling an amount of supply of an impurity-containing gas in plasma CVD so as to have compressive stress. Thus, the second nitride insulating layer 52 has a coefficient of thermal expansion smaller than the coefficient of thermal expansion of the first nitride insulating layer 51. In other words, the second nitride insulating layer 52 has a coefficient of thermal expansion between the coefficients of thermal expansion of the oxide layer 53 and the first nitride insulating layer 51.

The second nitride insulating layer 52 has a film density higher than the film density of the first nitride insulating layer 51. The second nitride insulating layer 52 has a film density higher than the film density of the oxide film 53. The film density can be modified based on conditions such as plasma CVD film forming temperature and silane gas flow rate. Moreover, the second nitride insulating layer 52 has a fracture toughness higher than a fracture toughness of the first nitride insulating layer 51.

The second nitride insulating layer 52 has a thickness less than the thickness of the first nitride insulating layer 51. The thickness of the second nitride insulating layer 52 is, for example, 0 μm or more and less than 1 μm. The thickness of the second nitride insulating layer 52 is, for example, 0 μm or more and less than 0.05 μm. In the first embodiment, the thickness of the second nitride insulating layer 52 is approximately 0.04 μm.

Moreover, for the consideration of readability of the drawings, a ratio of the thickness of the first nitride insulating layer 51 to the thickness of the second nitride insulating layer 52, a ratio of the thickness of the first nitride insulating layer 51 to the thickness of the oxide layer 53 and a ratio of the thickness of the second nitride insulating layer 52 to the thickness of the oxide film 53 in the drawings are different from an actual ratio of the thickness of the first nitride insulating layer 51 to the thickness of the second nitride insulating layer 52, an actual ratio of the thickness of the first nitride insulating layer 51 to the thickness of the oxide layer 53 and an actual ratio of the thickness of the second nitride insulating layer 52 to the thickness of the oxide film 53.

Moreover, the number of layers of the insulating unit 54 can be modified as desired according to the insulation withstand voltage required by the first chip 14. Moreover, an upper limit of the number of layers of the insulating unit 54 can be modified as desired according to warpage of the semiconductor wafer that forms the first chip 14. That is to say, the upper limit of the number of layers of the insulating unit 54 can be modified as desired, as long as being within a range below tolerable warpage of the semiconductor wafer.

As shown in FIG. 4, FIG. 6 and FIG. 7, in the first embodiment, multiple semiconductor resistive layers 20 are disposed on the substrate-side insulating layer 50. The multiple semiconductor resistive layers 20 are covered by the front-side insulating layer 60. Thus, it can be said that the multiple semiconductor resistive layers 20 are embedded into the element insulating layer 40. Thus, it can be said that the first chip 14 further includes the semiconductor resistive layers 20 disposed on the substrate-side insulating layer 50, and the front-side insulating layer 60 covering the semiconductor resistive layers 20.

The front-side insulating layer 60 is formed of, for example, a SiO (silicon oxide)-containing material. In the first embodiment, the front-side insulating layer 60 is formed of a $SiO_2$-containing material. In one example, the front-side insulating layer 60 is formed of a same material as the oxide film 53 of the substrate-side insulating layer 50.

The front-side insulating layer 60 is in contact with the oxide film 536 of the insulating unit 546 as the sixth layer. Herein, when the front-side insulating layer 60 and the oxide film 536 are formed of the same material, an interface between the front-side insulating layer 60 and the oxide film 536 is not formed. However, in FIG. 6 and FIG. 7, to better understand the drawings and for the sake of convenience, an interface between the front-side insulating layer 60 and the oxide film 536 is depicted. Moreover, when the front-side insulating layer 60 and the oxide film 536 are formed of different materials, an interface between the front-side insulating layer 60 and the oxide film 536 is formed.

The multiple substrate resistive layers 20 disposed on the substrate-side insulating layer 50 are arranged on a same position as one another in the Z direction. Each of the semiconductor resistive layers 20 is arranged separated from the substrate-side insulating layer 50 in the Z direction. More specifically, each of the semiconductor resistive layers 20 is arranged separated from the oxide layer 536 of the insulating unit 546 as the sixth layer in the Z direction.

The semiconductor resistive layer 20 is formed in a flat shape with the Z direction set as a thickness direction. A thickness of the semiconductor resistive layer 20 is less than a width of the semiconductor resistive layer 20 (a length in the X direction). The thickness of the semiconductor resistive layer 20 is, for example, 1 μm or more and 100 μm or less. In the first embodiment, the thickness of the semiconductor resistive layer 20 is approximately 2.5 μm. The semiconductor resistive layer 20 is formed of, for example, a material containing chromium silicide (CrSi). Thus, it can be said that the semiconductor resistive layer 20 has a thickness less than the thickness of the oxide film 53. It can be said that the semiconductor resistive layer 20 has a thickness less than the thickness of the first nitride insulating layer 51. It can be said that the semiconductor resistive layer 20 has a thickness less than the thickness of the second nitride insulating layer 52.

As shown in FIG. 6 and FIG. 7, the first chip 14 includes multiple wiring layers 70 disposed in the front-side insulating layer 60. The multiple wiring layers 70 are conductive layers including the wirings 21 to 25 shown in FIG. 3. The multiple wiring layers 70 are, for example, disposed on the substrate-side insulating layer 50. More specifically, the multiple wiring layers 70 are in contact with the oxide film 536 of the insulating unit 546 as the sixth layer. The multiple wiring layers 70 are covered by the front-side insulating layer 60. Thus, in the Z direction, the wiring layers 70 are arranged to be closer to the semiconductor substrate 30 (referring to FIG. 4) than the semiconductor resistive layers 20.

Moreover, positions of the multiple wiring layers 70 in the Z direction can be modified as desired. In one example, the multiple wiring layers 70 can be, for example, disposed on the first nitride insulating layer 516 of the insulating unit 546 as the sixth layer. In one example, the multiple wiring layers 70 can also be, for example, disposed on the first nitride insulating layer 515 of the insulating unit 545 of the fifth layer. In one example, the multiple wiring layers 70 can also be, for example, disposed on the second nitride insulating layer 524 or the first nitride insulating layer 514 of the insulating unit 544 as the fourth layer. Moreover, in one example, the multiple wiring layers 70 can be disposed on a same position as the semiconductor resistive layers 20 in the Z direction, or can be disposed on a position closer to the passivation film 43 than the semiconductor resistive layers 20.

Each of the wiring layers 70 is formed in a flat shape with the Z direction set as a thickness direction. A thickness of the wiring layer 70 is less than a width of the wiring layer 70 (a length in a direction orthogonal to an extension direction of the wiring layer 70 in the plan view). The thickness of the wiring layer 70 is greater than the thickness of the semiconductor resistive layer 20. In the example shown in FIG. 6, the thickness of the wiring layer 70 is greater than the thickness of the second nitride insulating layer 52. The thickness of the wiring layer 70 is greater than the thickness of the first nitride insulating layer 51. The thickness of the wiring layer 70 can also be greater than the thickness of the first nitride insulating layer 51. On the other hand, the thickness of the wiring layer 70 is less than the thickness of the oxide film 53. The wiring layers 70 are formed of one or more materials appropriately selected from Ti, TiN, Ta, TaN, Au, Ag, Cu, Al and W. In the first embodiment, the wiring layers 70 is formed of an Al-containing material.

In the example shown in FIG. 6, different from the wirings 21 to 25 shown in FIG. 3, the wiring layers 70 electrically connected two adjacent semiconductor resistive layers 20 in the Y direction. More specifically, the wiring layers 70 are formed to overlap both of the semiconductor resistive layers 20. Each semiconductor resistive layer 20 is connected to the wiring layers 70 through two vias 80. Each via 80 extends in the Z direction that is also a thickness direction of the element insulating layer 40. The vias 80 are formed of one or more materials appropriately selected from Ti, TiN, Ta, TaN, Au, Ag, Cu, Al and W. In the first embodiment, the vias 80 are formed of a W-containing material. Moreover, the number of the vias 80 can be modified as desired.

As shown in FIG. 7, the terminal P1 formed on the element front surface 41 of the element insulating layer 40 is electrically connected to the wiring layer 70 (the wiring 21 in FIG. 3) through a via 81. It can be said that the terminal P1 is formed on the front-side insulating layer 60. Moreover, although not shown, the terminals P2 to P5 are similarly individually electrically connected to the wiring layers 70 (the wirings 22 to 25 in FIG. 3) through the via 81.

The via 81 passes through the front-side insulating layer 60 in the Z direction, so as to be contact with the terminal P1 (the terminals P2 to P5) and the wiring layer(s) 70. The via 81 is formed of, for example, a same material as the vias 80.

Manufacturing Method of First Chip

Referring to FIG. 8 to FIG. 17, a manufacturing method of the first chip according to the first embodiment is to be described in brief below.

The manufacturing method of the first chip 14 primarily includes: preparing a semiconductor substrate 830, forming a substrate-side insulating layer 850, forming the wiring layers 70, forming a front-side insulating layer 860, forming the vias 80, forming the semiconductor resistive layers 20, implementing an annealing process, forming the via 81, forming the terminals P1 to P5, forming a passivation film 843, and forming single chips.

Figure 8:
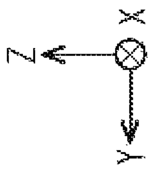
FIG. 8 is a brief section diagram of an example of a manufacturing step for the first chip according to a first embodiment.
Figure 8:
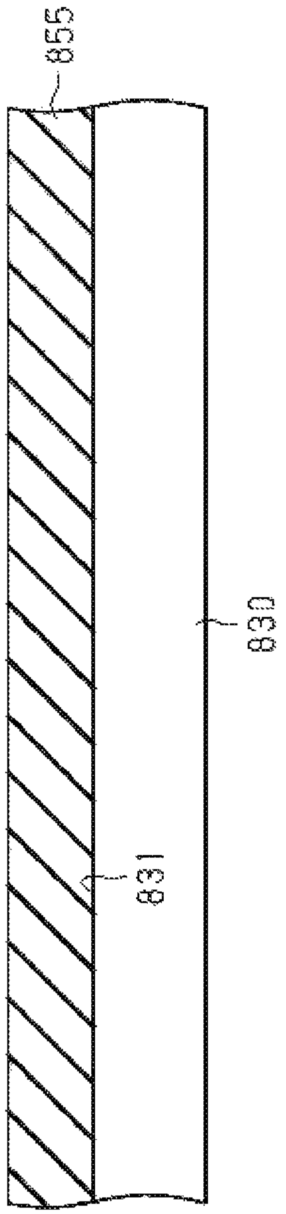

As shown in FIG. 8, in step of preparing the semiconductor substrate 830, a Si substrate, that is, the semiconductor substrate 830, is prepared. The semiconductor substrate 830 is a component that forms the semiconductor substrate 30, and is, for example, semiconductor wafer. Herein, the semiconductor substrate 830 is formed to include multiple semiconductor substrates 30.

Next, the step of forming the substrate-side insulating layer 850 is implemented. The step of forming the substrate-side insulating layer 850 includes a step of forming a lower layer oxide film 855 and a step of forming an insulating unit 854.

As shown in FIG. 8, in step of forming the lower layer oxide film 855, the lower layer oxide film 855 is formed on the semiconductor substrate 830 by means of, for example, CVD. The lower layer oxide film 855 is a layer forming the lower layer oxide film 55. The lower layer oxide film 855 is formed of, for example, a $SiO_2$-containing material. The lower layer oxide film 855 is, for example, formed through an entirety of a substrate front surface 831 of the semiconductor substrate 830. Moreover, the lower layer oxide film 55 is formed on the semiconductor substrate 830 by means of, for example, thermal oxidation. In this case, the lower layer oxide film 855 is formed of a thermal oxide film. Herein, the lower layer oxide film 855 corresponds to "a first oxide film". That is to say, the step of forming the lower layer oxide film 855 corresponds to "a step of forming a first oxide film on the semiconductor substrate 830".

Figure 9:
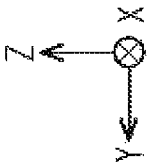
FIG. 9 is a brief section diagram of a manufacturing step following FIG. 8.
Figure 9:
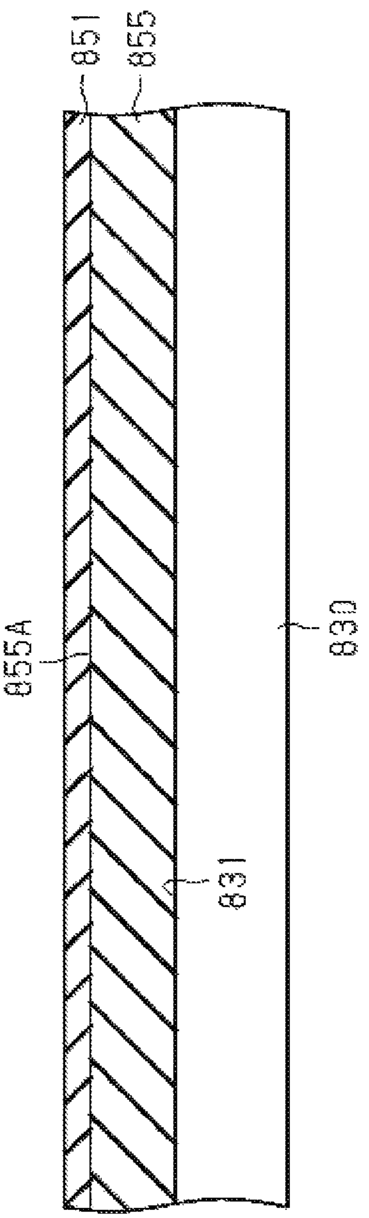
Figure 10:
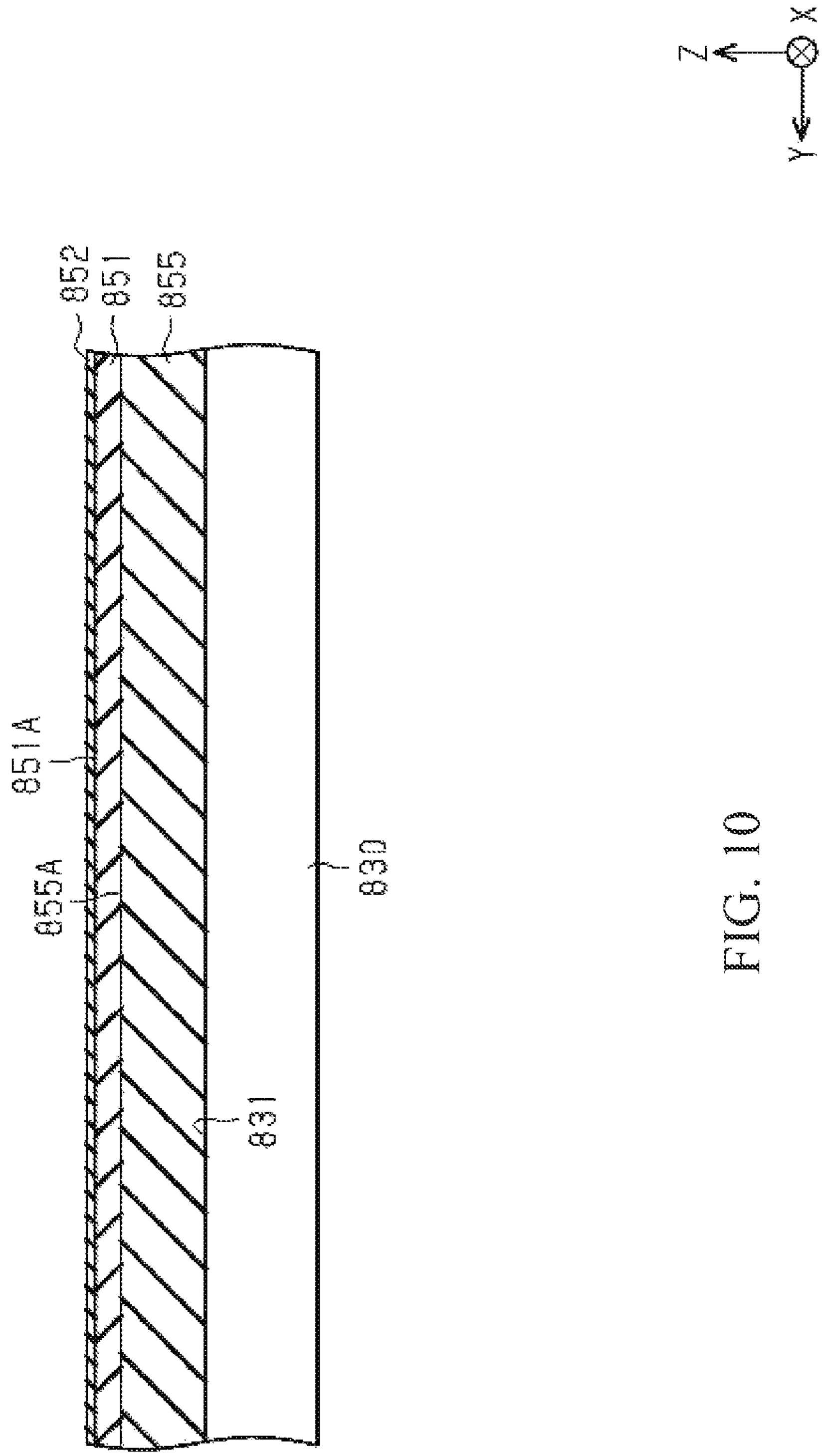
FIG. 10 is a brief section diagram of a manufacturing step following FIG. 9.
Figure 11:
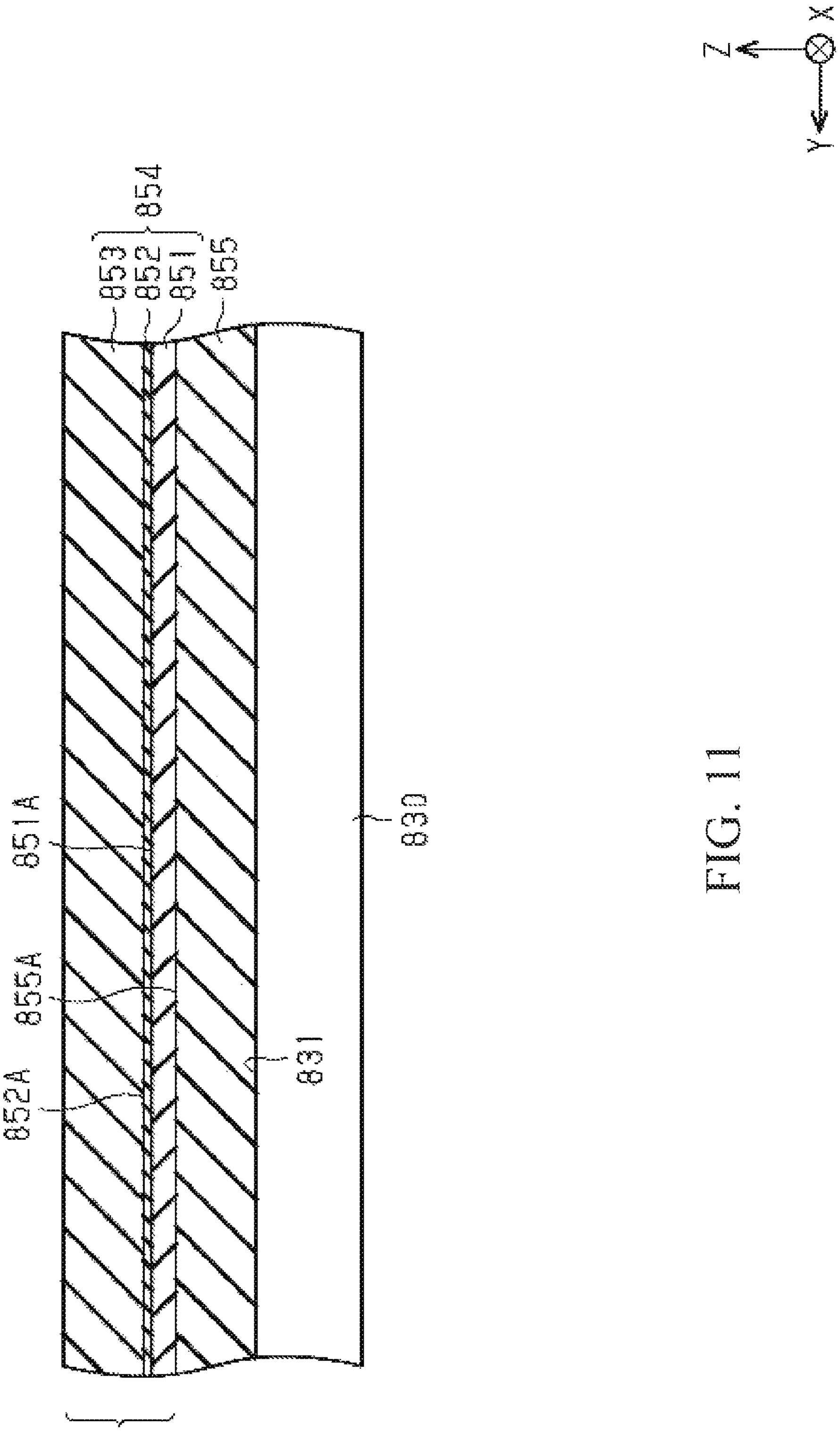
FIG. 11 is a brief section diagram of a manufacturing step following FIG. 10.

Next, as shown in FIG. 9 to FIG. 11, the step of forming the insulating unit 854 includes a step of forming a first nitride insulating layer 851, a step of forming a second nitride insulating layer 852, and a step of forming an oxide film 853.

As shown in FIG. 9, in the step of forming the first nitride insulating layer 851, the first nitride insulating layer 851 is formed on the lower layer oxide film 855 by means of, for example, plasma CVD. The first nitride insulating layer 851 is a layer forming the first nitride insulating layer 51, and is formed of, for example, a SiN-containing material. More specifically, the first nitride insulating layer 851 is formed throughout an entirety of an upper surface 855A of the lower layer oxide film 855. In one example, in plasma CVD in the step of forming the first nitride insulating layer 851, an amount of supply of an impurity-containing gas in plasma CVD is adjusted such that the first nitride insulating layer 851 has tensile stress. Herein, the step of forming the first nitride insulating layer 851 corresponds to "a step of forming a first nitride insulating layer on the first oxide film".

As shown in FIG. 10, in the step of forming the second nitride insulating layer 852, the second nitride insulating layer 852 is formed on the first nitride insulating layer 851 by means of, for example, plasma CVD. The second nitride insulating layer 852 is a layer forming the second nitride insulating layer 52, and is formed of, for example, a SiN-containing material. More specifically, the second nitride insulating layer 852 is formed throughout an entirety of an upper surface 851A of the first nitride insulating layer 851. In one example, in plasma CVD in the step of forming the second nitride insulating layer 852, an amount of supply of an impurity-containing gas in plasma CVD is adjusted such that the second nitride insulating layer 852 has tensile stress. In one example, in plasma CVD in the step of forming the second nitride insulating layer 852, conditions such as film forming temperature and silane gas flow rate are set such that the second nitride insulating layer 852 has a film density higher than a film density of the first nitride insulating layer 851. Herein, the step of forming the second nitride insulating layer 852 corresponds to "a step of forming a second nitride insulating layer on the first nitride insulating layer".

As shown in FIG. 11, in the step of forming the oxide film 853, the oxide film 853 is formed on the second nitride insulating layer 852 by means of, for example, plasma CVD. The oxide film 853 is a layer forming the oxide film 53, and is formed of, for example, a $SiO_2$-containing material. The oxide film 853 is formed throughout an entirety of an upper surface 852A of the second nitride insulating layer 852. With the steps above, the insulating unit 854 as a second layer is formed. Herein, the oxide film 853 corresponds to "a second oxide film". Moreover, the step of forming the oxide film 853 corresponds to "a step of forming a second oxide film on the second nitride insulating layer".

Figure 12:
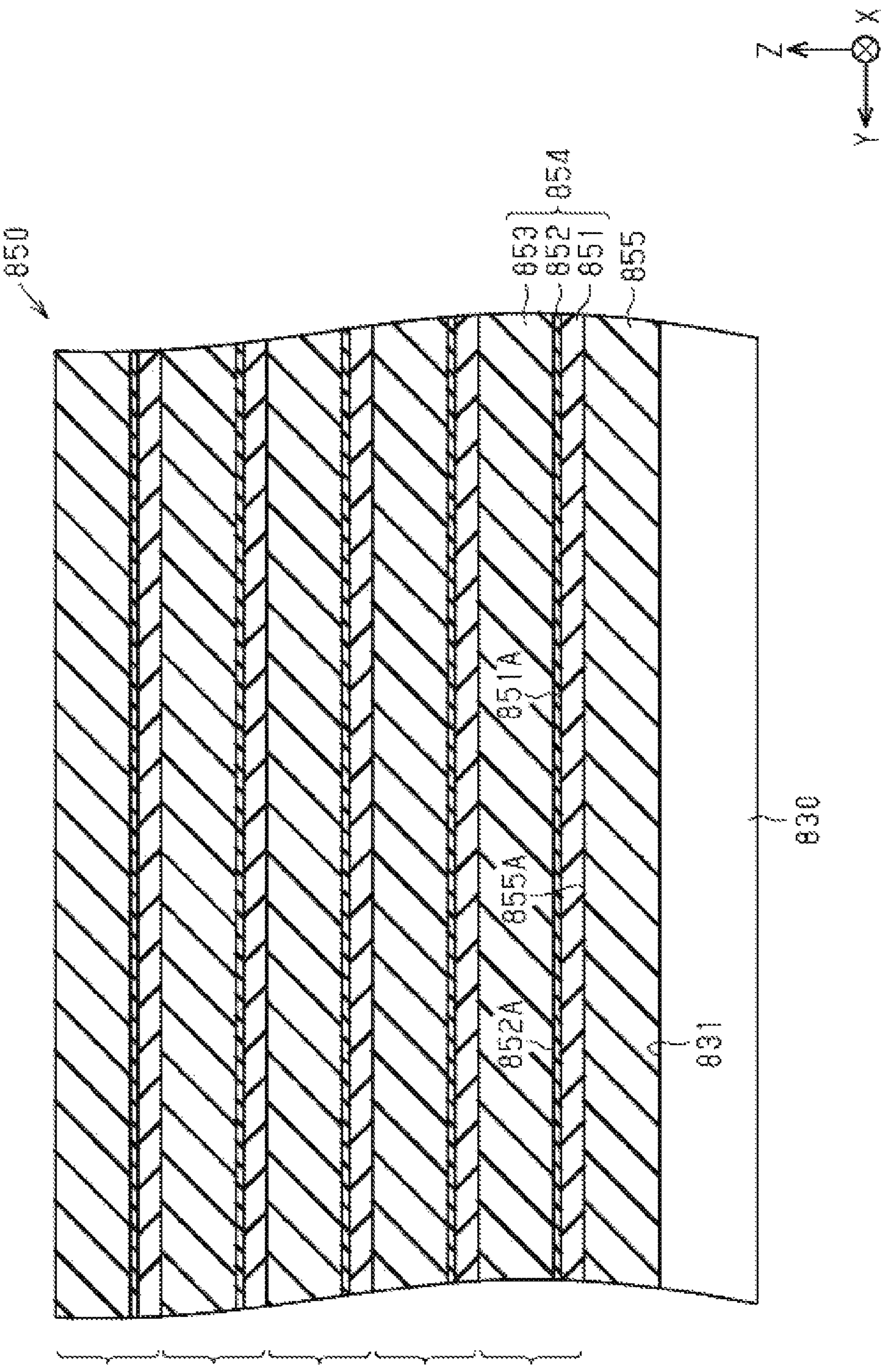
FIG. 12 is a brief section diagram of a manufacturing step following FIG. 11.

Next, as shown in FIG. 12, the step of forming the insulating unit 854 includes a step of laminating the insulating units 854. Herein, the insulating units 854 as a third layer to a sixth layer are sequentially laminated. The method for forming the insulating units 854 as the third layer to the sixth layer are the same as the method for forming the insulating unit 854 as the second layer.

Figure 13:
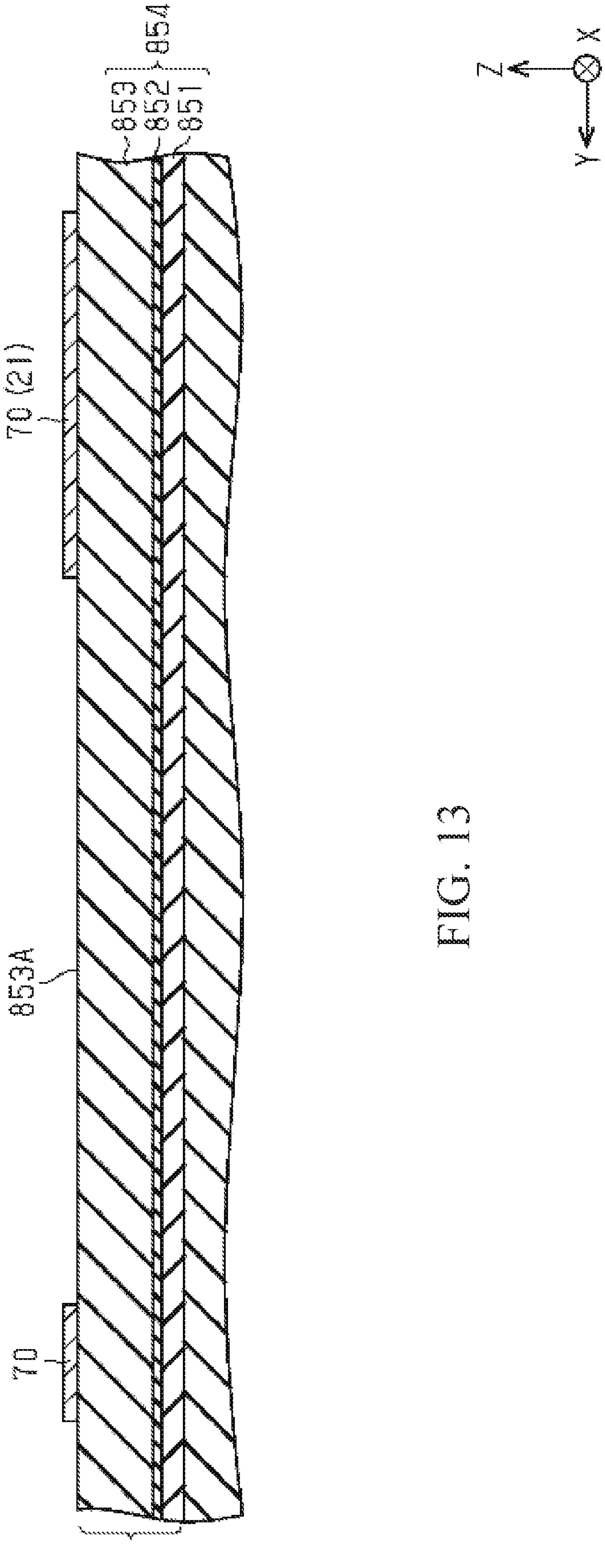
FIG. 13 is a brief section diagram of a manufacturing step following FIG. 12.

As shown in FIG. 13, the step of forming the wiring layers 70 is implemented after the step of laminating the insulating units 854. In the step of forming the wiring layers 70, the wiring layers 70 are formed on the oxide film 853 of the insulating unit 854 as the sixth layer.

In the step of forming the wiring layers 70, first of all, a metal film (omitted from the drawing) which is a material film forming the wiring layers 70 is formed on an entirety of the upper surface 853A of the oxide film 853. The metal film is formed of one or more materials appropriately selected from Ti, TiN, Ta, TaN, Au, Ag, Cu, Al and W. Next, by means of, for example, photolithography and etching, the metal film is patterned to form the wiring layers 70.

Figure 14:
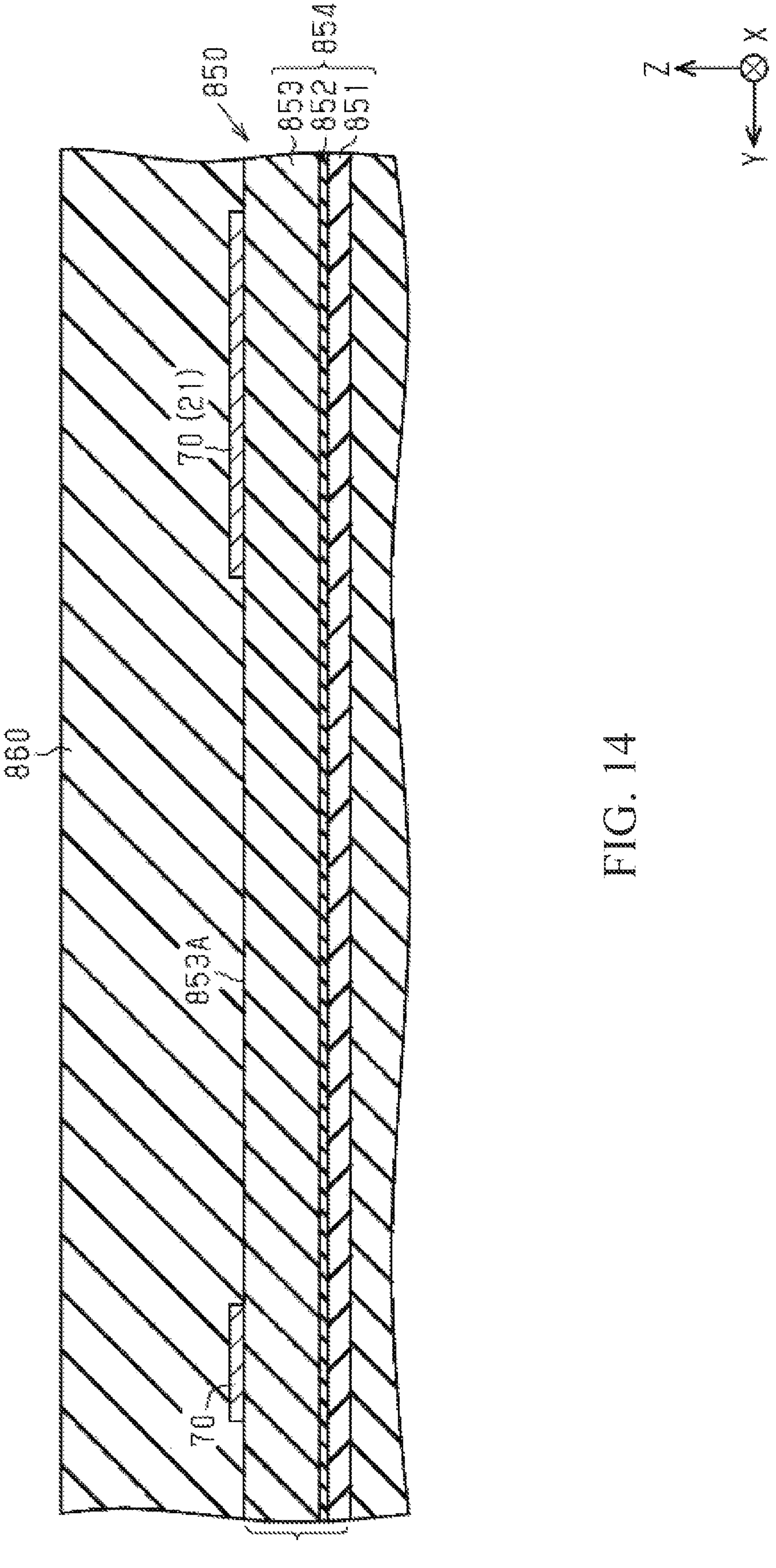
FIG. 14 is a brief section diagram of a manufacturing step following FIG. 13.

As shown in FIG. 14, in the step of forming the front-side insulating layer 852, the front-side insulating layer 852 is formed on the substrate-side insulating layer 850 by means of, for example, plasma CVD. The front-side insulating layer 860 shown in FIG. 14 is a layer forming a portion of the front-side insulating layer 60 in the thickness direction, and is formed throughout an entirety of an upper surface (an upper surface 853A of the oxide film 853 of the insulating unit 854 as the sixth layer) of the substrate-side insulating layer 850. Accordingly, the wiring layers 70 are covered by the front-side insulating layer 860. A thickness of the front-side insulating layer 860 shown in FIG. 14 is less than the thickness of the front-side insulating layer 60. The front-side insulating layer 860 is formed of, for example, a $SiO_2$-containing material.

Figure 15:
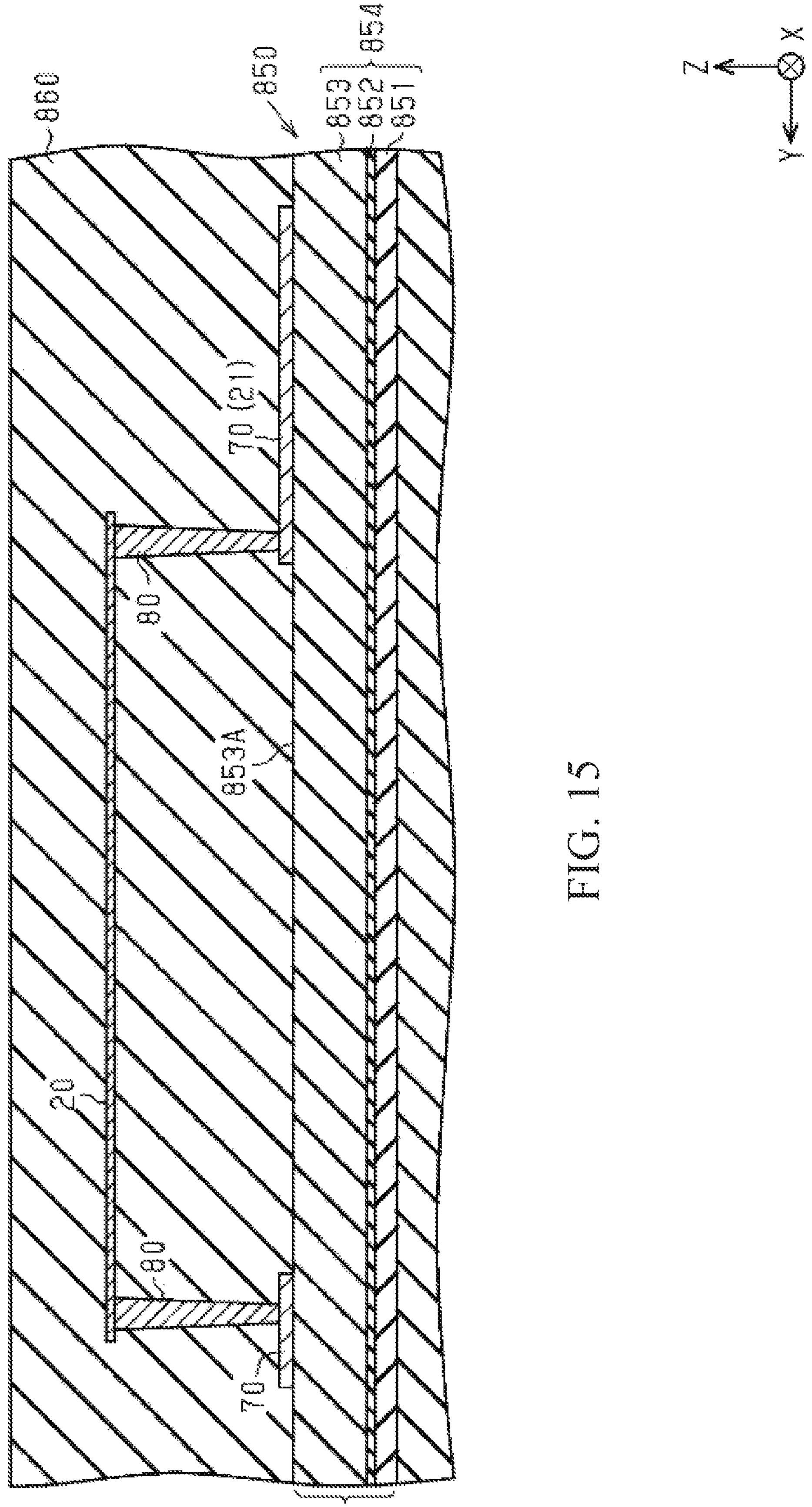
FIG. 15 is a brief section diagram of a manufacturing step following FIG. 14.

As shown in FIG. 15, the step of forming the vias 80 first forms a via opening portion by means of, for example, etching. The via opening portion passes through the front-side insulating layer 860 in the Z direction, and at the same time exposes a portion of the wiring layers 70. Next, by means of sputtering for example, the via opening portion is filled with a metal material. The metal material is one or more materials appropriately selected from Ti, TiN, Ta, TaN, Au, Ag, Cu, Al and W. Accordingly, the vias 80 are formed.

As shown in FIG. 15, the step of forming the semiconductor resistive layer 20 is implemented after the step of laminating the vias 80. In the step of forming the semiconductor resistive layer 20, a resistive material film which is a material film forming the semiconductor resistive layer 20 is formed on the front-side insulating layer 860 shown in FIG. 14. More specifically, the resistive material film is formed on an upper surface of the front-side insulating layer 860 shown in FIG. 14. The resistive material film is formed throughout an entirety of the upper surface of the front-side insulating layer 860 shown in FIG. 14. Next, by means of, for example, photolithography and etching, the resistive material film is patterned to form the semiconductor resistive layer 20. Accordingly, upper ends of the vias 80 are connected to the semiconductor resistive layer 20.

Next, the step of implementing an annealing process is, for example, implementing an annealing process aimed to crystallize the semiconductor resistive layer 20, for a period of 1 minute or more and 600 minutes or less at a temperature of 300° C. and 700° C. or less.

Next, as shown in FIG. 15, the step for forming the front-side insulating layer 860 is again implemented. In the step, similar to the front-side insulating layer 860 in FIG. 14, the front-side insulating layer 860 is formed on the front-side insulating layer 860 by means of, for example, plasma CVD. Accordingly, a thickness of the front-side insulating layer 860 is equal to the thickness of the front-side insulating layer 60. With the steps above, the element insulating layer 840 is formed. Moreover, the semiconductor resistive layer 20 is covered by the front-side insulating layer 860. The front-side insulating layer 860 laminated on the front-side insulating layer 860 in FIG. 14 is formed of, for example, a $SiO_2$-containing material. In one example, the front-side insulating layer 860 in FIG. 14 and the front-side insulating layer 860 laminated on the front-side insulating layer 860 in FIG. 14 are formed of the same material. Thus, no interface is formed between the front-side insulating layer 860 in FIG. 14 and the front-side insulating layer 860 laminated on the front-side insulating layer 860 in FIG. 14.

Figure 16:
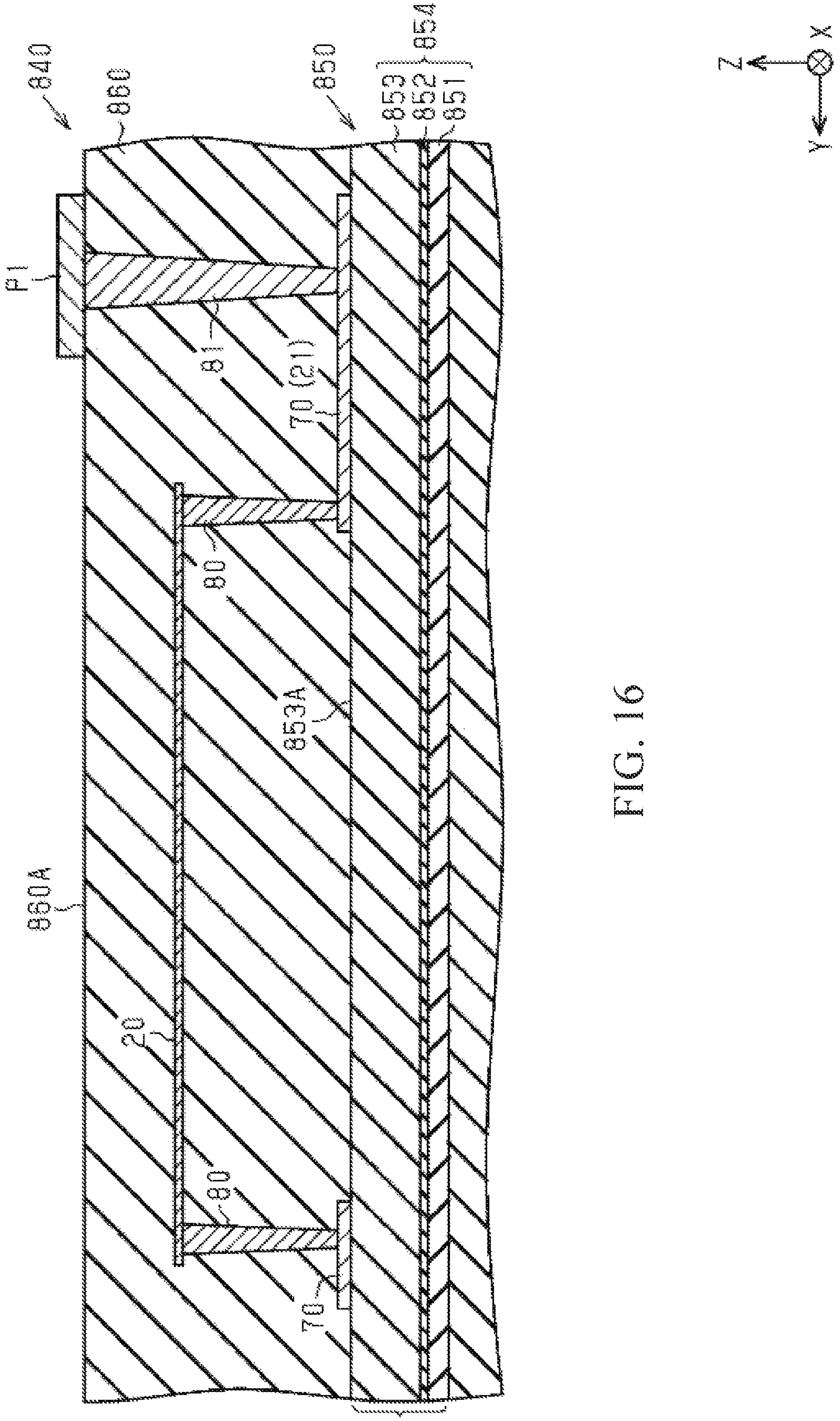
FIG. 16 is a brief section diagram of a manufacturing step following FIG. 15.

Next, as shown in FIG. 16, in the step of forming the via 81, a via opening portion is first formed by means of, for example, etching. The via opening portion passes through the front-side insulating layer 860 in the Z direction, and at the same time exposes a portion of the wiring layers 70. Next, by means of sputtering for example, the via opening portion is filled with a metal material. The metal material used is, for example, a same material as the metal material forming the vias 80. Accordingly, the vias 81 are formed.

Next, as shown in FIG. 16, in the step of forming the wiring P1 to P5, first of all, a metal film (omitted from the drawing) which is a material film forming the terminals P1 to P5 is formed on an entirety of an upper surface 860A of the front-side insulating layer 860 by means of, for example, sputtering. The metal film is formed of one or more materials appropriately selected from Ti, TiN, Ta, TaN, Au, Ag, Cu, Al, Ni, Pd and W. Next, by means of, for example, photolithography and etching, the metal film is patterned to form the terminals P1 to P5. Moreover, in FIG. 16, for the sake of convenience, only the terminal P1 among the terminals P1 to P5 is depicted.

Figure 17:
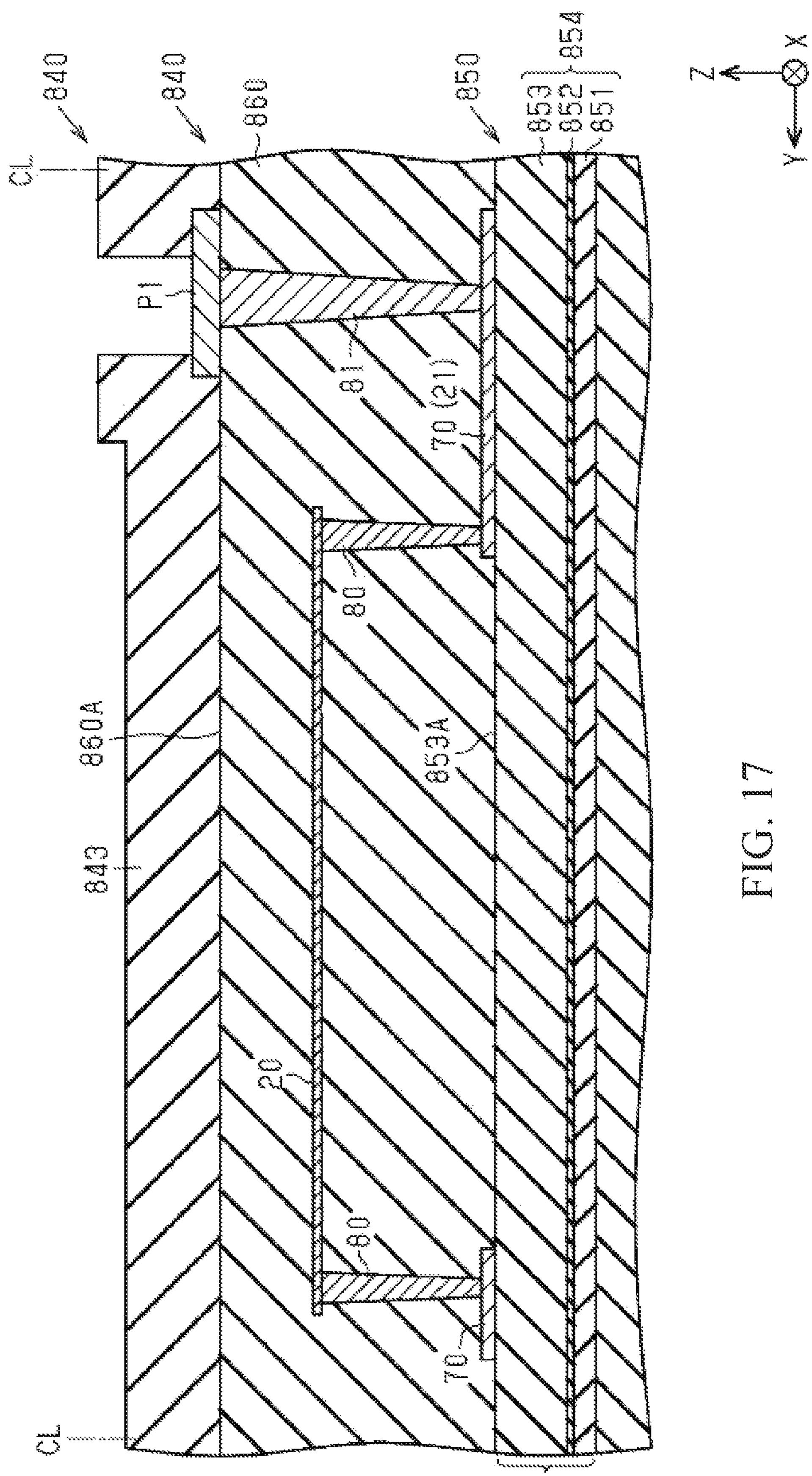
FIG. 17 is a brief section diagram of a manufacturing step following FIG. 16.
Figure 18:
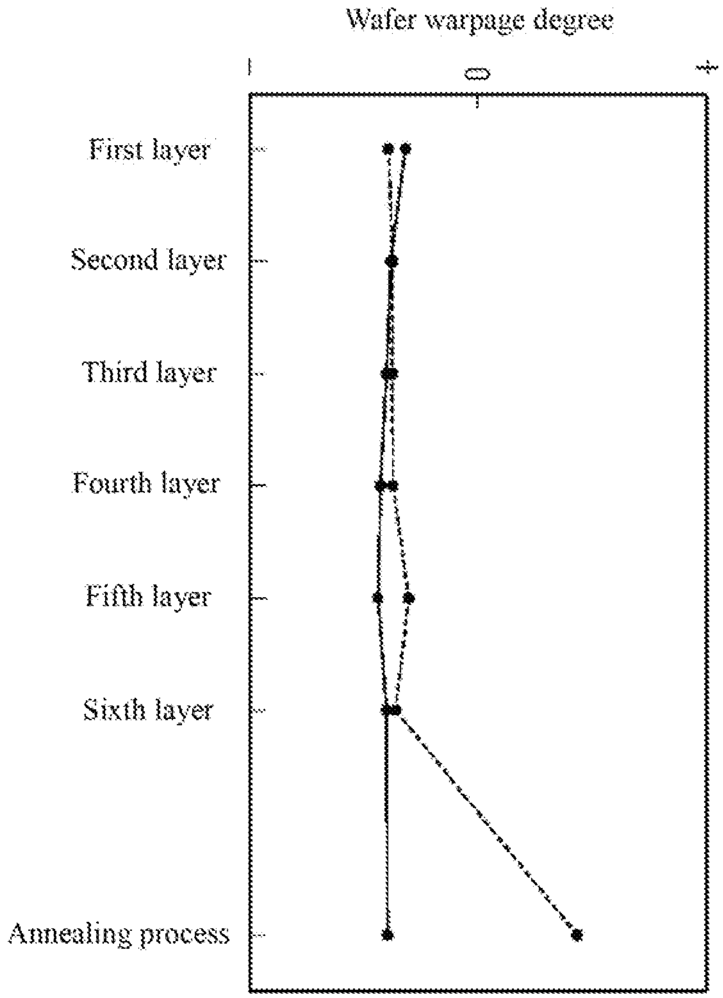
FIG. 18 is a table indicating a relation between a manufacturing process of the first chip and warpage of a semiconductor substrate.

Next, as shown in FIG. 17, in the step of forming the passivation film 843, first of all, a passivation material film which is a material film forming the passivation film 843 is formed on the upper surface 860A of the front-side insulating layer 860 and the terminals P1 to P5. Next, by means of, for example, etching, a portion of the part of the passivation material film covering the terminals P1 to P5 is removed. That is to say, a portion of the terminals P1 to P5 is exposed from the passivation material film. Accordingly, the passivation film 843 is formed. The passivation film 843 is a film forming the passivation film 43, and is formed of, for example, a SiN-containing material.

Next, in the step of forming single chips, for example, a blade is used to cut off the passivation film 843, the front-side insulating film 860, the substrate-side insulating layer 850 and the semiconductor substrate 830 along a cutting line CL in FIG. 17. Accordingly, the passivation film 43, the front-side insulating layer 60, the element insulating layer 40 and the semiconductor substrate 30 are formed. With the steps above, the first chip 14 is manufactured.

Effects

Effects of the semiconductor module 10 according to the first embodiment are described below.

In the description below, a first chip alternately laminated with the first nitride insulating layer 51 and the substrate-side insulating layer of the oxide film 53 is set as "a comparison chip". Herein, the comparison chip has an insulating unit consisting of the first nitride insulating layer 51 and the oxide film 53, and on the other hand, each insulating unit does not include the second nitride insulating layer 52. The substrate-side insulating layer of the comparison chip includes the lower oxide layer 55 that becomes a first layer, and insulating units that become a second layer to a sixth layer. Moreover, during a manufacturing process of the comparison chip, the first oxide insulating layer is "the first nitride insulating layer 851" and the oxide film is "the oxide film 853".

FIG. 18 shows a table indicating a change in warpage of semiconductor wafer (the semiconductor substrate 830) during manufacturing processes of the first chip 14 and the comparison chip. The solid line in FIG. 18 indicates a change in warpage of the semiconductor wafer during the manufacturing process of the first chip 14, and the dotted line in FIG. 18 indicates a change in warpage of the semiconductor wafer during the manufacturing process of the comparison chip. FIG. 18 shows warpage of the semiconductor wafer caused by manufacturing and annealing processes of the insulating units as the first to sixth layers of the substrate-side insulating layer. In FIG. 18, the warpage of the semiconductor wafer is represented as "wafer warpage". In one example, in FIG. 18, a state of the semiconductor wafer before the substrate-side insulating layer is formed is set as substrate warpage ("0"). Moreover, the warpage in a positive direction indicates warpage of the semiconductor wafer when a center of the semiconductor wafer protrudes downward. The warpage in the positive direction indicates warpage of the semiconductor wafer when an outer edge of the semiconductor wafer protrudes warps upward. The warpage in a negative direction indicates warpage of the semiconductor wafer when a center of the semiconductor wafer protrudes upward.

In the comparison chip, when an annealing process is implemented while the semiconductor resistive layer 20 is formed on the substrate-side insulating layer, as indicated by the dotted line in FIG. 18, the warpage in the positive direction increases. After the annealing process, the safer warpage in the positive direction becomes overly large.

The following can be considered as reasons causing such increase in the wafer warpage in the positive direction. That is to say, with the annealing process, gas on the inside the oxide film 853 moves to the outside of the oxide film 853. Since the film density of the first nitride insulating layer 851 is lower, the gas from the oxide film 853 passes through the first nitride insulating layer 851. As a result, the gas in the oxide film 853 decreases in a way that the warpage of the oxide film 853 increases. On the other hand, warping of the first nitride insulating layer 851 that warps in a direction opposite to that of the oxide film 853 and thus cancels out with the warping of the oxide film 853. However, because the warpage of the oxide film 853 is greater than the warpage of the first nitride insulating layer 851, the wafer warpage in the positive direction increases as a result.

In the first chip 14 according to the first embodiment, the substrate-side insulating layer 50 includes the first nitride insulating layer 51, the second nitride insulating layer 52 and the oxide film 53. The second nitride insulating layer 52 has a film density higher than the film density of the first nitride insulating layer 51. Accordingly, during the annealing process of the manufacturing process of the first chip 14, since the second nitride insulating layer 852 hinders the gas from moving from the oxide film 853, it is unlikely for the gas to leak out from the oxide film 853. Accordingly, a change in stress in the oxide film 853 is inhibited. As a result, as shown in FIG. 18, during the annealing process, the wafer warpage is at a same degree as the wafer warpage caused by forming of the substrate-side insulating layer 50. Accordingly, compared to the comparison chip, warpage of semiconductor wafer can be reduced.

Moreover, in the manufacturing step of the substrate-side insulating layer of the comparison chip, after the first nitride insulating film 851 is formed, heating is performed up to approximately 400° C. while the oxide film 853 is formed by means of plasma CVD, for example. At this point, since the first nitride insulating layer 851 has a lower fracture toughness and a larger coefficient of thermal expansion, cracking may occur in the first nitride insulating layer 851. Due to tensile stress produced from heat received by the first nitride insulating layer 851, cracking occurs from the upper surface 851A of the first nitride insulating layer 851 toward the oxide film 853.

In the first chip 14 according to the first embodiment, each insulating unit 54 of the substrate-side insulating layer 50 including the second nitride insulating layer 52 has a greater fracture toughness than the fracture toughness of the first nitride insulating layer 51. The second nitride insulating layer 52 is provided on the first nitride insulating layer 51. Thus, during the manufacturing process of the first chip 14, even if the temperature is heated up to 400° C. while the oxide film 853 is formed, cracking in the first nitride insulating layer 851 can still be inhibited by means of protecting the first nitride insulating layer 851 with the second nitride insulating layer 852 having a high fracture toughness.

Effects

The semiconductor module 10 according to the first embodiment achieves the following effects.

(1-1) The first chip 14, which is an example of the semiconductor device, includes the semiconductor substrate 30, and the substrate-side insulating layer 50 disposed on the semiconductor substrate 30. The substrate-side insulating layer 50 includes the oxide film 532 of the insulating layer 542 as the second layer, the oxide film 533 of the insulating unit 543 as the third layer arranged separated from the oxide film 53, and the first nitride insulating layer 513 and the second nitride insulating layer 523 disposed between the oxide film 532 and the oxide film 533. The second nitride insulating layer 523 has a film density higher than the film density of the first nitride insulating layer 513.

According to the configuration above, for example, when an annealing process is implemented on the substrate-side insulating layer 50, the second nitride insulating layer 523 (852) having a high film density inhibits movement of gas caused by the annealing process from the oxide film 532 (832). Thus, it is unlikely for gas to leak out from the oxide film 532 (853), so that warpage of the oxide film 532 (853) is reduced. Therefore, in the manufacturing process of the first chip 14, warpage of semiconductor wafer forming the semiconductor substrate 30 can be reduced.

(1-2) The second nitride insulating layer 52 is provided on the first nitride insulating layer 51. The second nitride insulating layer 52 has a fracture toughness higher than a fracture toughness of the first nitride insulating layer 51.

According to the configuration above, since the second nitride insulating layer 52 protects the first nitride insulating layer 51, cracking is inhibited from occurring in the first nitride insulating layer 51.

(1-3) The second nitride insulating layer 52 has a thickness less than the thickness of the first nitride insulating layer 51.

According to the configuration above, the thickness of the substrate-side insulating layer 50 can be reduced, and so height reduction of the first chip 14 can be achieved.

(1-4) The substrate-side insulating layer 50 is formed by means of laminating multiple insulating units 54 including the first nitride insulating layer 51, the second nitride insulating layer 52 and the oxide film 53.

According to the configuration above, each insulating unit 54 is capable of inhibiting cracking from occurring in the first nitride insulating layer 51 by using the nitride insulating layer 52.

Second Embodiment

Referring to FIG. 19 to FIG. 22, a semiconductor module 10 according to the second embodiment is described below.

Compared to the semiconductor module 10 of the first embodiment, the semiconductor module 10 of the second embodiment primarily differs in the respect of the configuration of the substrate-side insulating layer 50 of the first chip 14. In the description below, details different from those of the first embodiment are described, and constituting elements common with those of the first embodiment are represented by the same numerals and symbols and associated details thereof omitted for brevity.

Figure 19:
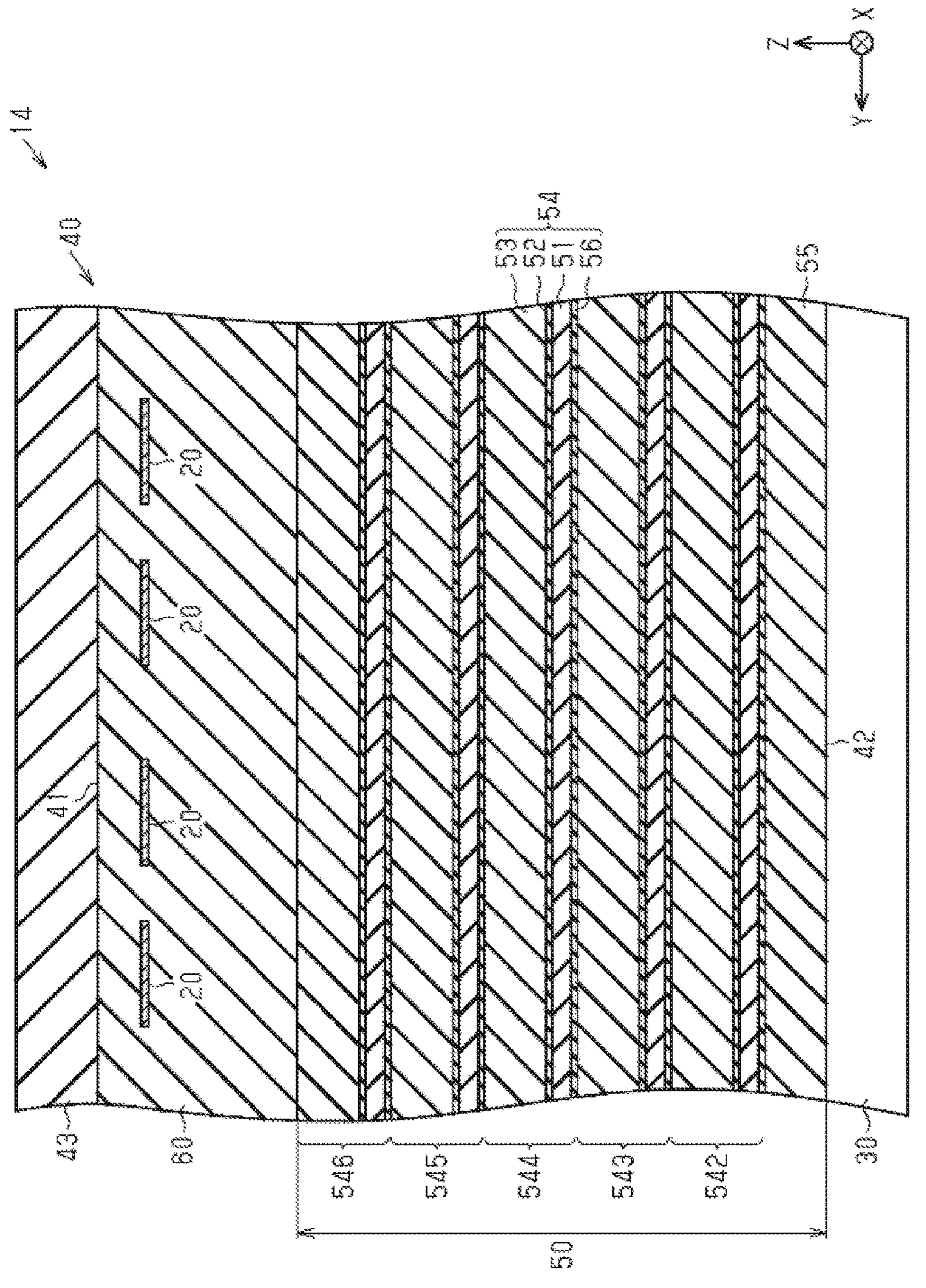
FIG. 19 is a brief section diagram of the semiconductor resistive layers and peripherals of the first chip in a semiconductor module according to a second embodiment.

As shown in FIG. 19, in the second embodiment, the substrate-side insulating layer 50 is formed by means of laminating multiple (five in the second embodiment) insulating units 54. In the second embodiment, the substrate-side insulating layer 50 includes: the lower layer oxide film 55 as a first layer, disposed on the semiconductor substrate 30 to be in contact with the semiconductor substrate 30; and the insulating units 542 to 546, disposed on the lower layer oxide film 55, forming a second layer to a sixth layer. Moreover, "the insulating unit 54" is used in the description irrelevant from the order of the layers.

Figure 20:
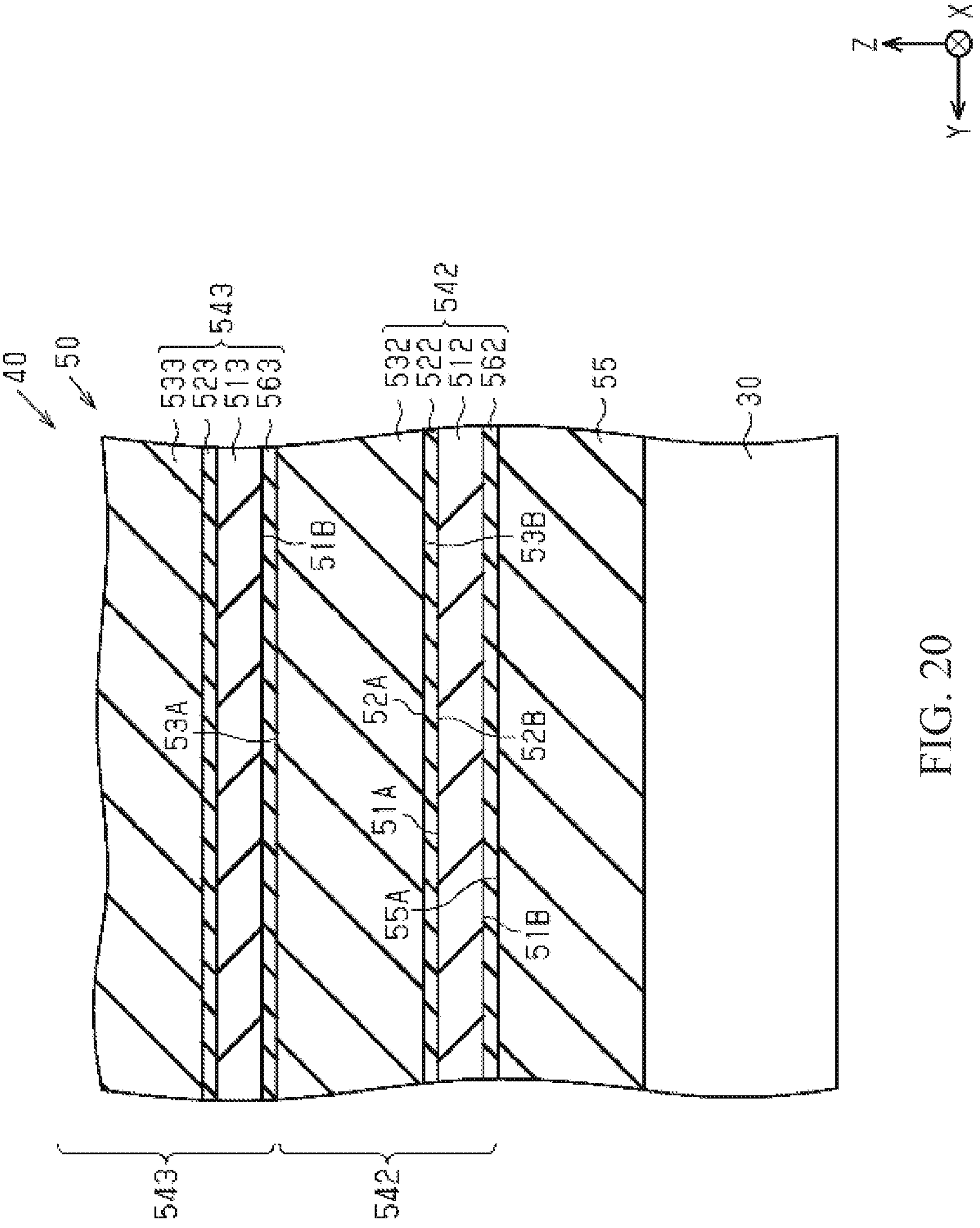
FIG. 20 is an enlarged section diagram of a part of a substrate-side insulating layer in FIG. 19.

As shown in FIG. 19 and FIG. 20, the insulating unit 54 of the first chip 14 in the semiconductor module 10 of the second embodiment further includes a third nitride insulating layer 56. As shown in FIG. 20, the third nitride insulating layer 55 is in contact with the lower surface 51B of the first nitride insulating layer 51. That is to say, in the second embodiment, the insulating unit 56 includes the third nitride insulating layer 56, the first nitride insulating layer 51 disposed on the third nitride insulating layer 56, the second nitride insulating layer 52 disposed on the first nitride insulating layer 51, and the oxide film 53 disposed on the second nitride insulating layer 52. Moreover, the laminated structure of the first nitride insulating layer 51, the second nitride insulating layer 52 and the oxide film 53 are the same as that of the first embodiment.

In the description below, for the constituting elements of the insulating unit 54, that is, the first nitride insulating layer 51, the second nitride insulating layer 52 and the oxide film 53, one digit of these numerals is expressed in accordance with the order of the layers.

As shown in FIG. 20, in the second embodiment, the third nitride insulating layer 562 of the insulating unit 542 as the second layer is in contact with the lower layer oxide film 55. The first nitride insulating layer 512, the second nitride insulating layer 522 and the third nitride insulating layer 562 of the insulating unit 542 as the second layer are interposed between the lower layer oxide film 55 and the oxide film 532 in the Z direction. Thus, in the insulating unit 542, the lower layer oxide film 55 corresponds to "a first oxide film", and the oxide film 532 corresponds to "a second oxide film".

The third nitride insulating layer 563 of the insulating unit 543 as the third layer is in contact with the upper surface 53A of the oxide film 532 of the insulating unit 542 as the second layer. The first nitride insulating layer 513, the second nitride insulating layer 523 and the third nitride insulating layer 563 of the insulating unit 543 as the third layer are interposed between the oxide film 532 and the oxide film 533 in the Z direction. Herein, in the insulating unit 543, the oxide film 532 corresponds to "a first oxide film", and the oxide film 533 corresponds to "a second oxide film".

The method for forming the insulating units 544 to 546 as the third layer to the sixth layer are the same as the method for forming the insulating units 542 and 543. Thus, in the insulating units 544 to 546 as the fourth layer to the sixth layer, the oxide films 533 5o 535 of the insulating units 543 to 545 as the third layer to the fifth layer correspond to "first oxide layers", and the oxide films 534 to 536 of the insulating units 544 to 546 as the fourth layer to the sixth layer correspond to "second oxide films".

Next, the constituting element of the insulating unit 54, that is, the third nitride insulating layer 56, is described below. In the description below, since the insulating units 542 to 546 as the second layer to the sixth layer are common, for the third nitride insulating layer 56, the same numeral is directly used to express one digit of the numeral instead of with accordance with an order of these layers.

The third nitride insulating layer 56 is formed of a SiN-containing, SiCN-containing or SiON-containing material. In the second embodiment, the third nitride insulating layer 56 is formed of a SiN-containing material. That is to say, in the second embodiment, the first nitride insulating layer 51, the second nitride insulating layer 52 and the third nitride insulating layer 56 are formed of the same material. Thus, the third nitride insulating layer 56 has a coefficient of thermal expansion larger than the coefficient of thermal expansion of the oxide film 53.

The third nitride insulating layer 56 is a film having same stress as the oxide film 53. In other words, the third nitride insulating layer 56 is a film having the same stress as the second nitride insulating layer 52. That is to say, the third nitride insulating layer 56 is a film having opposite stress to the first nitride insulating layer 51. The third nitride insulating layer 56 is, for example, an insulating layer with compressive stress. Thus, the third nitride insulating layer 56 is configured to generate thermal stress in a direction same as a direction in which thermal stress occurs in the oxide film 53. In other words, the third nitride insulating layer 56 is configured to generate thermal stress in a direction same as a direction in which thermal stress occurs in the second nitride insulating layer 52. That is to say, the third nitride insulating layer 56 is configured to generate thermal stress in a direction opposite to a direction in which thermal stress occurs in the first nitride insulating layer 51.

The third nitride insulating layer 56 is formed by means of, for example, plasma CVD. The third nitride insulating layer 56, similar to the second nitride insulating layer 52, is formed by means controlling an amount of supply of an impurity-containing gas in plasma CVD so as to have compressive stress. Thus, the third nitride insulating layer 56 has a coefficient of thermal expansion smaller than the coefficient of thermal expansion of the first nitride insulating layer 51. In other words, the third nitride insulating layer 56 has a coefficient of thermal expansion between the coefficients of thermal expansion of the oxide layer 53 and the first nitride insulating layer 51. It can be said that the third nitride insulating layer 56 has a coefficient of thermal expansion the same as the coefficient of thermal expansion of the second nitride insulating layer 52.

The third nitride insulating layer 56 has a film density higher than the film density of the first nitride insulating layer 51. The third nitride insulating layer 56 has a film density higher than the film density of the oxide film 53. In one example, the third nitride insulating layer 56 has a film density higher than the film density of the second nitride insulating layer 52. The film density can be modified based on conditions such as plasma CVD film forming temperature and silane gas flow rate. Moreover, the third nitride insulating layer 56 has a fracture toughness higher than a fracture toughness of the first nitride insulating layer 51. In one example, the third nitride insulating layer 56 has a fracture toughness the same as the fracture toughness of the second nitride insulating layer 52.

The third nitride insulating layer 56 has a thickness less than the thickness of the first nitride insulating layer 51. The thickness of the third nitride insulating layer 56 is, for example, 0 μm or more and less than 1 μm. The thickness of the third nitride insulating layer 56 is, for example, 0 μm or more and less than 0.5 μm. In the second embodiment, the thickness of the third nitride insulating layer 56 is approximately 0.04 μm. In one example, the third nitride insulating layer 56 has a thickness the same as the thickness of the second nitride insulating layer 52.

Moreover, from the perspective of better observation of the drawings, a ratio of the thickness of the first nitride insulating layer 51 to the thickness of the second nitride insulating layer 52, a ratio of the thickness of the first nitride insulating layer 51 to the thickness of the oxide film 53, a ratio of the thickness of the second nitride insulating layer 52 to the thickness of the oxide film 53, a ratio of the thickness of the third nitride insulating layer 56 to the thickness of the first nitride insulating layer 51, and a ratio of the third nitride insulating layer 56 to the thickness of the oxide film 53, are different from an actual ratio of the thickness of the first nitride insulating layer 51 to the thickness of the second nitride insulating layer 52, an actual ratio of the thickness of the first nitride insulating layer 51 to the thickness of the oxide film 53, an actual ratio of the thickness of the second nitride insulating layer 52 to the thickness of the oxide film 53, an actual ratio of the thickness of the third nitride insulating layer 56 to the thickness of the first nitride insulating layer 51, and an actual ratio of the third nitride insulating layer 56 to the thickness of the oxide film 53.

Moreover, the number of layers of the insulating unit 54 can be modified as desired according to the insulation withstand voltage required by the first chip 14. Moreover, an upper limit of the number of layers of the insulating unit 54 can be modified as desired according to warpage of the semiconductor wafer that forms the first chip 14. That is to say, the upper limit of the number of layers of the insulating unit 54 can be modified as desired, as long as being within a range below tolerable warpage of the semiconductor wafer.

Manufacturing Method of First Chip

A manufacturing method of the first chip 14 according to the second embodiment is to be described in brief below. The manufacturing method of the first chip 14 of the second embodiment differs from the manufacturing method of the first chip 14 of the first embodiment in that, the method for forming the insulating unit 854 is different. The method for forming the insulating unit 854 is described below, and details associated with other steps are omitted.

The step of forming the insulating unit 856 includes a step of forming a third nitride insulating layer 856, a step of forming the first nitride insulating layer 851, a step of forming the second nitride insulating layer 852, a step of implementing an annealing process, and a step of forming the oxide film 853.

Figure 21:
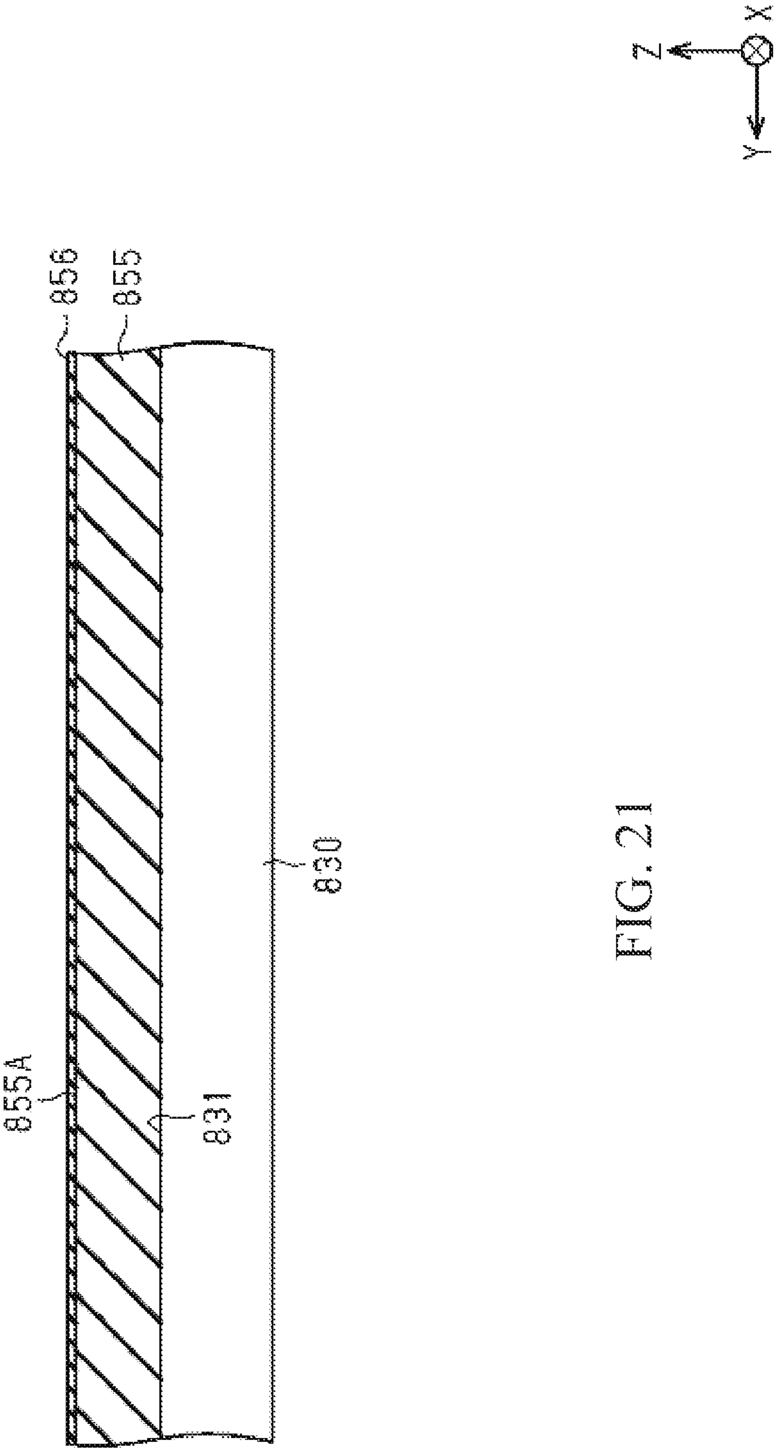
FIG. 21 is a brief section diagram of an example of a manufacturing step for the first chip according to a second embodiment.

As shown in FIG. 21, in the step of forming the third nitride insulating layer 856, the third nitride insulating layer 856 is formed on the lower layer oxide film 855 by means of, for example, plasma CVD. The third nitride insulating layer 856 is a layer forming the third nitride insulating layer 56, and is formed of, for example, a SiN-containing material. More specifically, the third nitride insulating layer 856 is formed throughout the entirety of the upper surface 855A of the lower layer oxide film 855. In one example, in plasma CVD in the step of forming the third nitride insulating layer 856, an amount of supply of an impurity-containing gas in plasma CVD is adjusted such that the third nitride insulating layer 856 has tensile stress. In one example, in plasma CVD in the step of forming the third nitride insulating layer 856, conditions such as film forming temperature and silane gas flow rate are set such that the third nitride insulating layer 856 has a film density higher than a film density of the first nitride insulating layer 851. Herein, the step of forming the third nitride insulating layer 856 corresponds to "a step of forming a third nitride insulating layer on the first oxide film".

Figure 22:
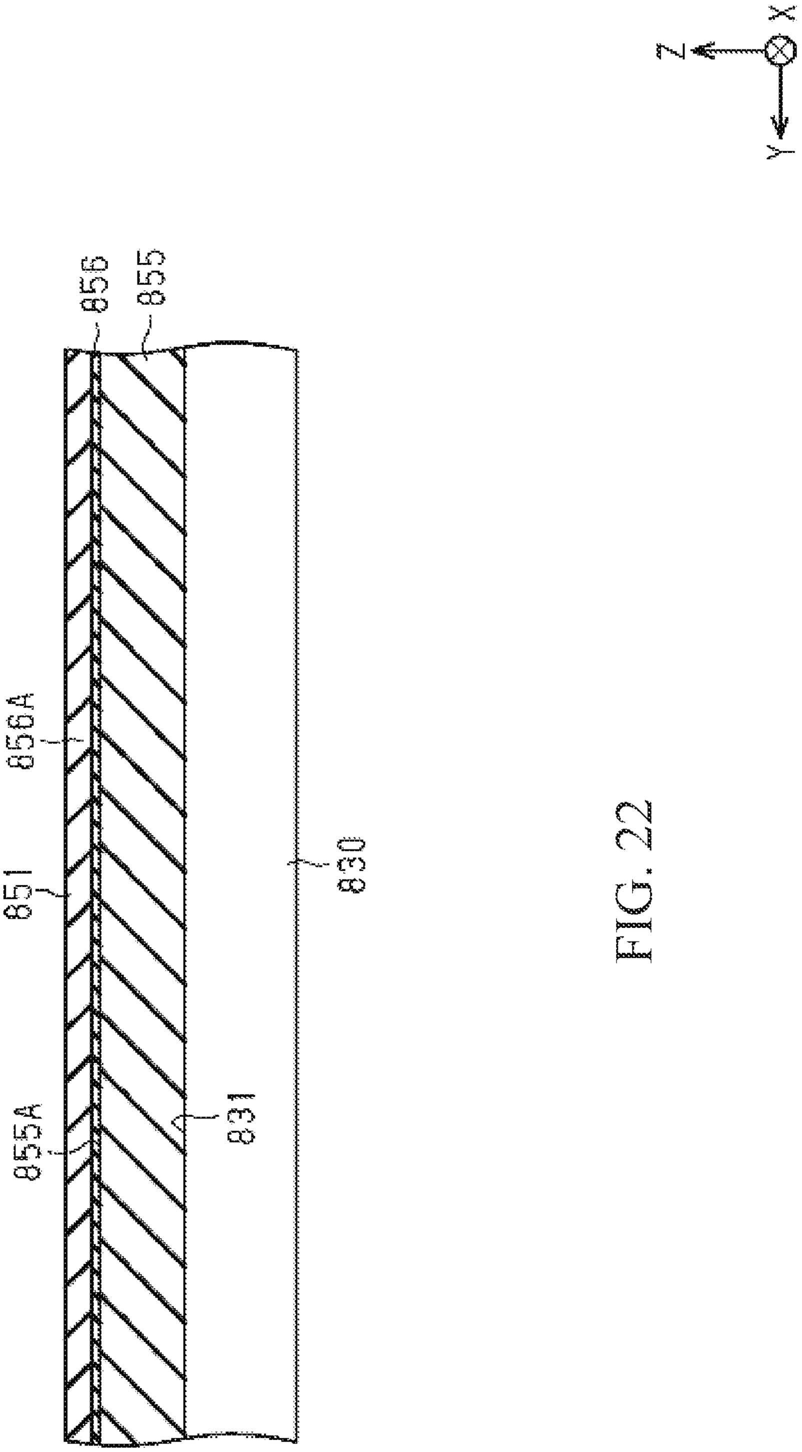
FIG. 22 is a brief section diagram of a manufacturing step following FIG. 21.

As shown in FIG. 22, in the step of forming the first nitride insulating layer 851, the first nitride insulating layer 851 is formed on the third nitride insulating layer 856 by means of, for example, plasma CVD. More specifically, the first nitride insulating layer 851 is formed throughout an entirety of an upper surface 856A of the third nitride insulating layer 856. In one example, in plasma CVD in the step of forming the first nitride insulating layer 851, an amount of supply of an impurity-containing gas in plasma CVD is adjusted such that the first nitride insulating layer 851 has tensile stress. Herein, the step of forming the first nitride insulating layer 851 corresponds to "a step of forming a first nitride insulating layer on the third nitride insulating layer".

The step of forming the second nitride insulating layer 852, the step of forming the oxide layer 853 and the step of implementing an annealing process are the same as those of the first embodiment. Herein, the step of forming the second nitride insulating layer 852 corresponds to "a step of forming a second nitride insulating layer on the first nitride insulating layer". Moreover, with the steps above, both of the second nitride insulating layer 852 and the third nitride insulating layer 856 are formed to have a film density higher than the film density of the first nitride insulating layer 851.

Next, although not shown in the drawings, the step of forming the insulating unit 854 includes a step of laminating the insulating units 854. Herein, the insulating units 854 as a third layer to a sixth layer are sequentially laminated. The method for forming the insulating units 854 as the third layer to the sixth layer are the same as the method for forming the insulating unit 854 as the second layer.

Effects

The semiconductor module 10 according to the second embodiment achieves the following effects.

(2-1) The first nitride insulating layer 51 has the upper surface 51A and the lower surface 51B facing opposite to each other in the Z direction. The second nitride insulating layer 52 is provided on the first nitride insulating layer 51. The substrate-side insulating layer 50 further includes the third nitride insulating layer 56. The third nitride insulating layer 56 is in contact with the lower surface 51B of the first nitride insulating layer 51, and has a film density higher than the film density of the first nitride insulating layer 51. According to the configuration above, effects the same as (1-1) and (1-2) of the first embodiment can be achieved.

Third Embodiment

Figure 23:
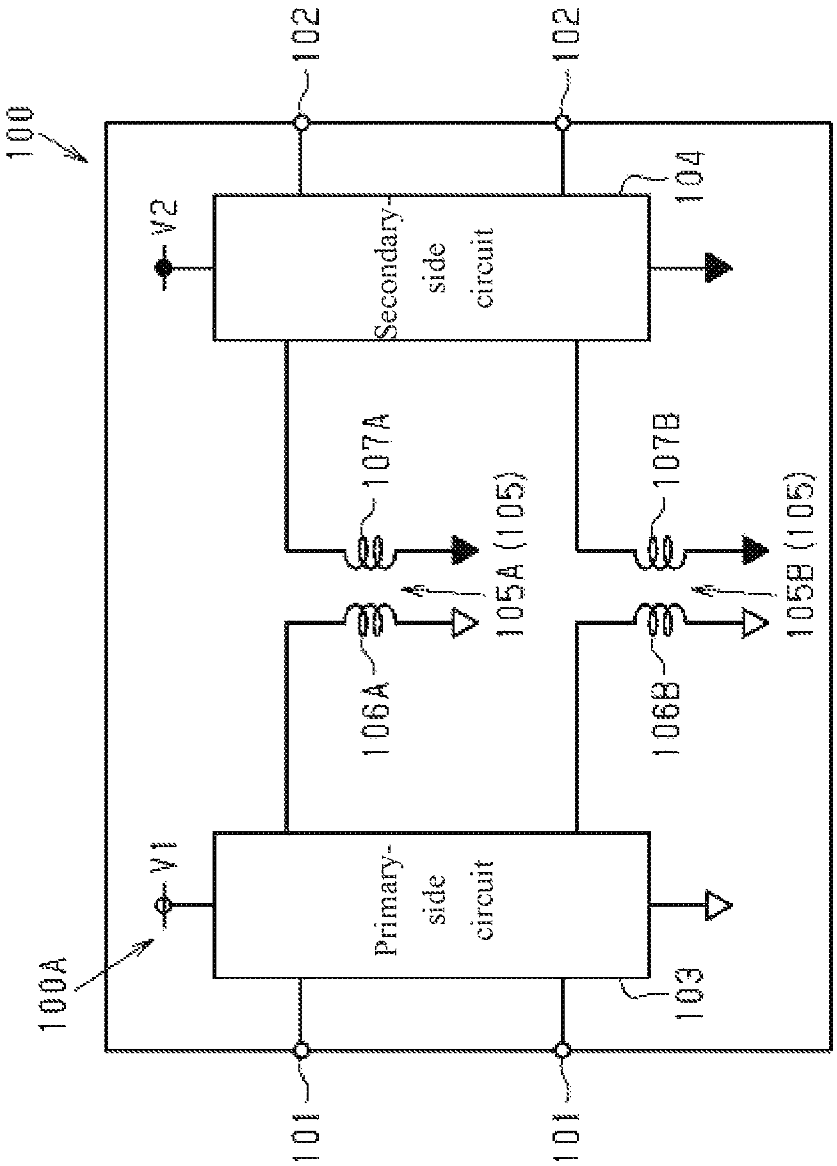
FIG. 23 is a schematic circuit diagram of a configuration of a semiconductor module according to a third embodiment.
Figure 24:
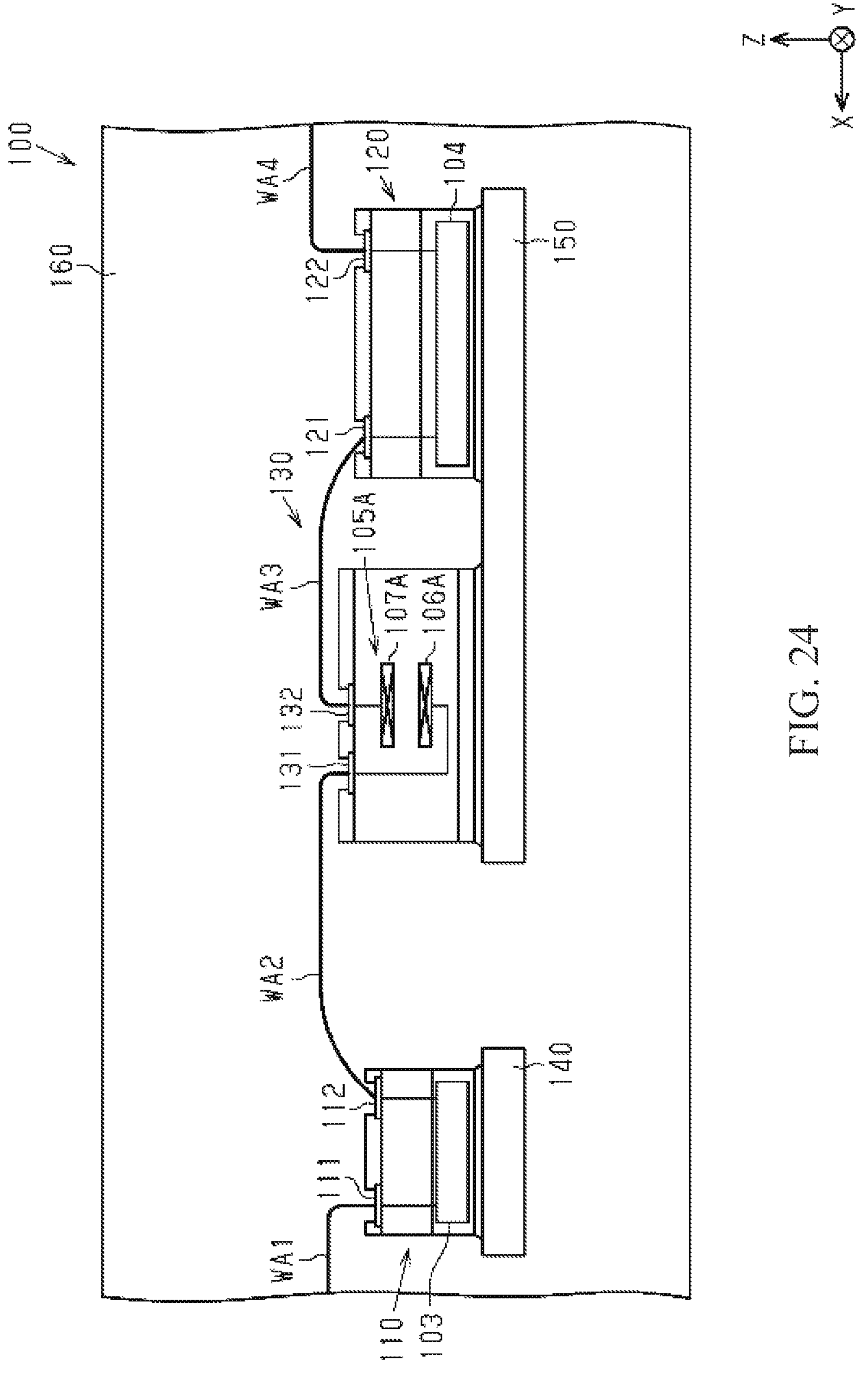
FIG. 24 is a brief section diagram of a semiconductor module according to the third embodiment.
Figure 25:
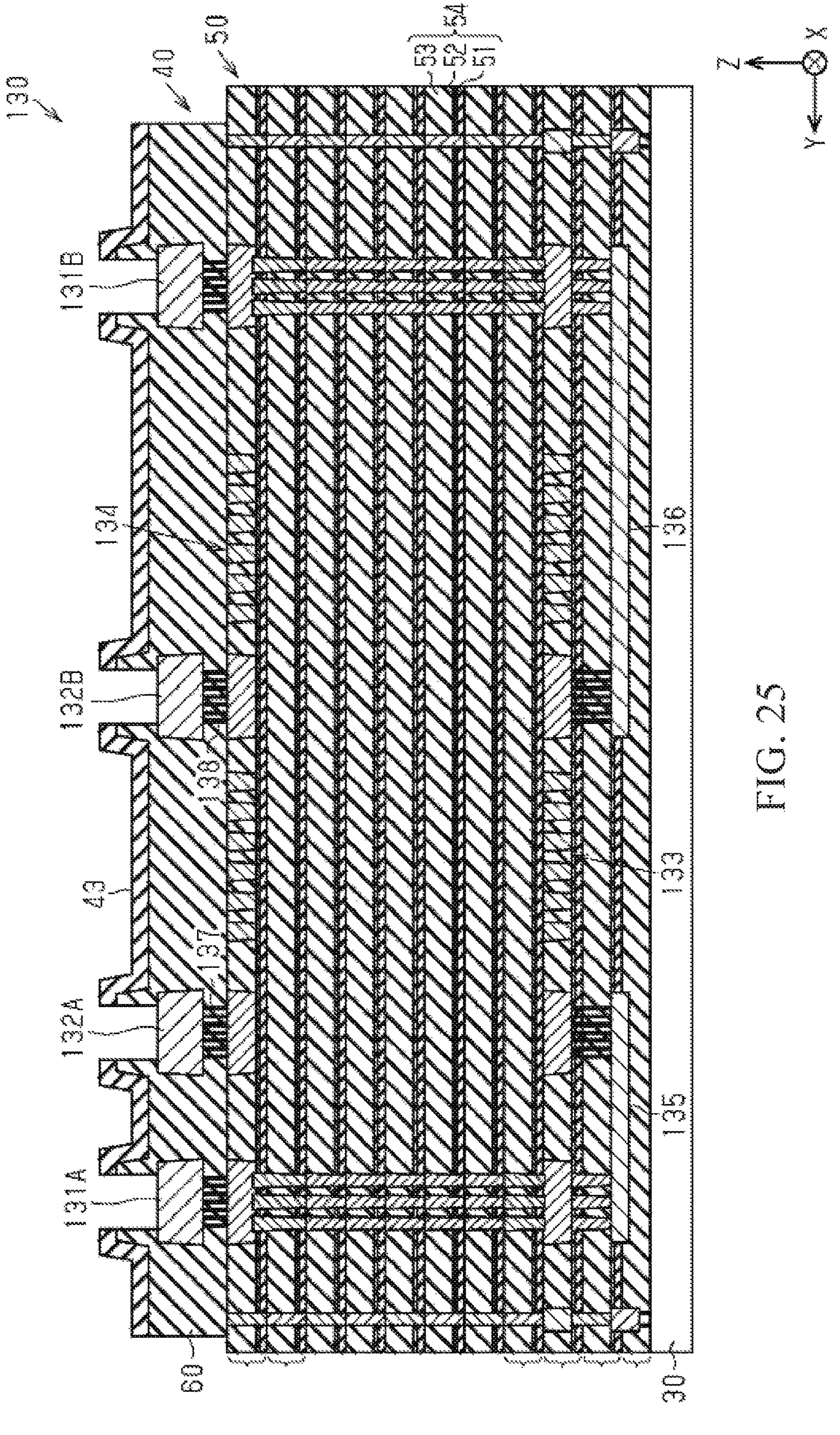
FIG. 25 is a brief plan section of a first chip of a semiconductor module according to the third embodiment.

Referring to FIG. 23 to FIG. 25, a semiconductor module 100 according to the third embodiment is described below.

As shown in FIG. 23, the semiconductor module 100 of the third embodiment is a signal transmission device in which a primary-side terminal 101 and a secondary-side terminal 102 are electrically insulated and which transmits pulse signals. Such signal transmission device is, for example, a digital isolator. For example, the digital isolator is a DC/DC converter. The semiconductor module 100 includes a signal transmission circuit 100A. The signal transmission circuit 100A includes a primary-side circuit 103 electrically connected to the primary-side terminal 101, a secondary-side circuit 104 electrically connected to the secondary-side terminal 102, and a transformer 105 that electrically insulate the primary-side circuit 103 and the secondary-side circuit 104.

The primary-side circuit 103 is a circuit configured to operate using a first voltage V1 applied thereto. The primary-side circuit 103 is, for example, an externally electrically connected control device (omitted from the drawings).

The secondary-side circuit 104 is a circuit configured to operate using a second voltage V2 different from the first voltage V1 applied thereto. The second voltage V2 is, for example, higher than the first voltage V1. The second voltage V1 and the second voltage V2 are, for example, DC voltages. The secondary-side circuit 104 is, for example, a driver circuit electrically connected to a control target of a control device. The driver circuit is, for example, a switch circuit.

In the signal transmission circuit 100A, if a control signal from a control device is input to the primary-side circuit 103 via the primary-side terminal 101, the primary-side circuit 103 transmits the signal to the secondary-side circuit 104 via the transformer 105. Moreover, the signal transmitted to the secondary-side circuit 104 is output from the secondary-side circuit 104 to the driver circuit via the secondary-side terminal 102.

As described above, the signal transmission circuit 100A electrically insulates the primary-side circuit 103 and the secondary-side circuit 104 via the transformer 105. More specifically, with the transformer 105, DC voltage transmission between the primary-side circuit 103 and the secondary-side circuit 104 is restricted, but pulse signals can be transmitted on the other hand.

That is to say, an insulated state between the primary-side circuit 103 and the secondary-side circuit 104 refers to a state in which transmission of DC voltage is cut off between the primary-side circuit 103 and the secondary-side circuit 104, while pulse signals are allowed to be transmitted from the primary-side circuit 103 to the secondary-side circuit 104.

The insulation withstand voltage of the semiconductor module 100 is, for example, 2500 Vrms or more and 7500 Vrms or less. In one example, the insulation withstand voltage of the semiconductor module 100 is approximately 5700 Vrms. However, the specific value of the insulation withstand voltage of the semiconductor module 100 is not limited to the examples above, but can be modified as desired. Herein, in one example, ground of the primary-side circuit 103 and ground of the secondary-side are provided separately.

Next, a configuration example of the semiconductor module 100 is to be described below.

The semiconductor module 100 corresponds to transmission of two types of signals from the primary-side circuit 103 to the secondary-side circuit 104, and thus includes two transformers 105. More specifically, the semiconductor module 100 includes a transformer 105 for transmitting a first signal from the primary-side circuit 103 to the secondary-side circuit 104, and a transformer for transmitting a second signal from the primary-side circuit 103 to the secondary-side circuit 104. In one example, the first signal is a signal including rising information of an external signal input to the semiconductor module 100, and the second signal is a signal including falling information of the external signal. A pulse signal is generated from the first signal and the second signal.

In the description, for the sake of convenience, the transformer 105 for transmitting the first signal is set as "a first transformer 105A", and the transformer 105 for transmitting the second signal is set as "a second transformer 105B".

The first transformer 105A is configured to transmit the first signal from the primary-side circuit 103 to the secondary-side circuit 104, and electrically insulates the primary-side circuit 103 and the secondary-side circuit 104 on the other hand. The second transformer 105B is configured to transmit the second signal from the primary-side circuit 103 to the secondary-side circuit 104, and electrically insulates the primary-side circuit 103 and the secondary-side circuit 104 on the other hand. The insulation withstand voltages of the first transformer 105A and the second transformer 105B are, for example, 2500 Vrms or more and 7500 Vrms or less. However, the specific values of the insulation withstand voltage of first transformer 105A and the second transformer 105B are not limited to the examples above, but can be modified as desired.

The first transformer 105A has a low-voltage coil 106A, and a high-voltage coil 107A electrically insulated from and magnetically coupled with the low-voltage coil 106A. A first coil end of the low-voltage coil 106A is electrically connected to the primary-side circuit 103, and on the other hand, a second coil end of the low-voltage coil 106A is electrically connected to the ground of the primary-side circuit 103. A first coil end of the high-voltage coil 107A is electrically connected to the secondary-side circuit 104, and on the other hand, a second coil end of the high-voltage coil 107A is electrically connected to the ground of the secondary-side circuit 104.

The second transformer 105B has a low-voltage coil 106B, and a high-voltage coil 107B electrically insulated from and magnetically coupled with the low-voltage coil 106B. As shown in FIG. 23, since the electrical connection relation between the low-voltage coil 106B and the high-voltage coil 107B is the same as the first transformer 105A, associated details are omitted herein.

As shown in FIG. 24, in the semiconductor module 100, multiple semiconductor chips are packaged into one package. In one example, a package format of the semiconductor module 100 is small outline (SO). The SO is, for example, a small-outline package (SOP). Moreover, the package format of the semiconductor module 100 can be modified as desired.

The semiconductor module 100 includes a first chip 110, a second chip 120, and a transformer chip 130 as a semiconductor chip. Moreover, the semiconductor module 100 includes a sealing resin 160. The sealing resin 160 seals a primary-side die pad 140 mounted with the first chip 110, a secondary-side die pad 150 mounted with the second chip 120, the first chip 110, the second chip 120, the transformer chip 130, the primary-side die pad 140 and the secondary-side die pad 150. Moreover, in the third embodiment, the transformer chip 130 corresponds to "a semiconductor device". Moreover, the secondary-side die pad 150 corresponds to "a support member".

The sealing resin 160 is formed of an electrically insulative material. Such material is, for example, black epoxy resin. The sealing resin 160 is formed in a rectangular tablet shape with the Z direction set as a thickness direction.

In the plan view, the primary-side die pad 140 and the secondary-side die pad 150 are arranged separated from each other in the X direction. Both of the primary-side die pad 140 and the secondary-side die pad 150 are formed in tablet shapes. In one example, both of the primary-side die pad 140 and the secondary-side die pad 150 are conductive layers formed of a conductive material. The conductive material is, for example, formed of a Cu-containing or Al-containing material. Moreover, the materials forming the primary-side die pad 140 and the secondary-side die pad 150 are limited to being conductive materials, but can also be insulative materials. Such insulative material is, for example, ceramic such as aluminum oxide.

The transformer chip 130 is mounted on the secondary-side die pad 150. Thus, it can also be said that the transformer chip 130 supports the secondary-side die pad 150. Both of the transformer chip 130 and the second chip 120 are mounted on the secondary-side die pad 150. The transformer chip 130 and the second chip 120 are arranged separated from each other in the X direction. The transformer chip 130 is disposed between the first chip 110 and the second chip 120 in the X direction.

The first chip 110 is a chip including the primary-side circuit 103. The first chip 110 includes multiple first electrode pads 111 and multiple second electrode pads 112 exposed from an upper surface of the chip. The first chip 110 is bonded with the primary-side die pad 140 by a conductive bonding material such as solder paste or silver or paste. In the semiconductor module 100, the primary-side die pad 140 is configured as a first ground. Thus, the primary-side circuit 103 is electrically connected to the first ground.

The second chip 120 is a chip including the secondary-side circuit 104. The second chip 120 includes multiple first electrode pads 121 and multiple second electrode pads 122 exposed from the upper surface of the chip. The second chip 120 is bonded with the secondary-side die pad 150 by a conductive bonding material. In the semiconductor module 100, the secondary-side die pad 150 is configured as a second ground. Thus, the second-side circuit 104 is electrically connected to the second ground.

The transformer chip 130 is a chip that includes both of the first transformer 105A and the second transformer 105B. Thus, the transformer chip 130 is a chip, which is different from the first chip 110 and the second chip 120 and exclusively includes the first transformer 105A and the second transformer 105B. The transformer chip 130 includes multiple first electrode pads 131 and multiple second electrode pads 132 exposed from the upper surface of the chip. The multiple electrode pads 131 are electrode pads electrically connected to the low-voltage coil 106A (106B), and the multiple electrode pads 132 are electrode pads electrically connected to the high-voltage coil 107A (107B). The transformer chip 130 is bonded with the secondary-side die pad 150 by, for example, a conductive bonding material. Moreover, the transformer chip 130 can also be bonded with the secondary-side die pad 150 by, for example, an insulative material such as epoxy.

The multiple first electrode pads 111 of the first chip 110 are individually connected to multiple primary-side lead wires via multiple conductive wires WA1 (not shown). The primary-side lead wires are components forming the primary-side terminal 101 in FIG. 23. Accordingly, the primary-side circuit 103 is electrically connected to the primary-side terminal 101. The primary-side lead wires have terminal portions protruding outward from the sealing resin 160.

The multiple second electrode pads 112 of the first chip 110 are individually connected to the multiple first electrode pads 131 via multiple conductive wires WA2 and the transformer chip 130. Accordingly, the primary-side circuit 103 is electrically connected to the low-voltage coil 106A (106B).

The multiple second electrode pads 132 of the transformer chip 130 are individually connected to the multiple first electrode pads 121 via multiple conductive wires WA3 and the second chip 120. Accordingly, the secondary-side circuit 104 is electrically connected to the high-voltage coil 107A (107B).

The multiple second electrode pads 122 of the second chip 120 are individually connected to multiple secondary-side lead wires via multiple conductive wires WA4 (not shown). The secondary-side lead wires are components forming the secondary-side terminal 102 in FIG. 23. Accordingly, the secondary-side circuit 104 is electrically connected to the secondary-side terminal 102. The secondary-side lead wires have terminal portions protruding outward from the sealing resin 160.

Each of the conductive wires WA1 to WA4 is a bonding wire formed by a lead wire bonding device. Each of the conductive wires WA1 to WA4 is formed of, for example, Au, Al or Cu.

Internal Configuration of Transformer Chip

FIG. 25 shows a cross-section structure of the transformer chip 130 and the secondary-side die pad 150 along the XY plane. In the description below, the multiple first electrode pads 131 are set as "a first electrode pad 131A" and "a second electrode pad 131B", and the multiple second electrode pads 132 are set as "a second electrode pad 132A" and "a second electrode pad 132B".

As shown in FIG. 25, similar to the first chip 14 of the first embodiment, the transformer chip 130 includes the semiconductor substrate 30 and the element insulation layer 40. Moreover, the transformer chip 140 includes a first coil 133 forming the low-voltage coil 106A (106B) and a second coil 134 forming the high-voltage coil 107A (107B).

Both of the first coil 133 and the second coil 134 are embedded into the element insulating layer 40. In one example, both of the first coil 133 and the second coil 134 are embedded into the substrate-side insulating layer 50. The second coil 134 is arranged to face the first coil 133 in the Z direction. A portion of the element insulating layer 40 (the substrate-side insulating layer 50) is interposed between the first coil 133 and the second coil 134. The second coil 134 is disposed closer to the element front surface 41 of the element insulating layer 40 than the first coil 133. Moreover, a configuration position of the second coil 134 can be modified as desired. In one example, the second coil 134 can also be disposed on the substrate-side insulating layer 50.

Materials forming the first coil 133 and the second coil one or more materials appropriately selected from Ti, TiN, Ta, TaN, Au, Ag, Cu, Al and W. In one example, each of the first coil 133 and the second coil 134 is formed of a Cu-containing material.

The first coil 133 is electrically connected to the first electrode pad 131A via a low-voltage-side connecting wiring 135. Moreover, the first coil 133 is electrically connected to the first electrode pad 131B via a low-voltage-side connecting wiring 136. The second coil 134 is electrically connected to the second electrode pad 132A via a high-voltage-side connecting wiring 137. The second coil 134 is electrically connected to the second electrode pad 132B via a high-voltage-side connecting wiring 138. The low-voltage-side connecting wirings 135 and 136 are formed of, for example, a combination of wiring layers and vias. The high-voltage-side connecting wirings 137 and 138 are formed of, for example, vias.

In the third embodiment, the number of layers of the insulating units 54 of the substrate-side insulating layer 50 is greater than that of the first embodiment. In the example shown in FIG. 25, the substrate-side insulating layer 50 is formed by laminating ten layers of the insulating units 54 on the lower layer oxide film 55 in the Z direction. Herein, for the sake of convenience, the lower layer oxide layer 55 is set as a first layer of the substrate-side insulating layer 50. Thus, the insulating units 54 form the second to eleventh layers of the substrate-side insulating layer 50. Moreover, the number of layers of the insulating units 54 can be modified as desired, for example, five layers as in the first embodiment.

The first coil 133 is disposed on the insulating layer 54 as the third layer in substrate-side insulating layer 50. In the example shown in FIG. 25, the first coil 133 is disposed to pass through the oxide film 53 of the insulating unit 54 as the third layer in the Z direction. Thus, the first coil 133 is in contact with the second nitride insulating layer 52 of the insulating unit 54 as the third layer, and the first coil 133 is in contact with the first nitride insulating layer 51 as the fourth layer.

The second coil 134 is disposed on the insulating layer 54 as the eleventh layer in substrate-side insulating layer 50. In the example shown in FIG. 25, the second coil 134 is disposed to pass through the oxide film 53 of the insulating unit 54 as the eleventh layer in the Z direction. Thus, the second coil 134 is in contact with the second nitride insulating layer 52 of the insulating unit 54 as the eleventh layer, and the second coil 134 is in contact with the front-side insulating layer 60.

Each of the first electrode pad 131A and 131B and the second electrode pads 132A and 132B is disposed on the substrate-side insulating layer 50. Each of the first electrode pad 131A and 131B and the second electrode pads 132A and 132B is disposed on the front-side insulating layer 60. Similar to the first embodiment, the passivation film 43 is disposed on the front-side insulating layer 60. Each of the front-side insulating layer 60 and the passivation film 43 is provided with an opening portion to individually expose the first electrodes 131A and 131B and the second electrode pads 132A and 132B. Moreover, the semiconductor device 10 according to the third embodiment achieves the same effects as those of the first embodiment.

Variation Examples

The embodiments can be modified as follows and be accordingly implemented. Moreover, the embodiments described above and the variation examples below can be implemented in combination, given that they are not technically contradictory.

In the first embodiment, a position of the second nitride insulating layer 52 in the Z direction can be modified as desired. In one example, as shown in FIG. 26, in the insulating unit 542 as the second layer, the second nitride insulating layer 522 can also be disposed to have its upper surface 52A be in contact with the lower surface 51B of the first nitride insulating layer 512.

In summary, regarding a configuration pattern of the first nitride insulating layer 51 and the second nitride insulating layer 52 interposed between adjacent oxide films 53 in the Z direction, the second nitride insulating layer 52 can be disposed on the first nitride insulating layer 51, or the first nitride insulating layer 51 can be disposed on the second nitride insulating layer 52.

Figure 26:
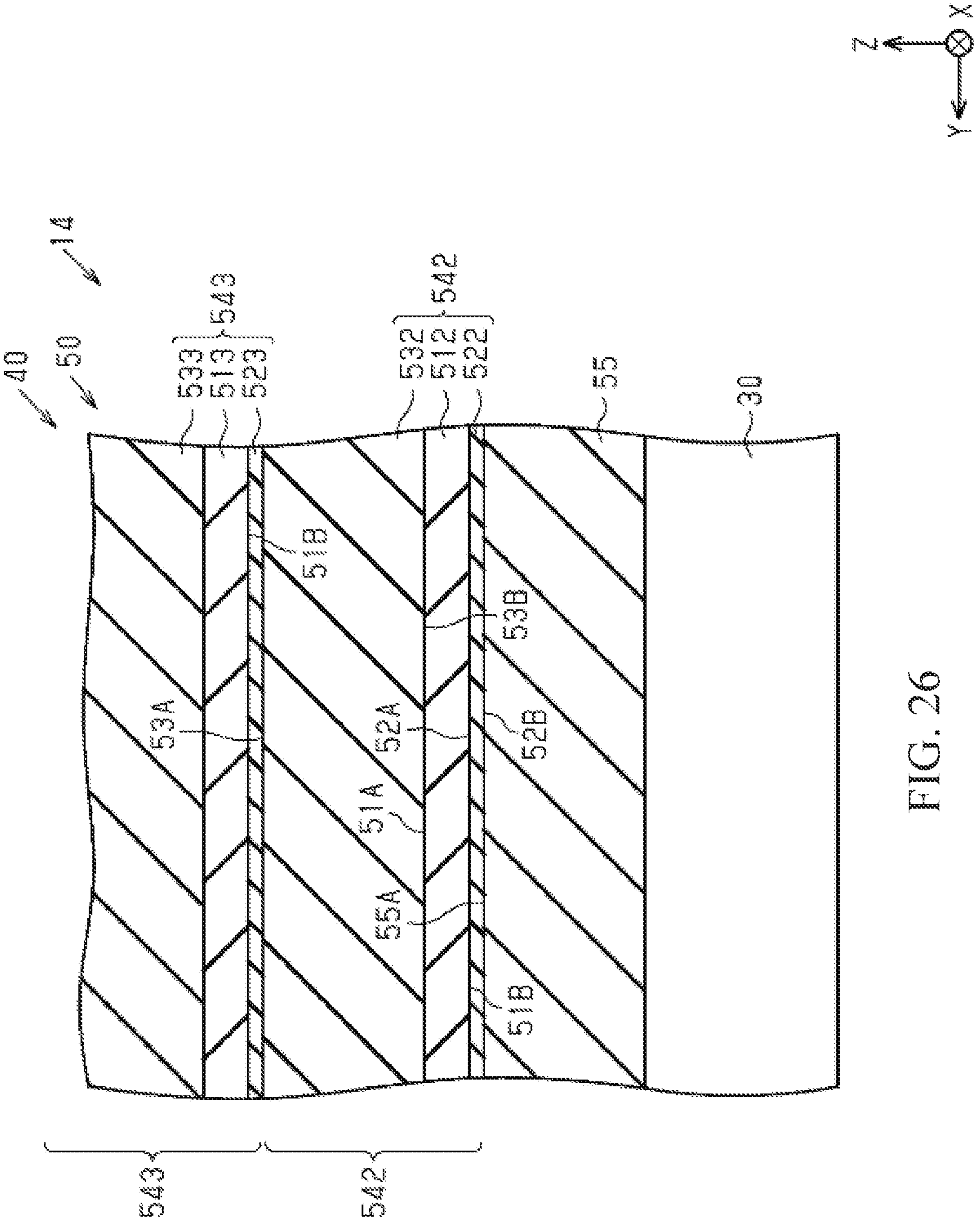
FIG. 26 is an enlarged section diagram of a part of a substrate-side insulating layer of a first chip according to a variation example.

In the variation example shown in FIG. 26, in the manufacturing method of the first chip 14, an order of manufacturing the first nitride insulating layer 51 and the second nitride insulating layer 52 is different. That is to say, the manufacturing method of the first chip 14 includes a step of forming the second nitride insulating layer 852 on the lower layer oxide film 855 (a first oxide film) after forming the lower layer oxide film 855 on the semiconductor substrate 830, a step of forming the first nitride insulating layer 851 on the second nitride insulating layer 852, and a step of forming the oxide film 853 (a second oxide film) on the first nitride insulating film 851.

In the first embodiment, the configuration of the substrate-side insulating layer 50 can be modified as desired. In one example, the substrate-side insulating layer 50 can also include: a first insulating unit 54M, including the first nitride insulating layer 51, the second nitride insulating layer 52 and an oxide film 53M; and a second insulating unit 54N, including a fourth nitride insulating layer 57 and an oxide film 53N. The fourth nitride insulating layer 57 is an insulating layer corresponding to the first nitride insulating layer 51. Moreover, the oxide films 53M and 53N are, for example, formed to have the same structure as the oxide film 53 of the first embodiment. That is to say, the second insulating unit 54N does not include the nitride insulating layer 52. Thus, the substrate-side insulating layer 50 shown in FIG. 27 is a configuration in which the second nitride insulating layer 52 is omitted from a portion of the substrate-side insulating layer 50.

Figure 27:
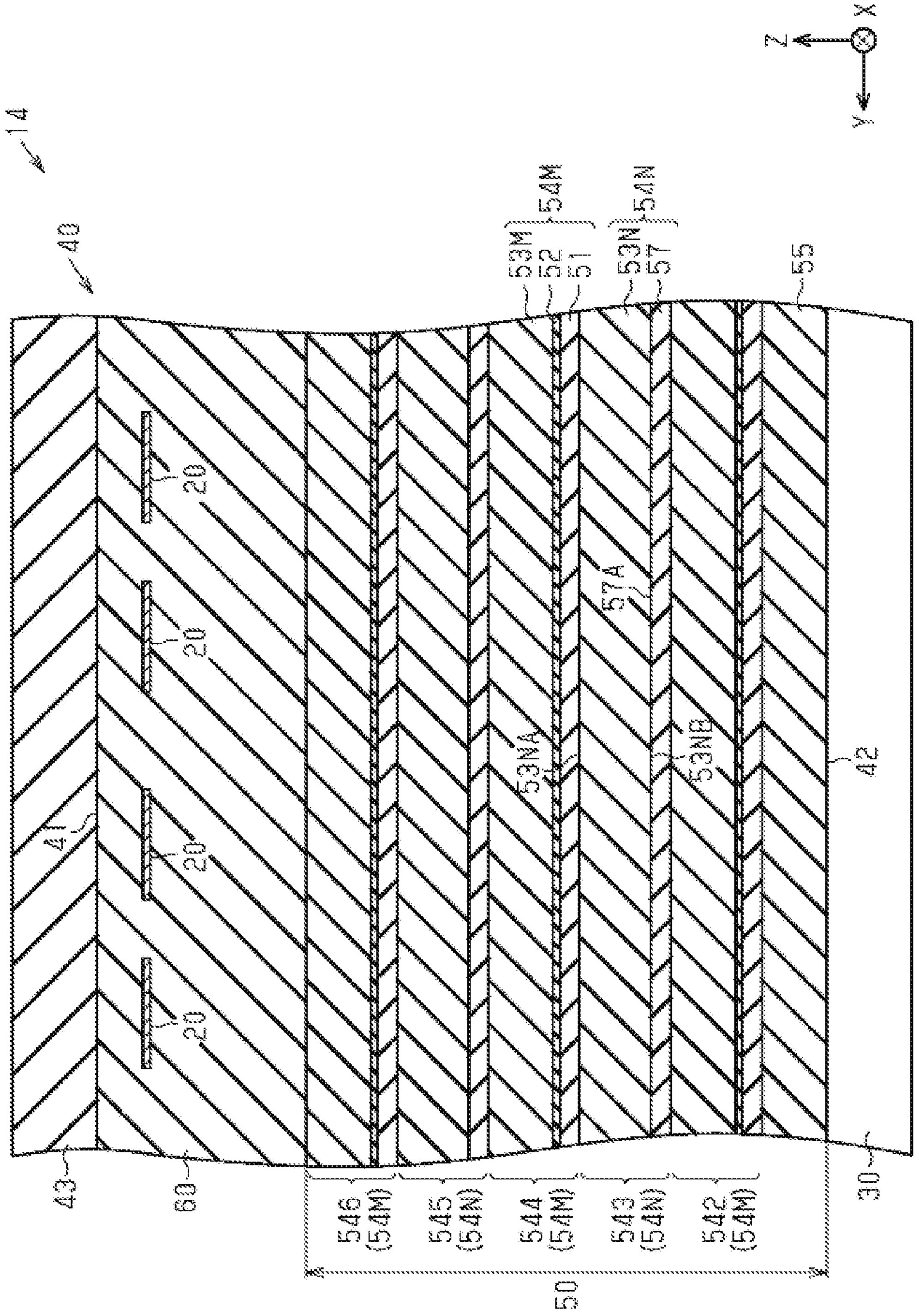
FIG. 27 is a brief section diagram of semiconductor resistive layers and peripherals of a first chip according to a variation example.

In the substrate-side insulating layer 50 shown in FIG. 27, the insulating units 542, 544 and 546 as the second layer, the fourth layer and sixth layer are formed by the first insulating unit 54M, and the insulating units 543 and 545 as the third layer and the fifth layer are formed by the second insulating unit 54N. That is to say, the substrate-side insulating layer 50 is alternately laminated with the first insulating unit 54M and the second insulating unit 54N.

The fourth nitride insulating layer 57 is formed of a same material as the first nitride insulating layer 51. That is to say, the fourth nitride insulating layer 57 has a film density lower than the film density of the second nitride insulating layer 52. The fourth nitride insulating layer 57 has a fracture toughness lower than the fracture toughness of the second nitride insulating layer 52. The fourth nitride insulating layer 57 has a coefficient of thermal expansion greater than the coefficient of thermal expansion of the second nitride insulating layer 52. In one example, the fourth nitride insulating layer 57 has a same film density, a same fracture toughness and a same coefficient of thermal expansion as those of the first nitride insulating layer 51. That is to say, the fourth nitride insulating layer 57 and the first nitride insulating layer 51 are formed by the same manufacturing method. Moreover, in one example, the fourth nitride insulating layer 57 has a thickness the same as the thickness of the first nitride insulating layer 51.

The oxide film 53N of the second insulating unit 54N is disposed on the fourth nitride insulating layer 57. The oxide film 53N corresponds to "a third oxide film". A lower surface 53NB of the oxide film 53N is in contact with an upper surface 57A of the fourth nitride insulating layer 57. An upper surface 53NA of the oxide film 53N is in contact with the first nitride insulating layer 51 of the first insulating unit 54M. In one example, the oxide film 53N is formed of a same material as the oxide film 53 of the first insulating unit 54M.

Moreover, the laminated structure of the first insulating unit 54M and the second insulating unit 54N in the substrate-side insulating layer 50 can be modified as desired. The substrate-side insulating layer 50 only needs to include both of at least one first insulating unit 54M and the second insulating unit 54N. Moreover, the configuration of the substrate-side insulating layer 50 of the third embodiment can also be modified similarly.

In the second embodiment, the configuration of the substrate-side insulating layer 50 can be modified as desired.

Figure 28:
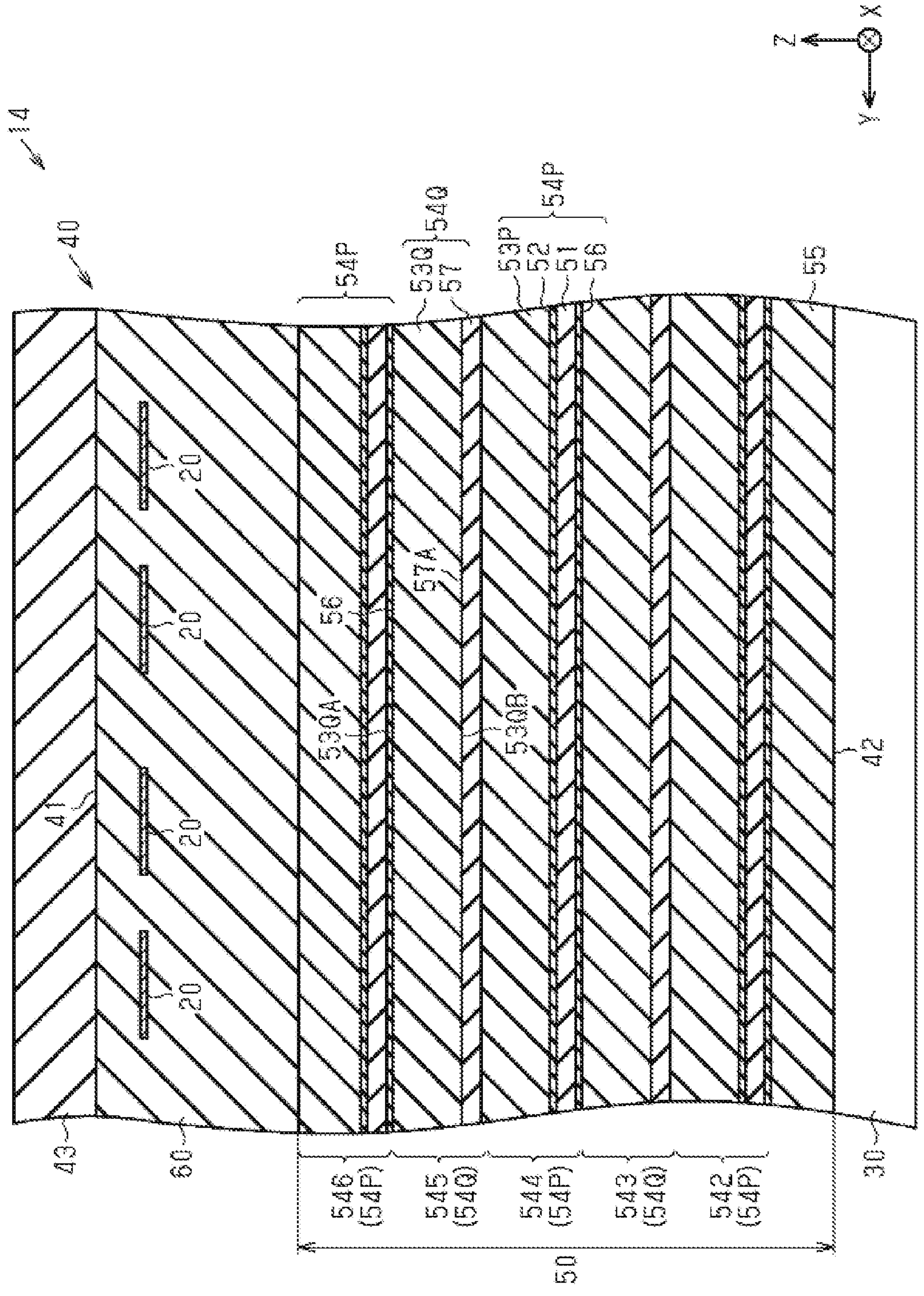
FIG. 28 is a brief section diagram of semiconductor resistive layers and peripherals of a first chip according to a variation example.

In a first example, as shown in FIG. 28, the substrate-side insulating layer 50 can also include: a first insulating unit 54P, including the first nitride insulating layer 51, the second nitride insulating layer 52, the third nitride insulating film 53 and an oxide film 53P; and a second insulating unit 54Q, including the fourth nitride insulating layer 57 and an oxide film 53Q. The fourth nitride insulating layer 57 is an insulating layer corresponding to the first nitride insulating layer 51. Moreover, the oxide films 53P and 53Q are, for example, formed to have the same structure as the oxide film 53 of the first embodiment. That is to say, the second insulating unit 54Q does not include the nitride insulating layer 52 or the third nitride insulating layer 53. Thus, the substrate-side insulating layer 50 shown in FIG. 28 is a configuration in which the second nitride insulating layer 52 and the third nitride insulating layer 53 are omitted from a portion of the substrate-side insulating layer 50.

In the substrate-side insulating layer 50 shown in FIG. 28, the insulating units 542, 544 and 546 as the second layer, the fourth layer and sixth layer are formed by the first insulating unit 54P, and the insulating units 543 and 545 as the third layer and the fifth layer are formed by the second insulating unit 54Q. That is to say, the substrate-side insulating layer 50 is alternately laminated with the first insulating unit 54P and the second insulating unit 54Q.

The oxide film 53Q of the second insulating unit 54Q is disposed on the fourth nitride insulating layer 57. The oxide film 53Q corresponds to "a fourth oxide film". A lower surface 53QB of the oxide film 53Q is in contact with an upper surface 57A of the fourth nitride insulating layer 57. An upper surface 53QA of the oxide film 53Q is in contact with the third nitride insulating layer 56 of the first insulating unit 54P.

Moreover, the laminated structure of the first insulating unit 54P and the second insulating unit 54Q in the substrate-side insulating layer 50 can be modified as desired. The substrate-side insulating layer 50 only needs to include both of at least one first insulating unit 54P and the second insulating unit 54Q. Moreover, the configuration of the substrate-side insulating layer 50 of the third embodiment can also be modified similarly.

Figure 29:
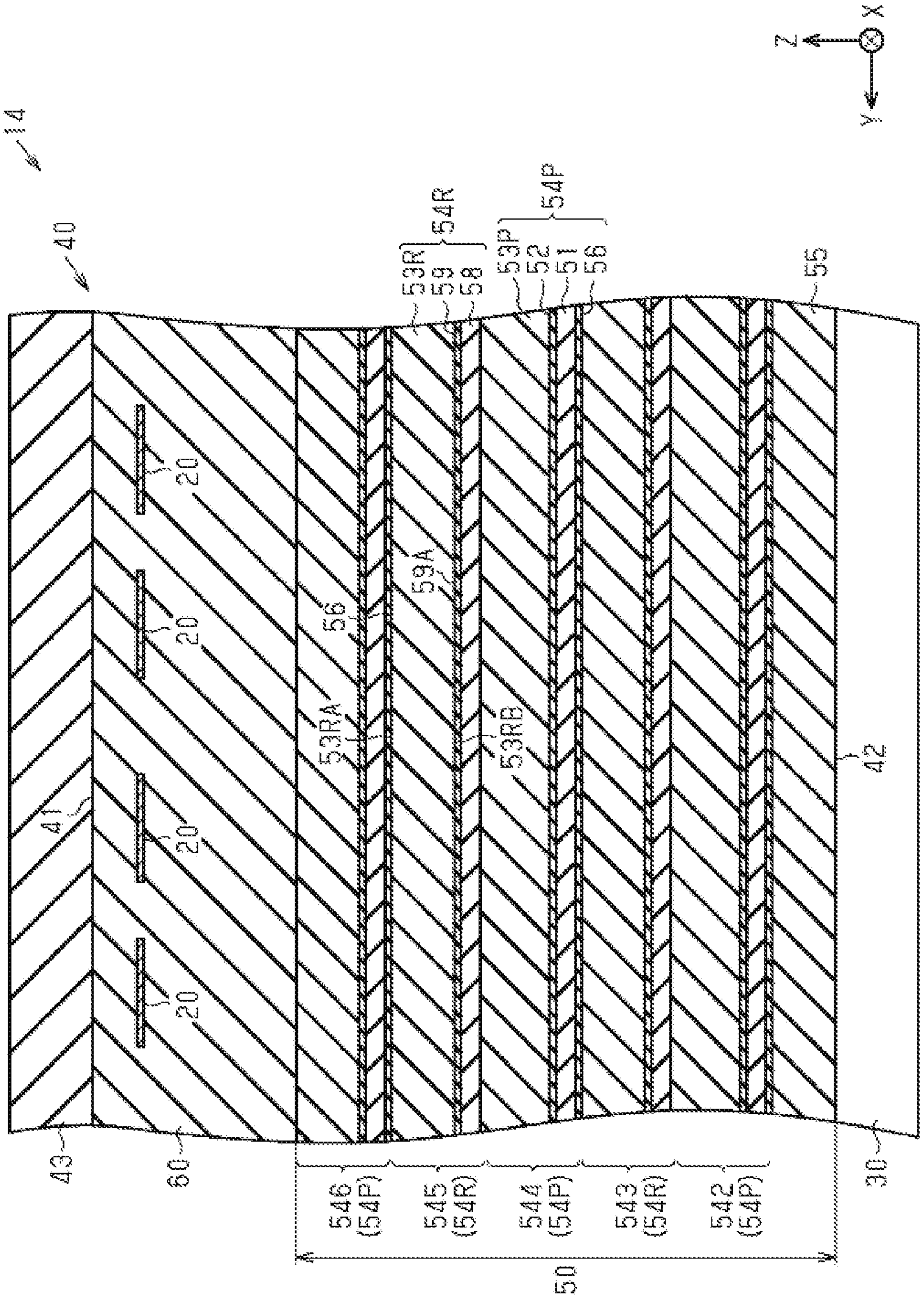
FIG. 29 is a brief section diagram of semiconductor resistive layers and peripherals of a first chip according to a variation example.

In a second example, as shown in FIG. 29, the substrate-side insulating layer 50 can also include the first insulating unit 54P, and a third insulating unit 54R including a fifth nitride insulating layer 58, a sixth nitride insulating layer 59 and an oxide film 53R. The fifth nitride insulating layer 58 is an insulating layer corresponding to the first nitride insulating layer 51, and the sixth nitride insulating layer 59 is an insulating layer corresponding to the second nitride insulating layer 52. Moreover, the oxide film 53R is, for example, formed to have the same structure as the oxide film 53 of the first embodiment.

In the substrate-side insulating layer 50 shown in FIG. 29, the insulating units 542, 544 and 546 as the second layer, the fourth layer and sixth layer are formed by the first insulating unit 54P, and the insulating units 543 and 545 as the third layer and the fifth layer are formed by the third insulating unit 54R. That is to say, the substrate-side insulating layer 50 is alternately laminated with the first insulating unit 54P and the third insulating unit 54R.

The fifth nitride insulating layer 58 is formed of a same material as the first nitride insulating layer 51. That is to say, the fifth nitride insulating layer 58 has a film density lower than the film density of the second nitride insulating layer 52. The fifth nitride insulating layer 58 has a fracture toughness lower than the fracture toughness of the second nitride insulating layer 52. The fifth nitride insulating layer 58 has a coefficient of thermal expansion greater than the coefficient of thermal expansion of the second nitride insulating layer 52. In one example, the fifth nitride insulating layer 58 has a same film density, a same fracture toughness and a same coefficient of thermal expansion as those of the first nitride insulating layer 51. That is to say, the fifth nitride insulating layer 58 and the first nitride insulating layer 51 are formed by the same manufacturing method. Moreover, in one example, the fifth nitride insulating layer 58 has a thickness the same as the thickness of the first nitride insulating layer 51.

The sixth nitride insulating layer 59 is formed of a same material as the second nitride insulating layer 52. That is to say, the sixth nitride insulating layer 59 has a film density higher than the film density of the fifth nitride insulating layer 58. The sixth nitride insulating layer 59 has a fracture toughness higher than the fracture toughness of the fifth nitride insulating layer 58. Thus, the sixth nitride insulating layer 59 has a coefficient of thermal expansion smaller than the coefficient of thermal expansion of the fifth nitride insulating layer 58. It can also be said that the sixth nitride insulating layer 59 has a coefficient of thermal expansion between the coefficient of thermal expansion of the oxide film 53R and the coefficient of thermal expansion of the fifth nitride insulating layer 58. In one example, the sixth nitride insulating layer 59 has a same film density, a same fracture toughness and a same coefficient of thermal expansion as those of the second nitride insulating layer 52. That is to say, the sixth nitride insulating layer 59 and the second nitride insulating layer 52 are formed by the same manufacturing method. In one example, the sixth nitride insulating layer 59 has a thickness less than the thickness of the fifth nitride insulating layer 58. In one example, the sixth nitride insulating layer 59 has a thickness the same as the thickness of the second nitride insulating layer 52.

The oxide film 53R of the third insulating unit 54R is disposed on the sixth nitride insulating layer 59. The oxide film 53R corresponds to "a fifth oxide film". A lower surface 53RB of the oxide film 53R is in contact with an upper surface 59A of the sixth nitride insulating layer 59. An upper surface 53RA of the oxide film 53R is in contact with the third nitride insulating layer 56 of the first insulating unit 54P.

Moreover, the laminated structure of the first insulating unit 54P and the third insulating unit 54R in the substrate-side insulating layer 50 can be modified as desired. The substrate-side insulating layer 50 only needs to include both of at least one first insulating unit 54P and the third insulating unit 54R. Moreover, the configuration of the substrate-side insulating layer 50 of the third embodiment can also be modified similarly.

Figure 30:
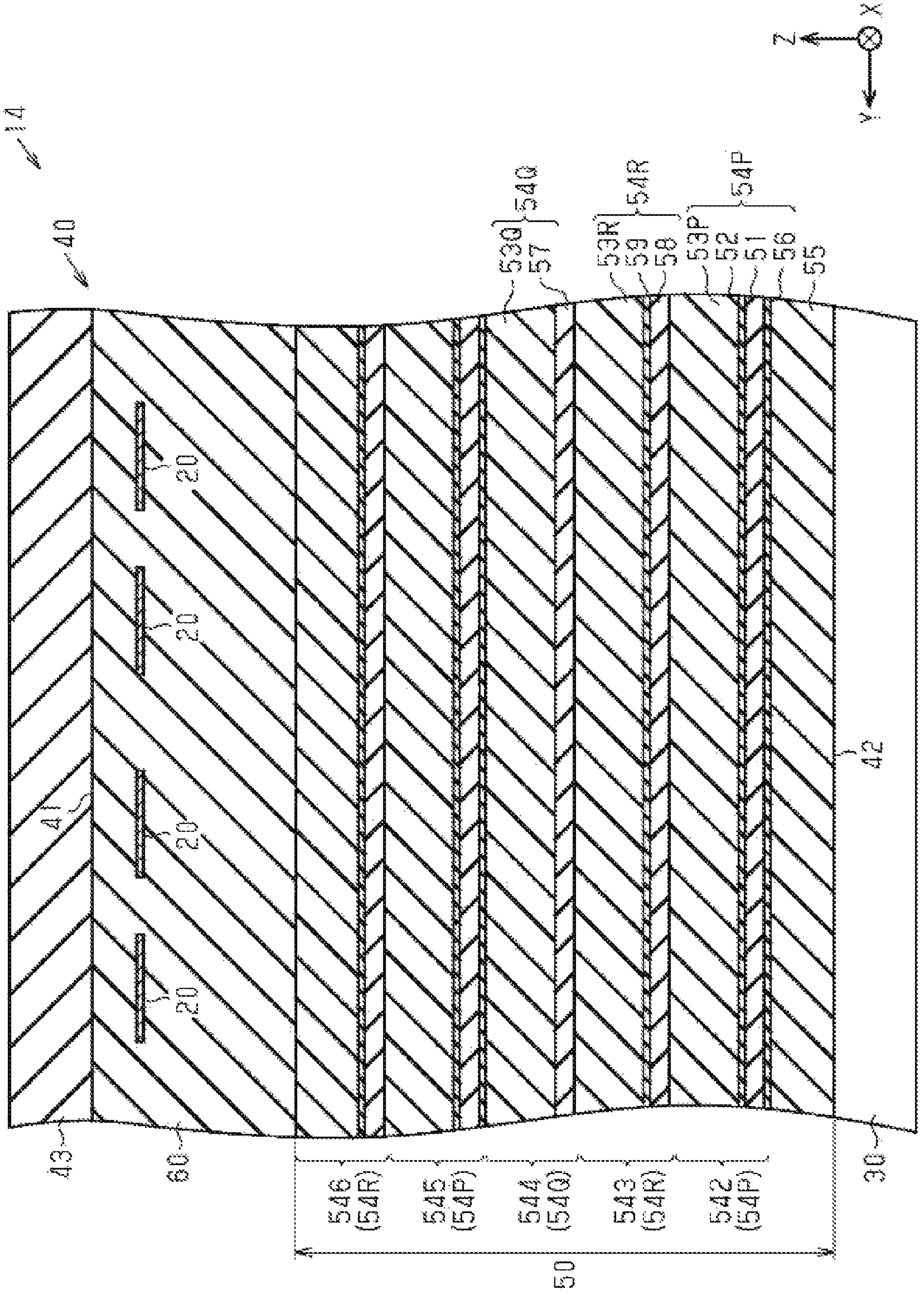
FIG. 30 is a brief section diagram of semiconductor resistive layers and peripherals of a first chip according to a variation example.

In a third example, as shown in FIG. 30, the substrate-side insulating layer 50 can also include the first insulating unit 54P, and the third insulating unit 54R including the fifth nitride insulating layer 58, the sixth nitride insulating layer 59 and the oxide film 53R.

In the substrate-side insulating layer 50 shown in FIG. 30, the insulating units 542 and 545 as the second layer and fifth layer are formed by the first insulating unit 54P, the insulating units 543 and 546 as the third layer and the sixth layer are formed by the third insulating unit 54R, and the insulating unit 544 as the fourth layer is formed by the second insulating unit 54Q. That is to say, the substrate-side insulating layer 50 is alternately laminated with the first insulating unit 54P, the second insulating unit 54Q and the third insulating unit 54R.

Moreover, the laminated structure of the first insulating unit 54P, the second insulating unit 54Q and the third insulating unit 54R in the substrate-side insulating layer 50 can be modified as desired. For example, an order of the first insulating unit 54P, the second insulating unit 54Q and the third insulating unit 54R forming the laminated structure of the substrate-side insulating layer 50 is not limited to the order shown in FIG. 30, but can be modified as desired. The substrate-side insulating layer 50 only needs to include each of at least one first insulating unit 54P, the second insulating unit 54Q and the third insulating unit 54R. Moreover, the configuration of the substrate-side insulating layer 50 of the third embodiment can also be modified similarly.

In the third embodiment, the configuration of the substrate-side insulating layer 50 of the second embodiment can also be applied. Moreover, the configuration of the substrate-side insulating layer 50 of the third embodiment can also use any of the configurations of the substrate-side insulating layer 50 shown in FIG. 27 to FIG. 30.

In the various embodiments, the first nitride insulating layer 51 and the second nitride insulating layer 52 can also be formed of different materials.

In the various embodiments, a relation between the thicknesses of the first nitride insulating layer 51 and the second nitride insulating layer 52 can be modified as desired. In one example, the thickness of the second nitride insulating layer 52 can also be greater than the thickness of the first nitride insulating layer 51.

In the second embodiment, a relation among the thicknesses of the first nitride insulating layer 51, the second nitride insulating layer 52 and the third nitride insulating layer 56 can be modified as desired. In one example, the thicknesses of both of the second nitride insulating layer 52 and the third nitride insulating layer 56 can also be greater than the thickness of the first nitride insulating layer 51. The thickness of the third nitride insulating layer 56 can also be different from the thickness of the second nitride insulating layer 52. In one example, the third nitride insulating layer 56 has a thickness greater than the thickness of the second nitride insulating layer 52. Moreover, in one example, the third nitride insulating layer 56 has a thickness less than the thickness of the second nitride insulating layer 52.

In the first and second embodiments, the position of the multiple wiring layers 70 in the Z direction can be modified as desired. In one example, the multiple wiring layers 70 can be disposed on the second nitride insulating layer 526 of the insulating unit 546 as the sixth layer in the substrate-side insulating layer 50. Moreover, the multiple wiring layers 70 can also be disposed on the second nitride insulating layer 524 of the insulating unit 544 as the fourth layer in the substrate-side insulating layer 50. Moreover, the multiple wiring layers 70 can also be disposed on different insulating units 54. In one example, some wiring layers 70 of the multiple wiring layers 70 can be disposed on the insulating unit 545 as the fifth layer, and some other wiring layers 70 are disposed on the insulating unit 546 as the sixth layer.

In the first and second embodiments, the number of the semiconductor resistive layer 20 can be modified as desired. In one example, the number of the semiconductor resistive layer 20 can be one. When the number of the semiconductor resistive layer 20 is one, the semiconductor resistive layer 20 can be formed in a ripple-like tubular shape in the plan view, for example.

In the third embodiment, a configuration relation between the first coil 133 and the second coil 134 in the transformer chip 130 can be modified as desired. In one example, the first coil 133 can also be disposed closer to the element front surface 41 of the element insulating layer 40 than the second coil 134.

In the third embodiment, a configuration relation of the transformer chip 130 can be modified as desired. In one example, the transformer chip 130 can also be disposed on the primary-side die pad 140. Moreover, the transformer chip 130 can also be disposed on an intermediate die pad (omitted from the drawings) different from the primary-side die pad 140 and the secondary-side die pad 150. In this case, the intermediate die pad is, for example, disposed between the primary-side die pad 140 and the secondary-side die pad 150 in the X direction. The intermediate die pad is sealed by the sealing resin 160. Moreover, when the transformer chip 130 is disposed on the primary-side die pad 140, the primary-side die pad 140 corresponds to "a support member". Moreover, when the transformer chip 130 is disposed on the intermediate die pad, the intermediate die pad corresponds to "a support member".

In the third embodiment, a transmission direction of signals in the semiconductor module 100 can be modified as desired. In one example, the semiconductor module 100 can also be configured to transmit signals from the secondary-side circuit 104 to the primary-side circuit 103 via the transformer 105. More specifically, if a signal (for example, a feedback signal) from a driver circuit electrically connected to the secondary-side circuit 104 via the secondary-side terminal 102 is input to the secondary-side terminal 102, the signal is transmitted from the secondary-side circuit 104 to the primary-side circuit 103 via the transformer 105. In addition, the signal of the primary-side circuit 103 is output by a control device electrically connected to the primary-side circuit 103 via the primary-side terminal 101. Moreover, the semiconductor module 100 can also be configured to transmit signals bi-directionally between the primary-side circuit 103 and the secondary-side circuit 104. In summary, the semiconductor module 100 can also include the primary-side circuit 103, and the secondary-side circuit 104 configured to perform at least one of signal transmission and reception via the transformer 105 and the primary-side circuit 103.

In the third embodiment, the configuration of the semiconductor module 100 can be modified as desired. In one example, the semiconductor module 100 includes the transformer chip 130, a die pad for mounting the transformer chip 130, and the sealing resin 160 for sealing the transformer chip 130 and the die pad. That is to say, the first chip 110 and the second chip 120, as well as the primary-side die pad 140 and the secondary-side die pad 150 can be omitted from the semiconductor module 100.

In the third embodiment, the semiconductor module 100 can also include a capacitor in substitution for the transformer 150. A first electrode plate of the capacitor is electrically connected to the primary-side circuit 103, and a second electrode plate of the capacitor is electrically connected to the secondary-side circuit 104. In this case, the semiconductor module 100 includes a capacitor chip in substitution for the transformer chip 130. Similar to the transformer chip 130, the capacitor chip includes the semiconductor substrate 30, the element insulating layer 40 disposed on the semiconductor substrate 30, and a first electrode plate and a second electrode plate of a capacitor embedded into the element insulating layer 40. The capacitor chip further includes a first electrode pad electrically connected to the first electrode plate, and a second electrode pad electrically connected to the second electrode plate. Similar to the transformer chip 130, both of the first electrode pad and the second electrode pad are formed on the front-side insulating layer 60 and are covered by the passivation film 43.

In one example, both of the first electrode plate and the second electrode plate of the capacitor are embedded into the substrate-side insulating layer 50. The first electrode plate and the second electrode plate are arranged in opposite in the Z direction, for example. The second electrode plate is disposed closer to the element front surface 41 of the element insulating layer 40 than the first electrode plate. It can also be said that the first electrode plate is disposed closer to the semiconductor substrate 30 than the second electrode plate. Each of the first electrode plate and the second electrode plate is formed in a rectangular tablet shape with the Z direction set as a thickness direction.

Moreover, in other examples, the first electrode plate of the capacitor is embedded into the substrate-side insulating layer 50, and the second electrode is disposed on the substrate-side insulating layer 50. The second electrode plate is covered by the front-side insulating layer 60. The second electrode plate is arranged to face the first electrode plate in the Z direction.

The terms such as "on" used in the present application also includes meanings of "over" and "above", unless otherwise specified in the context. Thus, the expression "A formed on/over B" refers to that A can be in contact with B and is directly arranged on B in the various embodiments, but also refers to that A is not in contact with the B and is arranged above B in a variation example. That is to say, the expression "on" does not eliminate a structure having another component formed between A and B.

The Z-direction used in the present disclosure is not necessarily a vertical direction, and is not necessarily completely consistent with the vertical direction. Thus, various structures associated with the present disclosure do not limit "up/top" and "down/bottom" of the Z-direction given in the description to be "up" and "down" of the vertical direction. For example, the X-direction can be the vertical direction, or the Y-direction can be the vertical direction.

Notes

The technical concepts that are conceivable based on the embodiments and the variation examples are recorded in the description below. Moreover, to help to better understanding rather than forming limitations, the constituting elements described in the notes are given with the corresponding reference numerals or symbols in the embodiments. The numerals or symbols are used as examples for understanding purposes, and the constituting elements described in the notes are not to be limited to the constituting elements indicated by the numerals or symbols.

Note A1

A semiconductor device (14), comprising:

a semiconductor substrate (30); and a substrate-side insulating layer (50), disposed on the semiconductor substrate (30), wherein the substrate-side insulating layer (50) includes:

a first oxide film (532);

a second oxide film (533), disposed on the first oxide film (532) and separated from the first oxide film (532); and a first nitride insulating layer (513) and a second nitride insulating layer (523) disposed between the first oxide film (532) and the second oxide film (533), wherein the second nitride insulating layer (532) has a film density higher than a film density of the first nitride insulating layer (513).

Note A2

The semiconductor device according to note A1, wherein the first nitride insulating layer (513) and the second nitride insulating layer (523) are formed of a same material, the first nitride insulating layer (513) has a coefficient of thermal expansion larger than a coefficient of thermal expansion of the first oxide film (532), and the second nitride insulating layer (523) has a coefficient of thermal expansion smaller than the coefficient of thermal expansion of the first nitride insulating layer (513).

Note A3

The semiconductor device according to note A1 or A2, wherein the first nitride insulating layer (513) is configured to generate thermal stress in a direction opposite to a direction in which thermal stress occurs in the first oxide film (532), and the second nitride insulating layer (523) is configured to generate thermal stress in a direction opposite to a direction in which thermal stress occurs in the first nitride insulating layer (513).

Note A4

The semiconductor device according to any one of note A1 to A3, wherein the second nitride insulating layer (523) has a coefficient of thermal expansion between a coefficient of thermal expansion of the first oxide film (532) and a coefficient of thermal expansion of the first nitride insulating layer (513).

Note A5

The semiconductor device according to any one of note A1 to A4, wherein the second nitride insulating layer (523) is disposed on the first nitride insulating layer (513) and has a fracture toughness greater than a fracture toughness of the first nitride insulating layer (513).

Note A6

The semiconductor device according to any one of note A1 to A5, wherein the second nitride insulating layer (523) has a thickness less than a thickness of the first nitride insulating layer (513).

Note A7

The semiconductor device according to any one of note A1 to A6, wherein the first nitride insulating layer (513) has an upper surface (51A) and a lower surface (51B) facing opposite to each other in a thickness direction (Z direction) of the substrate-side insulating layer (50), the second nitride insulating layer (523) is provided on the first nitride insulating layer (513), and the substrate-side insulating layer (50) further includes a third nitride insulating layer (563) in contact with the lower surface (51B) of the first nitride insulating layer (513), and the third nitride insulating layer (563) has a film density higher than the film density of the first nitride insulating layer (513).

Note A8

The semiconductor device according to any one of note A1 to A7, wherein the substrate-side insulating layer (50) is formed by laminating a plurality of insulating units (54/543) including the second oxide film (533), the first nitride insulating layer (513) and the second nitride insulating layer (523).

Note A9

The semiconductor device according to any one of note A1 to A6, wherein the substrate-side insulating layer (50) includes:

- a first insulating unit (54M), including the second oxide film (53M), the first nitride insulating layer (51) and the second nitride insulating layer (52); and
- a second insulating unit (54N), including a fourth nitride insulating layer (57) formed of a same material as the first nitride insulating layer (51), and a third oxide film (57N) disposed on the fourth nitride insulating layer (57).

Note A10

The semiconductor device according to any one of note A1 to A9, further comprising:

- a semiconductor resistive layer (20), disposed on the substrate-side insulating layer (50); and
- a front-side insulating layer (60), covering the semiconductor resistive layer (20).

Note A11

The semiconductor device according to any one of note A1 to A9, further comprising:

- a first coil (133), embedded in the substrate-side insulating layer (50); and
- a second coil (134), embedded in the substrate-side insulating layer (50) and arranged separated from and opposite to the first coil (133).

Note A12

A semiconductor module (100), comprising:

- the semiconductor device (14) according to any one of technical solutions 1 to 11;
- a support member (150), supporting the semiconductor device (14); and
- a sealing resin (160), sealing the semiconductor device (14) and the support member (150).

Note A13

The semiconductor device according to any one of note A1 to A11, wherein the first nitride insulating layer (513) is provided on the first oxide film (532), the second nitride insulating layer (523) is provided on the first nitride insulating layer (513), and the second oxide film (533) is provided on the second nitride insulating layer (523).

Note A14

The semiconductor device according to any one of note A1 to A4, wherein the second nitride insulating layer (523) is provided on the first oxide film (532), the first nitride insulating layer (513) is provided on the second nitride insulating layer (523), and the second oxide film (533) is provided on the first nitride insulating layer (513).

Note A15

The semiconductor device according to note A7, wherein the substrate-side insulating layer (50) includes:

- a first insulating unit (54P), including the second oxide film (53P), the first nitride insulating layer (51), the second nitride insulating layer (52), and the third nitride insulating layer (56); and
- a second insulating unit (54Q), including a fourth nitride insulating layer (57) formed of a same material as the first nitride insulating layer (51), and a fourth oxide film (57Q) disposed on the fourth nitride insulating layer (57).

Note A16

The semiconductor device according to note A7, wherein the substrate-side insulating layer (50) includes:

- a first insulating unit (54P), including the second oxide film (53P), the first nitride insulating layer (51), the second nitride insulating layer (52), and the third nitride insulating layer (56); and
- a third insulating unit (54R), including a fifth nitride insulating layer (58) formed of a same material as the first nitride insulating layer (51), a sixth nitride insulating layer (59) disposed on the fifth nitride insulating layer (58), and a fifth oxide film (53R) disposed on the sixth nitride insulating layer (59).

Note A17

The semiconductor device according to note A7, wherein the substrate-side insulating layer (50) includes:

a first insulating unit (54P), including the second oxide film (53P), the first nitride insulating layer (51), the second nitride insulating layer (52), and the third nitride insulating layer (56);

a second insulating unit (53Q), including a fourth nitride insulating layer (57) formed of a same material as the first nitride insulating layer (51), and a fourth oxide film (57Q) disposed on the fourth nitride insulating layer (57); and a third insulating unit (54R), including a fifth nitride insulating layer (58) formed of a same material as the first nitride insulating layer (51), a sixth nitride insulating layer (59) disposed on the fifth nitride insulating layer (58), and a fifth oxide film (53R) disposed on the sixth nitride insulating layer (59).

Note A18

The semiconductor device according to any one of note A1 to A9, further comprising:

a first electrode plate, embedded in the substrate-side insulating layer (50); and a second electrode plate, embedded in the substrate-side insulating layer (50) and arranged separated from and opposite to the first electrode plate.

Note A19

The semiconductor device according to any one of note A1 to A9, further comprising:

a first electrode plate, embedded in the substrate-side insulating layer (50); and a second electrode plate, disposed on the substrate-side insulating layer (50) and arranged separated from and opposite to the first electrode plate.

Note B1

A method of manufacturing a semiconductor device (14), comprising:

preparing a semiconductor substrate (830); and forming a substrate-side insulating layer (850) on the semiconductor substrate (830), wherein the forming of a substrate-side insulating layer (850) includes:

forming a first oxide film (855) on the semiconductor substrate (830);

forming a first nitride insulating layer (851) on the first oxide film (855);

forming a second nitride insulating layer (852) on the first nitride insulating layer (851); and forming a second oxide film (853) on the second nitride insulating layer (852), wherein the second nitride insulating layer (852) is formed to have a film density higher than a film density of the first nitride insulating layer (851).

Note B2

A method of manufacturing a semiconductor device (14), comprising:

preparing a semiconductor substrate (830); and forming a substrate-side insulating layer (850) on the semiconductor substrate (830), wherein the forming of a substrate-side insulating layer (850) includes:

forming a first oxide film (855) on the semiconductor substrate (830);

forming a second nitride insulating layer (852) on the first oxide film (855);

forming a first nitride insulating layer (851) on the second nitride insulating layer (852); and forming an oxide film (853) on the first nitride insulating layer (851), and, wherein the second nitride insulating layer (852) is formed to have a film density higher than a film density of the first nitride insulating layer (851).

Note B3

A method of manufacturing a semiconductor device (14), comprising:

preparing a semiconductor substrate (830); and forming a substrate-side insulating layer (850) on the semiconductor substrate (830), wherein the forming of a substrate-side insulating layer (850) includes:

forming a first oxide film (855) on the semiconductor substrate (830);

forming a third nitride insulating layer (856) on the first oxide film (855);

forming a first nitride insulating layer (851) on the third nitride insulating layer (856);

forming a second nitride insulating layer (852) on the first nitride insulating layer (851); and forming a second oxide film (853) on the second nitride insulating layer (852), and wherein both of the second nitride insulating layer (852) and the third nitride insulating layer (856) are formed to have a film density higher than a film density of the first nitride insulating layer (851).

It should be noted that the description above provides merely simple examples. It can be conceivable to a person skilled in the art that, apart from the constituting elements and methods (manufacturing processes) enumerated in the technical details of the present disclosure, there are many other conceivable combinations and substitutions. The present disclosure is intended to encompass all substitutions, modifications and variations covered by the scope of claims of the present disclosure.

The invention claimed is:

1. A semiconductor device, comprising:

a semiconductor substrate; and a substrate-side insulating layer, disposed on the semiconductor substrate, wherein the substrate-side insulating layer includes:

a first oxide film;

a second oxide film, disposed on the first oxide film and separated from the first oxide film; and a first nitride insulating layer and a second nitride insulating layer disposed between the first oxide film and the second oxide film, wherein the second nitride insulating layer has a film density higher than a film density of the first nitride insulating layer, the first nitride insulating layer and the second nitride insulating layer are formed of same material, the first nitride insulating layer has a coefficient of thermal expansion larger than a coefficient of thermal expansion of the first oxide film, and the second nitride insulating layer has a coefficient of thermal expansion smaller than the coefficient of thermal expansion of the first nitride insulating layer.

2. The semiconductor device of claim 1, wherein the first nitride insulating layer is configured to generate thermal stress in a direction opposite to a direction in which thermal stress occurs in the first oxide film, and the second nitride insulating layer is configured to generate thermal stress in a direction opposite to a direction in which thermal stress occurs in the first nitride insulating layer.

3. The semiconductor device of claim 1, wherein the second nitride insulating layer has a coefficient of thermal expansion between a coefficient of thermal expansion of the first oxide film and a coefficient of thermal expansion of the first nitride insulating layer.

4. The semiconductor device of claim 1, wherein the second nitride insulating layer is disposed on the first nitride insulating layer and has a fracture toughness greater than a fracture toughness of the first nitride insulating layer.

5. The semiconductor device of claim 1, wherein the second nitride insulating layer has a thickness less than a thickness of the first nitride insulating layer.

6. The semiconductor device of claim 1, wherein the first nitride insulating layer has an upper surface and a lower surface facing opposite to each other in a thickness direction of the substrate-side insulating layer, the second nitride insulating layer is provided on the first nitride insulating layer, the substrate-side insulating layer further includes a third nitride insulating layer in contact with the lower surface of the first nitride insulating layer, and the third nitride insulating layer has a film density higher than the film density of the first nitride insulating layer.

7. The semiconductor device of claim 1, wherein the substrate-side insulating layer is formed by laminating a plurality of insulating units including the second oxide film, the first nitride insulating layer and the second nitride insulating layer.

8. The semiconductor device of claim 1, wherein the substrate-side insulating layer includes:

a first insulating unit, including the second oxide film, the first nitride insulating layer and the second nitride insulating layer; and a second insulating unit, including:

a fourth nitride insulating layer, formed of same material as the first nitride insulating layer; and a third oxide film, disposed on the fourth nitride insulating layer.

9. The semiconductor device of claim 1, further comprising:

a semiconductor resistive layer, disposed on the substrate-side insulating layer; and a front-side insulating layer, covering the semiconductor resistive layer.

10. A semiconductor module, comprising:

the semiconductor device of claim 1;

a support member, supporting the semiconductor device; and a sealing resin, sealing the semiconductor device and the support member.

11. A semiconductor device, comprising:

a semiconductor substrate;

a substrate-side insulating layer, disposed on the semiconductor substrate;

a first coil, embedded in the substrate-side insulating layer; and a second coil, embedded in the substrate-side insulating layer and arranged separated from and opposite to the first coil, wherein the substrate-side insulating layer includes:

a first oxide film, a second oxide film, disposed on the first oxide film and separated from the first oxide film, and a first nitride insulating layer and a second nitride insulating layer disposed between the first oxide film and the second oxide film, the second nitride insulating layer having a film density higher than a film density of the first nitride insulating layer.

12. A semiconductor module, comprising:

the semiconductor device of claim 11;

a support member, supporting the semiconductor device; and a sealing resin, sealing the semiconductor device and the support member.

* * * * *